United States Patent
Luby et al.

(10) Patent No.: US 9,178,535 B2
(45) Date of Patent: Nov. 3, 2015

(54) DYNAMIC STREAM INTERLEAVING AND SUB-STREAM BASED DELIVERY

(75) Inventors: Michael G. Luby, Berkeley, CA (US);
Payam Pakzad, Berkeley, CA (US);
Mark Watson, San Francisco, CA (US);
Lorenzo Vicisano, Berkeley, CA (US);
Jourdan J. Clish, Fremont, CA (US)

(73) Assignee: Digital Fountain, Inc., San Diego, CA (US)

( * ) Notice: Subject to any disclaimer, the term of this patent is extended or adjusted under 35 U.S.C. 154(b) by 1777 days.

(21) Appl. No.: 12/103,605

(22) Filed: Apr. 15, 2008

(65) Prior Publication Data

US 2008/0256418 A1 Oct. 16, 2008

Related U.S. Application Data

(60) Provisional application No. 60/912,145, filed on Apr. 16, 2007.

(51) Int. Cl.
*H03M 13/00* (2006.01)
*H03M 13/27* (2006.01)
(Continued)

(52) U.S. Cl.
CPC .......... *H03M 13/27* (2013.01); *H03M 13/2789* (2013.01); *H03M 13/353* (2013.01);
(Continued)

(58) Field of Classification Search
CPC .................................................. H04L 1/0071
USPC .................................................. 714/774, 776
See application file for complete search history.

(56) References Cited

U.S. PATENT DOCUMENTS 3,909,721 A 9/1975 Bussgang et al.
4,365,338 A 12/1982 McRae et al.
(Continued)

FOREIGN PATENT DOCUMENTS

CN 1338839 A 3/2002
CN 1425228 A 6/2003
(Continued)

OTHER PUBLICATIONS

Bloemer, J. et al.: "An XOR-Based Erasure-Resilient Coding Scheme," Technical Report TR-95-48, International Computer Science Institute. Berkeley, CA (1995).
(Continued)

*Primary Examiner* — Joshua Lohn
(74) *Attorney, Agent, or Firm* — Ryan N. Farr

(57) ABSTRACT

A communications system can provide methods of dynamically interleaving streams, including methods for dynamically introducing greater amounts of interleaving as a stream is transmitted independently of any source block structure to spread out losses or errors in the channel over a much larger period of time within the original stream than if interleaving were not introduced, provide superior protection against packet loss or packet corruption when used with FEC coding, provide superior protection against network jitter, and allow content zapping time and the content transition time to be reduced to a minimum and minimal content transition times. Streams may be partitioned into sub-streams, delivering the sub-streams to receivers along different paths through a network and receiving concurrently different sub-streams at a receiver sent from potentially different servers. When used in conjunction with FEC encoding, the methods include delivering portions of an encoding of each source block from potentially different servers.

17 Claims, 9 Drawing Sheets

(51) Int. Cl.
*H04L 1/00* (2006.01)
*H03M 13/35* (2006.01)
*H03M 13/37* (2006.01)
*H03M 13/11* (2006.01)
*H03M 13/15* (2006.01)

(52) U.S. Cl.
CPC ........ *H03M13/373* (2013.01); *H03M 13/6508* (2013.01); *H04L 1/0071* (2013.01); *H03M 13/1102* (2013.01); *H03M 13/15* (2013.01); *H03M 13/1515* (2013.01); *H03M 13/3761* (2013.01)

(56) References Cited

U.S. PATENT DOCUMENTS

| | | | |
|---|---|---|---|
| 4,589,112 A | 5/1986 | Karim | |
| 4,901,319 A * | 2/1990 | Ross | 714/788 |
| 5,136,592 A | 8/1992 | Weng | |
| 5,153,591 A | 10/1992 | Clark | |
| 5,329,369 A | 7/1994 | Willis et al. | |
| 5,331,320 A | 7/1994 | Cideciyan et al. | |
| 5,371,532 A | 12/1994 | Gelman et al. | |
| 5,372,532 A | 12/1994 | Robertson, Jr. | |
| 5,379,297 A | 1/1995 | Glover et al. | |
| 5,421,031 A | 5/1995 | De Bey | |
| 5,425,050 A | 6/1995 | Schreiber et al. | |
| 5,432,787 A | 7/1995 | Chethik | |
| 5,455,823 A | 10/1995 | Noreen et al. | |
| 5,465,318 A | 11/1995 | Sejnoha | |
| 5,517,508 A | 5/1996 | Scott | |
| 5,524,025 A | 6/1996 | Lawrence et al. | |
| 5,566,208 A | 10/1996 | Balakrishnan | |
| 5,568,614 A | 10/1996 | Mendelson et al. | |
| 5,583,784 A | 12/1996 | Kapust et al. | |
| 5,608,738 A | 3/1997 | Matsushita | |
| 5,617,541 A | 4/1997 | Albanese et al. | |
| 5,642,365 A | 6/1997 | Murakami et al. | |
| 5,659,614 A | 8/1997 | Bailey, III | |
| 5,699,473 A | 12/1997 | Kim | |
| 5,701,582 A | 12/1997 | DeBey | |
| 5,751,336 A | 5/1998 | Aggarwal et al. | |
| 5,754,563 A | 5/1998 | White | |
| 5,757,415 A | 5/1998 | Asamizuya et al. | |
| 5,802,394 A | 9/1998 | Baird et al. | |
| 5,805,825 A | 9/1998 | Danneels et al. | |
| 5,835,165 A | 11/1998 | Keate et al. | |
| 5,844,636 A | 12/1998 | Joseph et al. | |
| 5,852,565 A | 12/1998 | Demos | |
| 5,870,412 A | 2/1999 | Schuster et al. | |
| 5,903,775 A | 5/1999 | Murray | |
| 5,917,852 A | 6/1999 | Butterfield et al. | |
| 5,926,205 A | 7/1999 | Krause et al. | |
| 5,933,056 A | 8/1999 | Rothenberg | |
| 5,936,659 A | 8/1999 | Viswanathan et al. | |
| 5,936,949 A | 8/1999 | Pasternak et al. | |
| 5,953,537 A | 9/1999 | Balicki et al. | |
| 5,970,098 A | 10/1999 | Herzberg | |
| 5,983,383 A | 11/1999 | Wolf | |
| 5,993,056 A | 11/1999 | Vaman et al. | |
| 6,005,477 A | 12/1999 | Deck et al. | |
| 6,011,590 A | 1/2000 | Saukkonen | |
| 6,012,159 A | 1/2000 | Fischer et al. | |
| 6,014,706 A | 1/2000 | Cannon et al. | |
| 6,018,359 A | 1/2000 | Kermode et al. | |
| 6,041,001 A | 3/2000 | Estakhri | |
| 6,044,485 A | 3/2000 | Dent et al. | |
| 6,061,820 A | 5/2000 | Nakakita et al. | |
| 6,073,250 A | 6/2000 | Luby et al. | |
| 6,079,041 A | 6/2000 | Kunisa et al. | |
| 6,079,042 A | 6/2000 | Vaman et al. | |
| 6,081,907 A | 6/2000 | Witty et al. | |
| 6,081,909 A | 6/2000 | Luby et al. | |
| 6,081,918 A | 6/2000 | Spielman | |
| 6,088,330 A | 7/2000 | Bruck et al. | |
| 6,097,320 A | 8/2000 | Kuki et al. | |
| 6,134,596 A | 10/2000 | Bolosky et al. | |
| 6,141,053 A | 10/2000 | Saukkonen | |
| 6,141,787 A | 10/2000 | Kunisa et al. | |
| 6,141,788 A | 10/2000 | Rosenberg et al. | |
| 6,154,452 A | 11/2000 | Marko et al. | |
| 6,163,870 A | 12/2000 | Luby et al. | |
| 6,166,544 A | 12/2000 | Debbins et al. | |
| 6,175,944 B1 | 1/2001 | Urbanke et al. | |
| 6,178,536 B1 | 1/2001 | Sorkin | |
| 6,185,265 B1 | 2/2001 | Campanella | |
| 6,195,777 B1 | 2/2001 | Luby et al. | |
| 6,223,324 B1 | 4/2001 | Sinha et al. | |
| 6,226,259 B1 | 5/2001 | Piret | |
| 6,226,301 B1 | 5/2001 | Cheng et al. | |
| 6,229,824 B1 | 5/2001 | Marko | |
| 6,243,846 B1 | 6/2001 | Schuster et al. | |
| 6,272,658 B1 | 8/2001 | Steele et al. | |
| 6,278,716 B1 | 8/2001 | Rubenstein et al. | |
| 6,298,462 B1 | 10/2001 | Yi | |
| 6,307,487 B1 | 10/2001 | Luby | |
| 6,314,289 B1 | 11/2001 | Eberlein et al. | |
| 6,320,520 B1 | 11/2001 | Luby | |
| 6,332,163 B1 | 12/2001 | Bowman-Amuah | |
| 6,333,926 B1 | 12/2001 | Van Heeswyk et al. | |
| 6,373,406 B2 | 4/2002 | Luby | |
| 6,393,065 B1 | 5/2002 | Piret et al. | |
| 6,411,223 B1 | 6/2002 | Haken et al. | |
| 6,415,326 B1 | 7/2002 | Gupta et al. | |
| 6,420,982 B1 | 7/2002 | Brown | |
| 6,421,387 B1 | 7/2002 | Rhee | |
| 6,430,233 B1 | 8/2002 | Dillon et al. | |
| 6,445,717 B1 | 9/2002 | Gibson et al. | |
| 6,459,811 B1 | 10/2002 | Hurst, Jr. | |
| 6,466,698 B1 | 10/2002 | Creusere | |
| 6,473,010 B1 | 10/2002 | Vityaev et al. | |
| 6,486,803 B1 | 11/2002 | Luby et al. | |
| 6,487,692 B1 | 11/2002 | Morelos-Zaragoza | |
| 6,496,980 B1 | 12/2002 | Tillman et al. | |
| 6,497,479 B1 | 12/2002 | Stoffel et al. | |
| 6,510,177 B1 | 1/2003 | De Bonet et al. | |
| 6,523,147 B1 | 2/2003 | Kroeger et al. | |
| 6,535,920 B1 | 3/2003 | Parry et al. | |
| 6,577,599 B1 | 6/2003 | Gupta et al. | |
| 6,584,543 B2 | 6/2003 | Williams et al. | |
| 6,609,223 B1 | 8/2003 | Wolfgang | |
| 6,614,366 B2 | 9/2003 | Luby | |
| 6,618,451 B1 | 9/2003 | Gonikberg | |
| 6,631,172 B1 | 10/2003 | Shokrollahi et al. | |
| 6,633,856 B2 | 10/2003 | Richardson et al. | |
| 6,641,366 B2 | 11/2003 | Nordhoff | |
| 6,643,332 B1 | 11/2003 | Morelos-Zaragoza et al. | |
| 6,677,864 B2 | 1/2004 | Khayrallah | |
| 6,678,855 B1 | 1/2004 | Gemmell | |
| 6,694,476 B1 | 2/2004 | Sridharan et al. | |
| 6,704,370 B1 | 3/2004 | Chheda et al. | |
| 6,732,325 B1 | 5/2004 | Tash et al. | |
| 6,742,154 B1 | 5/2004 | Barnard | |
| 6,748,441 B1 | 6/2004 | Gemmell | |
| 6,751,772 B1 | 6/2004 | Kim et al. | |
| 6,765,866 B1 | 7/2004 | Wyatt | |
| 6,804,202 B1 | 10/2004 | Hwang | |
| 6,810,499 B2 | 10/2004 | Sridharan et al. | |
| 6,820,221 B2 | 11/2004 | Fleming | |
| 6,831,172 B1 | 12/2004 | Barbucci et al. | |
| 6,849,803 B1 | 2/2005 | Gretz | |
| 6,850,736 B2 | 2/2005 | McCune, Jr. | |
| 6,856,263 B2 | 2/2005 | Shokrollahi et al. | |
| 6,868,083 B2 * | 3/2005 | Apostolopoulos et al. | 370/392 |
| 6,876,623 B1 | 4/2005 | Lou et al. | |
| 6,882,618 B1 | 4/2005 | Sakoda et al. | |
| 6,895,547 B2 | 5/2005 | Eleftheriou et al. | |
| 6,909,383 B2 | 6/2005 | Shokrollahi | |
| 6,928,603 B1 | 8/2005 | Castagna et al. | |
| 6,937,618 B1 | 8/2005 | Noda et al. | |
| 6,956,875 B2 | 10/2005 | Kapadia et al. | |
| 6,965,636 B1 | 11/2005 | DesJardins et al. | |
| 6,985,459 B2 | 1/2006 | Dickson | |
| 6,995,692 B2 | 2/2006 | Yokota et al. | |

(56) References Cited

U.S. PATENT DOCUMENTS

| | | |
|---|---|---|
| 7,010,052 B2 | 3/2006 | Dill et al. |
| 7,030,785 B2 | 4/2006 | Shokrollahi et al. |
| 7,031,257 B1 | 4/2006 | Lu et al. |
| 7,057,534 B2 | 6/2006 | Luby |
| 7,068,681 B2 | 6/2006 | Chang et al. |
| 7,068,729 B2 | 6/2006 | Shokrollahi et al. |
| 7,072,971 B2 | 7/2006 | Lassen et al. |
| 7,073,191 B2 | 7/2006 | Srikantan et al. |
| 7,100,188 B2 | 8/2006 | Hejna et al. |
| 7,110,412 B2 | 9/2006 | Costa et al. |
| 7,139,660 B2 | 11/2006 | Sarkar et al. |
| 7,139,960 B2 | 11/2006 | Shokrollahi |
| 7,143,433 B1 | 11/2006 | Duan et al. |
| 7,151,754 B1 | 12/2006 | Boyce et al. |
| 7,154,951 B2 | 12/2006 | Wang |
| 7,164,370 B1 | 1/2007 | Mishra |
| 7,164,882 B2 | 1/2007 | Poltorak |
| 7,168,030 B2 | 1/2007 | Ariyoshi |
| 7,219,289 B2 | 5/2007 | Dickson |
| 7,231,404 B2 | 6/2007 | Paila et al. |
| 7,233,264 B2 | 6/2007 | Luby |
| 7,240,236 B2 | 7/2007 | Cutts et al. |
| 7,240,358 B2 | 7/2007 | Horn et al. |
| 7,243,285 B2 | 7/2007 | Foisy et al. |
| 7,249,291 B2 | 7/2007 | Rasmussen et al. |
| 7,254,754 B2 | 8/2007 | Hetzler et al. |
| 7,257,764 B2 * | 8/2007 | Suzuki et al. ............... 714/774 |
| 7,265,688 B2 | 9/2007 | Shokrollahi et al. |
| 7,293,222 B2 | 11/2007 | Shokrollahi et al. |
| 7,295,573 B2 | 11/2007 | Yi et al. |
| 7,304,990 B2 | 12/2007 | Rajwan |
| 7,320,099 B2 | 1/2008 | Miura et al. |
| 7,363,048 B2 | 4/2008 | Cheng et al. |
| 7,391,717 B2 | 6/2008 | Klemets et al. |
| 7,394,407 B2 | 7/2008 | Shokrollahi et al. |
| 7,398,454 B2 | 7/2008 | Cai et al. |
| 7,409,626 B1 * | 8/2008 | Schelstraete ............... 714/774 |
| 7,412,641 B2 | 8/2008 | Shokrollahi |
| 7,418,651 B2 | 8/2008 | Luby et al. |
| 7,451,377 B2 | 11/2008 | Shokrollahi |
| 7,483,447 B2 | 1/2009 | Chang et al. |
| 7,483,489 B2 | 1/2009 | Gentric et al. |
| 7,512,697 B2 | 3/2009 | Lassen et al. |
| 7,525,994 B2 | 4/2009 | Scholte |
| 7,529,806 B1 | 5/2009 | Shteyn |
| 7,532,132 B2 | 5/2009 | Shokrollahi et al. |
| 7,555,006 B2 | 6/2009 | Wolfe et al. |
| 7,559,004 B1 | 7/2009 | Chang et al. |
| 7,570,665 B2 | 8/2009 | Ertel et al. |
| 7,574,706 B2 | 8/2009 | Meulemans et al. |
| 7,590,118 B2 | 9/2009 | Giesberts et al. |
| 7,597,423 B2 | 10/2009 | Silverbrook |
| 7,613,183 B1 | 11/2009 | Brewer et al. |
| 7,633,413 B2 | 12/2009 | Shokrollahi et al. |
| 7,633,970 B2 | 12/2009 | Van Kampen et al. |
| 7,644,335 B2 | 1/2010 | Luby et al. |
| 7,650,036 B2 | 1/2010 | Lei et al. |
| 7,668,198 B2 | 2/2010 | Yi et al. |
| 7,720,096 B2 | 5/2010 | Klemets |
| 7,720,174 B2 | 5/2010 | Shokrollahi et al. |
| 7,721,184 B2 | 5/2010 | Luby et al. |
| 7,812,743 B2 | 10/2010 | Luby |
| 7,831,896 B2 | 11/2010 | Amram et al. |
| 7,924,913 B2 | 4/2011 | Sullivan et al. |
| 7,956,772 B2 | 6/2011 | Shokrollahi et al. |
| 7,961,700 B2 | 6/2011 | Malladi et al. |
| 7,979,769 B2 | 7/2011 | Lee et al. |
| 8,027,328 B2 | 9/2011 | Yang et al. |
| 8,028,322 B2 | 9/2011 | Riedl et al. |
| 8,081,716 B2 | 12/2011 | Kang et al. |
| 8,135,073 B2 | 3/2012 | Shen |
| 8,185,794 B2 | 5/2012 | Lohmar et al. |
| 8,185,809 B2 | 5/2012 | Luby et al. |
| RE43,741 E | 10/2012 | Shokrollahi et al. |
| 8,301,725 B2 | 10/2012 | Biderman et al. |
| 8,327,403 B1 | 12/2012 | Chilvers et al. |
| 8,340,133 B2 | 12/2012 | Kim et al. |
| 8,422,474 B2 | 4/2013 | Park et al. |
| 8,462,643 B2 | 6/2013 | Walton et al. |
| 8,544,043 B2 | 9/2013 | Parekh et al. |
| 8,572,646 B2 | 10/2013 | Haberman et al. |
| 8,615,023 B2 | 12/2013 | Oh et al. |
| 8,638,796 B2 | 1/2014 | Dan et al. |
| 8,713,624 B1 | 4/2014 | Harvey et al. |
| 8,737,421 B2 | 5/2014 | Zhang et al. |
| 8,812,735 B2 | 8/2014 | Igarashi |
| 2001/0015944 A1 | 8/2001 | Takahashi et al. |
| 2001/0033586 A1 | 10/2001 | Takashimizu et al. |
| 2002/0009137 A1 | 1/2002 | Nelson et al. |
| 2002/0053062 A1 | 5/2002 | Szymanski |
| 2002/0083345 A1 | 6/2002 | Halliday et al. |
| 2002/0085013 A1 | 7/2002 | Lippincott |
| 2002/0133247 A1 | 9/2002 | Smith et al. |
| 2002/0141433 A1 | 10/2002 | Kwon et al. |
| 2002/0143953 A1 | 10/2002 | Aiken |
| 2002/0191116 A1 | 12/2002 | Kessler et al. |
| 2003/0005386 A1 | 1/2003 | Bhatt et al. |
| 2003/0037299 A1 | 2/2003 | Smith |
| 2003/0086515 A1 | 5/2003 | Trans et al. |
| 2003/0101408 A1 | 5/2003 | Martinian et al. |
| 2003/0106014 A1 | 6/2003 | Dohmen et al. |
| 2003/0138043 A1 | 7/2003 | Hannuksela |
| 2003/0194211 A1 | 10/2003 | Abecassis |
| 2003/0207696 A1 | 11/2003 | Willenegger et al. |
| 2003/0224773 A1 | 12/2003 | Deeds |
| 2004/0015768 A1 | 1/2004 | Bordes et al. |
| 2004/0031054 A1 | 2/2004 | Dankworth et al. |
| 2004/0049793 A1 | 3/2004 | Chou |
| 2004/0066854 A1 | 4/2004 | Hannuksela |
| 2004/0081106 A1 | 4/2004 | Bruhn |
| 2004/0096110 A1 | 5/2004 | Yogeshwar et al. |
| 2004/0117716 A1 * | 6/2004 | Shen ............... 714/776 |
| 2004/0151109 A1 | 8/2004 | Batra et al. |
| 2004/0162071 A1 | 8/2004 | Grilli et al. |
| 2004/0207548 A1 | 10/2004 | Kilbank |
| 2004/0231004 A1 | 11/2004 | Seo |
| 2004/0240382 A1 | 12/2004 | Ido et al. |
| 2004/0255328 A1 | 12/2004 | Baldwin et al. |
| 2005/0018635 A1 | 1/2005 | Proctor, Jr. |
| 2005/0028067 A1 | 2/2005 | Weirauch |
| 2005/0041736 A1 | 2/2005 | Butler-Smith et al. |
| 2005/0071491 A1 | 3/2005 | Seo |
| 2005/0091697 A1 | 4/2005 | Tanaka et al. |
| 2005/0097213 A1 | 5/2005 | Barrett et al. |
| 2005/0102371 A1 | 5/2005 | Aksu |
| 2005/0105371 A1 | 5/2005 | Johnson et al. |
| 2005/0123058 A1 | 6/2005 | Greenbaum et al. |
| 2005/0138286 A1 | 6/2005 | Franklin et al. |
| 2005/0160272 A1 | 7/2005 | Teppler |
| 2005/0163468 A1 | 7/2005 | Takahashi et al. |
| 2005/0169379 A1 | 8/2005 | Shin et al. |
| 2005/0180415 A1 | 8/2005 | Cheung et al. |
| 2005/0193309 A1 | 9/2005 | Grilli et al. |
| 2005/0195752 A1 | 9/2005 | Amin et al. |
| 2005/0195899 A1 | 9/2005 | Han |
| 2005/0195900 A1 | 9/2005 | Han |
| 2005/0207392 A1 | 9/2005 | Sivalingham et al. |
| 2005/0216472 A1 | 9/2005 | Leon et al. |
| 2005/0216951 A1 | 9/2005 | MacInnis |
| 2005/0254575 A1 | 11/2005 | Hannuksela et al. |
| 2006/0015568 A1 | 1/2006 | Walsh et al. |
| 2006/0020796 A1 | 1/2006 | Aura et al. |
| 2006/0031738 A1 | 2/2006 | Fay et al. |
| 2006/0037057 A1 | 2/2006 | Xu |
| 2006/0080588 A1 * | 4/2006 | Starr ............... 714/755 |
| 2006/0093634 A1 | 5/2006 | Lutz et al. |
| 2006/0107174 A1 | 5/2006 | Heise |
| 2006/0109805 A1 | 5/2006 | Malamal Vadakital et al. |
| 2006/0120464 A1 | 6/2006 | Hannuksela |
| 2006/0193524 A1 | 8/2006 | Tarumoto et al. |
| 2006/0212444 A1 | 9/2006 | Handman et al. |
| 2006/0212782 A1 | 9/2006 | Li |
| 2006/0229075 A1 | 10/2006 | Kim et al. |
| 2006/0244824 A1 | 11/2006 | Debey |

(56) References Cited

U.S. PATENT DOCUMENTS

| | | |
|---|---|---|
| 2006/0244865 A1 | 11/2006 | Simon |
| 2006/0248195 A1 | 11/2006 | Toumura et al. |
| 2006/0256851 A1 | 11/2006 | Wang et al. |
| 2006/0262856 A1 | 11/2006 | Wu et al. |
| 2006/0279437 A1* | 12/2006 | Luby et al. .................. 341/50 |
| 2007/0002953 A1 | 1/2007 | Kusunoki |
| 2007/0006274 A1 | 1/2007 | Paila et al. |
| 2007/0016594 A1 | 1/2007 | Visharam et al. |
| 2007/0022215 A1 | 1/2007 | Singer et al. |
| 2007/0028099 A1 | 2/2007 | Entin et al. |
| 2007/0078876 A1 | 4/2007 | Hayashi et al. |
| 2007/0081562 A1 | 4/2007 | Ma |
| 2007/0081586 A1 | 4/2007 | Raveendran et al. |
| 2007/0110074 A1 | 5/2007 | Bradley et al. |
| 2007/0127576 A1 | 6/2007 | Henocq et al. |
| 2007/0140369 A1 | 6/2007 | Limberg et al. |
| 2007/0157267 A1 | 7/2007 | Lopez-Estrada |
| 2007/0162568 A1 | 7/2007 | Gupta et al. |
| 2007/0162611 A1 | 7/2007 | Yu et al. |
| 2007/0176800 A1 | 8/2007 | Rijavec |
| 2007/0177811 A1 | 8/2007 | Yang et al. |
| 2007/0185973 A1 | 8/2007 | Wayda et al. |
| 2007/0195894 A1 | 8/2007 | Shokrollahi et al. |
| 2007/0200949 A1 | 8/2007 | Walker et al. |
| 2007/0201549 A1 | 8/2007 | Hannuksela et al. |
| 2007/0204196 A1 | 8/2007 | Watson et al. |
| 2007/0230568 A1 | 10/2007 | Eleftheriadis et al. |
| 2007/0233784 A1 | 10/2007 | Orourke et al. |
| 2007/0255844 A1 | 11/2007 | Shen et al. |
| 2007/0277209 A1 | 11/2007 | Yousef |
| 2007/0300127 A1 | 12/2007 | Watson et al. |
| 2008/0010153 A1 | 1/2008 | Pugh-O'Connor et al. |
| 2008/0034273 A1 | 2/2008 | Luby |
| 2008/0052753 A1 | 2/2008 | Huang et al. |
| 2008/0058958 A1 | 3/2008 | Cheng |
| 2008/0059532 A1 | 3/2008 | Kazmi et al. |
| 2008/0066136 A1 | 3/2008 | Dorai et al. |
| 2008/0075172 A1 | 3/2008 | Koto |
| 2008/0086751 A1 | 4/2008 | Horn et al. |
| 2008/0101478 A1 | 5/2008 | Kusunoki |
| 2008/0134005 A1* | 6/2008 | Izzat et al. .................. 714/774 |
| 2008/0152241 A1 | 6/2008 | Itoi et al. |
| 2008/0168133 A1 | 7/2008 | Osborne |
| 2008/0168516 A1 | 7/2008 | Flick et al. |
| 2008/0170564 A1 | 7/2008 | Shi et al. |
| 2008/0170806 A1 | 7/2008 | Kim |
| 2008/0172430 A1 | 7/2008 | Thorstensen |
| 2008/0172712 A1 | 7/2008 | Munetsugu |
| 2008/0181296 A1 | 7/2008 | Tian et al. |
| 2008/0189419 A1 | 8/2008 | Girle et al. |
| 2008/0192818 A1 | 8/2008 | DiPietro et al. |
| 2008/0215317 A1 | 9/2008 | Fejzo |
| 2008/0232357 A1 | 9/2008 | Chen |
| 2008/0243918 A1 | 10/2008 | Holtman |
| 2008/0281943 A1 | 11/2008 | Shapiro |
| 2008/0285556 A1 | 11/2008 | Park et al. |
| 2008/0303893 A1 | 12/2008 | Kim et al. |
| 2008/0303896 A1 | 12/2008 | Lipton et al. |
| 2008/0309525 A1 | 12/2008 | Shokrollahi et al. |
| 2008/0313191 A1 | 12/2008 | Bouazizi |
| 2009/0003439 A1 | 1/2009 | Wang et al. |
| 2009/0019229 A1 | 1/2009 | Morrow et al. |
| 2009/0031199 A1 | 1/2009 | Luby et al. |
| 2009/0043906 A1 | 2/2009 | Hurst et al. |
| 2009/0055705 A1 | 2/2009 | Gao |
| 2009/0067551 A1 | 3/2009 | Chen et al. |
| 2009/0083806 A1 | 3/2009 | Barrett et al. |
| 2009/0089445 A1 | 4/2009 | Deshpande |
| 2009/0092138 A1 | 4/2009 | Joo et al. |
| 2009/0100496 A1 | 4/2009 | Bechtolsheim et al. |
| 2009/0103523 A1 | 4/2009 | Katis et al. |
| 2009/0106356 A1 | 4/2009 | Brase et al. |
| 2009/0125636 A1 | 5/2009 | Li et al. |
| 2009/0150557 A1 | 6/2009 | Wormley et al. |
| 2009/0158114 A1 | 6/2009 | Shokrollahi |
| 2009/0164653 A1 | 6/2009 | Mandyam et al. |
| 2009/0189792 A1 | 7/2009 | Shokrollahi et al. |
| 2009/0195640 A1 | 8/2009 | Kim et al. |
| 2009/0201990 A1 | 8/2009 | Leprovost et al. |
| 2009/0204877 A1 | 8/2009 | Betts |
| 2009/0210547 A1 | 8/2009 | Lassen et al. |
| 2009/0222873 A1 | 9/2009 | Einarsson |
| 2009/0248697 A1 | 10/2009 | Richardson et al. |
| 2009/0257508 A1 | 10/2009 | Aggarwal et al. |
| 2009/0287841 A1 | 11/2009 | Chapweske et al. |
| 2009/0297123 A1 | 12/2009 | Virdi et al. |
| 2009/0300203 A1 | 12/2009 | Virdi et al. |
| 2009/0300204 A1 | 12/2009 | Zhang et al. |
| 2009/0307565 A1 | 12/2009 | Luby et al. |
| 2009/0319563 A1 | 12/2009 | Schnell |
| 2009/0328228 A1 | 12/2009 | Schnell |
| 2010/0011061 A1 | 1/2010 | Hudson et al. |
| 2010/0011117 A1 | 1/2010 | Hristodorescu et al. |
| 2010/0011274 A1 | 1/2010 | Stockhammer et al. |
| 2010/0020871 A1 | 1/2010 | Hannuksela et al. |
| 2010/0023525 A1 | 1/2010 | Westerlund et al. |
| 2010/0046906 A1 | 2/2010 | Kanamori et al. |
| 2010/0049865 A1 | 2/2010 | Hannuksela et al. |
| 2010/0061444 A1 | 3/2010 | Wilkins et al. |
| 2010/0067495 A1 | 3/2010 | Lee et al. |
| 2010/0131671 A1 | 5/2010 | Kohli et al. |
| 2010/0153578 A1 | 6/2010 | Van Gassel et al. |
| 2010/0165077 A1 | 7/2010 | Yin et al. |
| 2010/0174823 A1 | 7/2010 | Huang |
| 2010/0189131 A1 | 7/2010 | Branam et al. |
| 2010/0198982 A1 | 8/2010 | Fernandez |
| 2010/0211690 A1 | 8/2010 | Pakzad et al. |
| 2010/0223533 A1 | 9/2010 | Stockhammer et al. |
| 2010/0235472 A1 | 9/2010 | Sood et al. |
| 2010/0235528 A1 | 9/2010 | Bocharov et al. |
| 2010/0257051 A1 | 10/2010 | Fernandez |
| 2010/0318632 A1 | 12/2010 | Yoo et al. |
| 2011/0019769 A1 | 1/2011 | Shokrollahi et al. |
| 2011/0055881 A1 | 3/2011 | Yu et al. |
| 2011/0083144 A1 | 4/2011 | Bocharov et al. |
| 2011/0096828 A1 | 4/2011 | Chen et al. |
| 2011/0103519 A1 | 5/2011 | Shokrollahi et al. |
| 2011/0119394 A1 | 5/2011 | Wang et al. |
| 2011/0119396 A1 | 5/2011 | Kwon et al. |
| 2011/0216541 A1 | 9/2011 | Inoue et al. |
| 2011/0231519 A1 | 9/2011 | Luby et al. |
| 2011/0231569 A1 | 9/2011 | Luby et al. |
| 2011/0238789 A1 | 9/2011 | Luby et al. |
| 2011/0239078 A1 | 9/2011 | Luby et al. |
| 2011/0258510 A1 | 10/2011 | Watson et al. |
| 2011/0268178 A1 | 11/2011 | Park et al. |
| 2011/0280311 A1 | 11/2011 | Chen et al. |
| 2011/0280316 A1 | 11/2011 | Chen et al. |
| 2011/0299629 A1 | 12/2011 | Luby et al. |
| 2011/0307545 A1 | 12/2011 | Bouazizi |
| 2011/0307581 A1 | 12/2011 | Furbeck et al. |
| 2012/0013746 A1 | 1/2012 | Chen et al. |
| 2012/0016965 A1 | 1/2012 | Chen et al. |
| 2012/0020413 A1 | 1/2012 | Chen et al. |
| 2012/0023249 A1 | 1/2012 | Chen et al. |
| 2012/0023254 A1 | 1/2012 | Park et al. |
| 2012/0033730 A1 | 2/2012 | Lee |
| 2012/0042050 A1 | 2/2012 | Chen et al. |
| 2012/0042089 A1 | 2/2012 | Chen et al. |
| 2012/0042090 A1 | 2/2012 | Chen et al. |
| 2012/0047280 A1 | 2/2012 | Park et al. |
| 2012/0099593 A1 | 4/2012 | Luby |
| 2012/0151302 A1 | 6/2012 | Luby et al. |
| 2012/0185530 A1 | 7/2012 | Reza |
| 2012/0202535 A1 | 8/2012 | Chaddha et al. |
| 2012/0207068 A1 | 8/2012 | Watson et al. |
| 2012/0208580 A1 | 8/2012 | Luby et al. |
| 2012/0210190 A1 | 8/2012 | Luby et al. |
| 2012/0317305 A1 | 12/2012 | Einarsson et al. |
| 2013/0002483 A1 | 1/2013 | Rowitch et al. |
| 2013/0007223 A1 | 1/2013 | Luby et al. |
| 2013/0067295 A1 | 3/2013 | Luby et al. |
| 2013/0091251 A1 | 4/2013 | Walker et al. |
| 2013/0246643 A1 | 9/2013 | Luby et al. |

(56) References Cited

U.S. PATENT DOCUMENTS

| | | |
|---|---|---|
| 2013/0254634 A1 | 9/2013 | Luby |
| 2013/0287023 A1 | 10/2013 | Bims |
| 2014/0009578 A1 | 1/2014 | Chen et al. |
| 2014/0380113 A1 | 12/2014 | Luby |

FOREIGN PATENT DOCUMENTS

| | | |
|---|---|---|
| CN | 1481643 A | 3/2004 |
| CN | 1708934 A | 12/2005 |
| CN | 1714577 A | 12/2005 |
| CN | 1792056 A | 6/2006 |
| CN | 1806392 A | 7/2006 |
| CN | 1819661 A | 8/2006 |
| CN | 1868157 A | 11/2006 |
| CN | 101390399 A | 3/2009 |
| CN | 101729857 A | 6/2010 |
| EP | 0669587 A2 | 8/1995 |
| EP | 0701371 A1 | 3/1996 |
| EP | 0784401 A2 | 7/1997 |
| EP | 0853433 A1 | 7/1998 |
| EP | 0854650 A2 | 7/1998 |
| EP | 0903955 A1 | 3/1999 |
| EP | 0986908 A1 | 3/2000 |
| EP | 1024672 A1 | 8/2000 |
| EP | 1051027 A1 | 11/2000 |
| EP | 1124344 A1 | 8/2001 |
| EP | 1241795 A2 | 9/2002 |
| EP | 1298931 A2 | 4/2003 |
| EP | 1406452 A2 | 4/2004 |
| EP | 1455504 A2 | 9/2004 |
| EP | 1468497 A1 | 10/2004 |
| EP | 1501318 A1 | 1/2005 |
| EP | 1670256 A2 | 6/2006 |
| EP | 1755248 A1 | 2/2007 |
| EP | 2046044 A1 | 4/2009 |
| EP | 2071827 A2 | 6/2009 |
| EP | 2096870 A2 | 9/2009 |
| EP | 1700410 B1 | 4/2010 |
| EP | 2323390 A2 | 5/2011 |
| JP | H07183873 | 7/1995 |
| JP | 08186570 | 7/1996 |
| JP | 8289255 A | 11/1996 |
| JP | 9252253 A | 9/1997 |
| JP | 11041211 A | 2/1999 |
| JP | 11112479 | 4/1999 |
| JP | 11164270 A | 6/1999 |
| JP | 2000151426 A | 5/2000 |
| JP | 2000216835 A | 8/2000 |
| JP | 2000513164 A | 10/2000 |
| JP | 2000307435 A | 11/2000 |
| JP | 2000353969 A | 12/2000 |
| JP | 2001036417 | 2/2001 |
| JP | 2001094625 | 4/2001 |
| JP | 2001189665 A | 7/2001 |
| JP | 2001223655 A | 8/2001 |
| JP | 2001251287 A | 9/2001 |
| JP | 2001274776 A | 10/2001 |
| JP | 2001274855 A | 10/2001 |
| JP | 2002073625 A | 3/2002 |
| JP | 2002204219 A | 7/2002 |
| JP | 2002543705 A | 12/2002 |
| JP | 2003018568 A | 1/2003 |
| JP | 2003507985 | 2/2003 |
| JP | 2003092564 A | 3/2003 |
| JP | 2003510734 A | 3/2003 |
| JP | 2003174489 | 6/2003 |
| JP | 2003256321 A | 9/2003 |
| JP | 2003318975 A | 11/2003 |
| JP | 2003319012 | 11/2003 |
| JP | 2003333577 A | 11/2003 |
| JP | 2004048704 A | 2/2004 |
| JP | 2004070712 A | 3/2004 |
| JP | 2004135013 A | 4/2004 |
| JP | 2004165922 A | 6/2004 |
| JP | 2004516717 A | 6/2004 |
| JP | 2004192140 A | 7/2004 |
| JP | 2004193992 A | 7/2004 |
| JP | 2004529533 A | 9/2004 |
| JP | 2004289621 A | 10/2004 |
| JP | 2004343701 A | 12/2004 |
| JP | 2004348824 A | 12/2004 |
| JP | 2004362099 A | 12/2004 |
| JP | 2005094140 A | 4/2005 |
| JP | 2005136546 A | 5/2005 |
| JP | 2005514828 T | 5/2005 |
| JP | 2005204170 A | 7/2005 |
| JP | 2005223433 A | 8/2005 |
| JP | 2005277950 A | 10/2005 |
| JP | 2006503463 A | 1/2006 |
| JP | 2006505177 A | 2/2006 |
| JP | 2006506926 A | 2/2006 |
| JP | 2006074335 A | 3/2006 |
| JP | 2006074421 A | 3/2006 |
| JP | 2006115104 A | 4/2006 |
| JP | 3809957 | 6/2006 |
| JP | 2006174032 A | 6/2006 |
| JP | 2006174045 A | 6/2006 |
| JP | 2006186419 A | 7/2006 |
| JP | 2006519517 A | 8/2006 |
| JP | 2006287422 A | 10/2006 |
| JP | 2006319743 A | 11/2006 |
| JP | 2007013675 A | 1/2007 |
| JP | 2007089137 A | 4/2007 |
| JP | 3976163 | 6/2007 |
| JP | 2007158592 A | 6/2007 |
| JP | 2007174170 A | 7/2007 |
| JP | 2007520961 A | 7/2007 |
| JP | 2007228205 A | 9/2007 |
| JP | 2008011404 A | 1/2008 |
| JP | 2008016907 A | 1/2008 |
| JP | 2008502212 A | 1/2008 |
| JP | 2008508761 A | 3/2008 |
| JP | 2008508762 A | 3/2008 |
| JP | 2008283232 A | 11/2008 |
| JP | 2008283571 A | 11/2008 |
| JP | 2008543142 A | 11/2008 |
| JP | 2008546361 A | 12/2008 |
| JP | 2009027598 A | 2/2009 |
| JP | 2009522921 A | 6/2009 |
| JP | 2009522922 A | 6/2009 |
| JP | 2009171558 A | 7/2009 |
| JP | 2009527949 A | 7/2009 |
| JP | 2009277182 A | 11/2009 |
| JP | 2009544991 A | 12/2009 |
| JP | 2010539832 A | 12/2010 |
| JP | 2011087103 A | 4/2011 |
| JP | 4971144 B2 | 7/2012 |
| JP | 5231218 | 3/2013 |
| KR | 1020030071815 | 9/2003 |
| KR | 1020030074386 A | 9/2003 |
| KR | 20040107152 A | 12/2004 |
| KR | 20040107401 A | 12/2004 |
| KR | 20050009376 A | 1/2005 |
| KR | 100809086 B1 | 3/2008 |
| KR | 20080083299 A | 9/2008 |
| KR | 20090098919 A | 9/2009 |
| KR | 20100028156 A | 3/2010 |
| RU | 99117925 A | 7/2001 |
| RU | 2189629 C2 | 9/2002 |
| RU | 2265960 C2 | 12/2005 |
| RU | 2290768 C1 | 12/2006 |
| RU | 2297663 C2 | 4/2007 |
| RU | 2312390 C2 | 12/2007 |
| RU | 2357279 C2 | 5/2009 |
| TW | I246841 B | 1/2006 |
| TW | I354908 | 12/2011 |
| TW | I355168 | 12/2011 |
| WO | WO9634463 A1 | 10/1996 |
| WO | WO-9750183 A1 | 12/1997 |
| WO | WO9804973 A1 | 2/1998 |
| WO | WO9832231 | 7/1998 |
| WO | WO-9832256 A1 | 7/1998 |
| WO | WO0014921 A1 | 3/2000 |

(56) References Cited

FOREIGN PATENT DOCUMENTS

| WO | WO0018017 | 3/2000 |
| WO | WO0052600 A1 | 9/2000 |
| WO | WO0120786 A1 | 3/2001 |
| WO | WO0157667 A1 | 8/2001 |
| WO | WO0158130 A2 | 8/2001 |
| WO | WO0158131 A2 | 8/2001 |
| WO | WO0227988 A2 | 4/2002 |
| WO | WO0247391 A1 | 6/2002 |
| WO | 02063461 A1 | 8/2002 |
| WO | WO-03046742 A1 | 6/2003 |
| WO | WO03056703 | 7/2003 |
| WO | WO03105350 | 12/2003 |
| WO | WO-03105484 A1 | 12/2003 |
| WO | WO2004008735 A2 | 1/2004 |
| WO | WO2004015948 A1 | 2/2004 |
| WO | WO2004019521 A1 | 3/2004 |
| WO | WO2004030273 A1 | 4/2004 |
| WO | WO2004034589 A2 | 4/2004 |
| WO | WO-2004036824 A1 | 4/2004 |
| WO | WO2004040831 A1 | 5/2004 |
| WO | WO-2004047019 A2 | 6/2004 |
| WO | WO2004047455 A1 | 6/2004 |
| WO | WO-2004088988 A1 | 10/2004 |
| WO | WO-2004109538 A1 | 12/2004 |
| WO | WO2005036753 A2 | 4/2005 |
| WO | WO2005041421 A1 | 5/2005 |
| WO | WO2005078982 A1 | 8/2005 |
| WO | WO-2005107123 | 11/2005 |
| WO | WO2005112250 A2 | 11/2005 |
| WO | WO-2006013459 A1 | 2/2006 |
| WO | WO2006020826 A2 | 2/2006 |
| WO | WO-2006036276 | 4/2006 |
| WO | 2006060036 A1 | 6/2006 |
| WO | WO-2006057938 A2 | 6/2006 |
| WO | WO2006084503 A1 | 8/2006 |
| WO | WO-2006116102 A2 | 11/2006 |
| WO | WO-2006135878 A2 | 12/2006 |
| WO | WO2007042916 | 4/2007 |
| WO | 2007078253 A2 | 7/2007 |
| WO | WO2007090834 A2 | 8/2007 |
| WO | WO-2007098397 A2 | 8/2007 |
| WO | WO-2007098480 A1 | 8/2007 |
| WO | 2008011549 A2 | 1/2008 |
| WO | WO-2008023328 A3 | 4/2008 |
| WO | WO2008054100 A1 | 5/2008 |
| WO | 2008086313 A1 | 7/2008 |
| WO | WO2008085013 A1 | 7/2008 |
| WO | 2008144004 A1 | 11/2008 |
| WO | WO2008148708 A1 | 12/2008 |
| WO | WO2008156390 A1 | 12/2008 |
| WO | WO-2009065526 A1 | 5/2009 |
| WO | WO-2009137705 A2 | 11/2009 |
| WO | 2009143741 A1 | 12/2009 |
| WO | WO2010085361 A2 | 7/2010 |
| WO | WO2010088420 A1 | 8/2010 |
| WO | WO2010120804 A1 | 10/2010 |
| WO | WO-2011038013 | 3/2011 |
| WO | WO-2011038034 A1 | 3/2011 |
| WO | 2011059286 A1 | 5/2011 |
| WO | 2011070552 A1 | 6/2011 |
| WO | 2011102792 A1 | 8/2011 |
| WO | WO-2012021540 | 2/2012 |
| WO | WO-2012109614 A1 | 8/2012 |

OTHER PUBLICATIONS

Rizzo, L.: "Effective Erasure Codes for Reliable Computer Communication Protocols," Computer Communication Review, 27 (2) pp. 24-36 (Apr. 1997).

PCT International Search Report for PCT Appln No. US 08/60510; mailed Aug. 1, 2008 (2 pages).

PCT Written Opinion for PCT Appln No. US 08/60510; mailed Aug. 1, 2008 (4 pages).

Perkins, et al.: "Survey of Packet Loss Recovery Techniques for Streaming Audio"; IEEE Network; Sep./Oct. 1998; pp. 40-48.

Zorzi, et al.: "On the Statistics of Block Errors in Bursty Channels"; IEEE Transactions on Communications; vol. 45, No. 6; Jun. 1997; pp. 660-667.

3GPP TS 26.234 V9.1.0 ,"3rd Generation Partnership Project; Technical Specification Group Services and System Aspects; Transparent end-to-end Packet-switched Streaming Service (PSS); Protocols and codecs (Release 9)", Dec. 2009, p. 179.

3GPP TS 26.244 V9.1.0, 3rd Generation Partnership Project; Technical Specification Group Services and System Aspects; Transparent end-to-end packet switched streaming service (PSS); 3GPP file format (3GP), (Release 9), Mar. 2010, 55 pp.

3GPP TS 26.247, v1.5.0, 3rd Generation Partnership Project; Technical Specification Group Services and System Aspects Transparent end-to-end Packet-switched Streaming Service (PSS); Progressive Download and Dynamic Adaptive Streaming over HTTP (3GP-Dash) (Release 10), 2010.

3rd Generation Partnership Project, Technical Specification Group Services and System Aspects Transparent end-to-end packet switched streaming service (PSS), 3GPP file format (3GP) (Release 8) , 3GPP Standard, 3GPP TS 26.244, 3rd Generation Partnership Project (3GPP), Mobile Competence Centre , 650, Route Des Lucioles , F-06921 Sophia-Antipolis Cedex , France, No. V8.1.0, Jun. 1, 2009, pp. 1-52, XP050370199.

3rd Generation Partnership Project; Technical Specification Group Services and System Aspects; Transparent end-to-end packet switched streaming service (PSS); 3GPP file format (3GP) (Release 9) , 3GPP Standard; 3GPP TS 26.244, 3rd Generation Partnership Project (3GPP), Mobile Competence Centre; 650, Route Des Lucioles; F-06921 Sophia-Antipolis Cedex; France, No. V9.2.0, Jun. 9, 2010, pp. 1-55, XP050441544, [retrieved on Jun. 9, 2010].

Afzal, et al., "Video Streaming over MBMS: A System Design Approach", Journal of Multimedia, vol. 1, No. 5, Aug. 2006, pp. 25-35.

Aggarwal, C. et al.: "A Permutation-Based Pyramid Broadcasting Scheme for Video-on-Demand Systems," Proc. IEEE Int'l Conf. on Multimedia Systems, Hiroshima, Japan (Jun. 1996).

Aggarwal, C. et al.: "On Optimal Batching Policies for Video-on-Demand Storage Servers," Multimedia Systems, vol. 4, No. 4, pp. 253-258 (1996).

Albanese, A., et al., "Priority Encoding Transmission", IEEE Transactions on Information Theory, vol. 42, No. 6, pp. 1-22, (Nov. 1996).

Alex Zambelli,"IIS Smooth Streaming Technical Overview", Microsoft Mar. 25, 2009, XP002620446, Retrieved from the Internet: URL:http://www.microsoft.com/downloads/en/ details. aspx?FamilyID=03d22583-3ed6-44da-8464-b1b4b5ca7520, [retrieved on Jan. 21, 2011].

Aljoscha Smolic et al., "Development of a New MPEG Standard for Advanced 3D Video Applications", IEEE International Symposium on Image and Signal Processing and Analysis, Sep. 16, 2009, pp. 400-407, XP031552049, ISBN: 978-953-184-135-1.

Almeroth, et al., "The use of multicast delivery to provide a scalable and interactive video-on-demand service", IEEE Journal on Selected Areas in Communication, 14(6): 1110-1122, (1996).

Alon, et al.: "Linear Time Erasure Codes with Nearly Optimal Recovery," Proceedings of the Annual Symposium on Foundations of Computer Science, US, Los Alamitos, IEEE Comp. Soc. Press, vol. Symp. 36, pp. 512-516 (Oct. 23, 1995) XP000557871.

Amin Shokrollahi: "LDPC Codes: An Introduction" Internet Citation 2 Apr. 1, 2003 (Apr. 2, 2003), XP002360065 Retrieved from the Internet: URL : http://www . ipm. ac . ir/IPM/homepage/ Annin 2. pdf [retrieved on Dec. 19, 2005].

Amon P et al., "File Format for Scalable Video Coding", IEEE Transactions on Circuits and Systems for Video Technology, IEEE Service Center, Piscataway, NJ, US, vol. 17, No. 9, Sep. 1, 2007, pp. 1174-1185, XP011193013, ISSN: 1051-8215, DOI:10.1109/TCSVT.2007.905521.

Anonymous: [Gruneberg, K., Narasimhan, S. and Chen, Y., editors] "Text of ISO/IEC 13818-1:2007/PDAM 6 MVC operation point descriptor", 90 MPEG Meeting; Oct. 26-30, 2009; Xian; (Motion Picture Expertgroup or ISO/IEC JTC1/SC29/WG11), No. N10942, Nov. 19, 2009, XP030017441.

(56) References Cited

OTHER PUBLICATIONS

Anonymous: "Text of ISO/IEC 14496-12 3rd Edition", 83 MPEG Meeting; Jan. 14-18; Antalya; (Motion Pictureexpert Group or ISO/IEC JTC1/SC29/WG11), No. N9678, Apr. 22, 2008, XP030016172.
Anonymous: "Text of ISO/IEC 14496-12:2008/PDAM 2 Sub-track selection & switching", 91. Mpeg Meeting; Jan. 18-22, 2010; Kyoto; (Motion Picture Expertgroup or ISO/IEC JTC1/SC29/WG11), No. N11137, Jan. 22, 2010, XP030017634, ISSN: 0000-0030.
Anonymous: "Text of ISO/Iec 14496-15 2nd edition", 91 MPEG Meeting; Jan. 18-22, 2010; Kyoto; (Motion Picture Expertgroup or ISO/IEC JTC1/SC29/WG11) No. N11139, Jan. 22, 2010, XP030017636.
Anthony Vetro, et al., "Joint Draft 8.0 on Multiview Video Coding", Joint Video Team (JVT) of ISO/IEC MPEG & ITU-T VCEG (ISO/IEC JTC1/SC29/WG11 and ITU-T SG16 Q.6) 28th Meeting: Hannover, DE, 20-25, Document: JVT-AB204, Jul. 2008, pp. 1-63.
Apple Inc., "On the time-stamps in the segment-inbox for httpstreaming (26.244, R9)", TSG-SA4#58 meeting, Vancouver, Canada, Apr. 2010, p. 5.
Bar-Noy, et al., "Competitive on-line stream merging algorithms for media-on-demand", Draft (Jul. 2000), pp. 1-34.
Bar-Noy et al. "Efficient algorithms for optimal stream merging for media-on-demand," Draft (Aug. 2000), pp. 1-43.
Bigloo, A. et al.: "A Robust Rate-Adaptive Hybrid ARQ Scheme and Frequency Hopping for Multiple-Access Communication Systems," IEEE Journal on Selected Areas in Communications, US, IEEE Inc, New York (Jun. 1, 1994) pp. 917-924, XP000464977.
Bitner, J.R., et al.: "Efficient Generation of the Binary Reflected Gray code and Its Applications," Communications of the ACM, pp. 517-521, vol. 19 (9), 1976.
Byers, J.W. et al.: "A Digital Fountain Approach to Reliable Distribution of Bulk Data," Computer Communication Review, Association for Computing Machinery. New York, US, vol. 28, No. 4 (Oct. 1998) pp. 56-67 XP000914424 ISSN:0146-4833.
Byers, J.W. et al.: "Accessing multiple mirror sites in parallel: using Tornado codes to speed up downloads," 1999, Eighteenth Annual Joint Conference of the IEEE Comupter and Communications Socities, pp. 275-283, Mar. 21, 1999, XP000868811.
Charles Lee L.H, "Error-Control Block Codes for Communications Engineers", 2000, Artech House, XP002642221 pp. 39-45.
Chen, et al., U.S. Patent Application titled "Frame Packing for Asymmetric Stereo Video", filed Feb. 25, 2011.
Chen, et al., U.S. Patent Application titled "One-Stream Coding for Asymmetric Stereo Video", filed Feb. 25, 2011.
Chen Ying et al., "Coding techniques in Multiview Video Coding and Joint Multiview Video Model", Picture Coding Symposium, 2009, PCS 2009, IEEE, Piscataway, NJ, USA, May 6, 2009, pp. 1-4, XP031491747, ISBN: 978-1-4244-4593-6.
Choi S: "Temporally enhanced erasure codes for reliable communication protocols" Computer Networks, Elsevier Science Publishers B.V., Amsterdam, NL, vol. 38, No. 6, Apr. 22, 2002, pp. 713-730, XP004345778, ISSN: 1389-1286, DOI:10.1016/S1389-1286(01)00280-8.
Clark G.C., et al., "Error Correction Coding for Digital Communications, System Applications," Error Correction Coding for Digital Communications, New York, Plenum Press, US, Jan. 1, 1981, pp. 339-341.
D. Gozalvez et,al. "AL-FEC for Improved Mobile Reception of MPEG-2 DVB-Transport Streams" Hindawi Publishing Corporation, International Journal of Digital Multimedia Broadcasting vol. 2009, Dec. 31, 2009, pp. 1-10, XP002582035 Retrieved from the Internet: URL:http://www.hindawi.com/journals/ijdmb/2009/614178.html> [retrieved on May 12, 2010].
Dan, A. et al.: "Scheduling Policies for an On-Demand Video Server with Batching," Proc. ACM Multimedia, pp. 391-398 (Oct. 1998).
Davey, M.C. et al.: "Low Density Parity Check Codes over GF(q)" IEEE Communications Letters, vol. 2, No. 6 pp. 165-167 (1998).
David Singer, et al., "ISO/IEC 14496-15/FDIS, International Organization for Standardization Organization Internationale De Normal-ization ISO/IEC JTC1/SC29/WG11 Coding of Moving Pictures and Audio", ISO/IEC 2003, Aug. 11, 2003, pp. 1-34.
Digital Fountain: "Raptor code specification for MBMS file download," 3GPP SA4 PSM AD-HOC #31 (May 21, 2004) XP002355055 pp. 1-6.
Digital Fountain: "Specification Text for Raptor Forward Error Correction," TDOC S4-050249 of 3GPP TSG SA WG 4 Meeting #34 [Online] (Feb. 25, 2005) pp. 1-23, XP002425167, Retrieved from the Internet: URL:http://www.3gpp.org/ftp/tsg_sa/WG4_CODEC/TSGS4_34/Docs.
"Digital Video Broadcasting (DVB); Guidelines for the implementation of DVB-IP Phase 1 specifications; ETSI TS 102 542" ETSI Standards, LIS, Sophia Antipoliscedex, France, vol. BC, No. V1.2.1, Apr. 1, 2008, XP014041619 ISSN: 0000-0001 p. 43 p. 66 pp. 70, 71.
DVB-IPI Standard: DVB BlueBook A086r4 (Mar. 2007) Transport of MPEG 2 Transport Streatm (TS) Based DVB Services over IP Based Networks, ETSI Technical Specification 102 034 v1.3.1.
Eager, et al. "Minimizing bandwidth requirements for on-demand data delivery," Proceedings of the International Workshop on Advances in Multimedia Information Systems,p. 80-87 (Indian Wells, CA Oct. 1999).
Eager, et al., "Optimal and efficient merging schedules for video-on-demand servers", Proc. ACM Multimedia, vol. 7, pp. 199-203 (1999).
Esaki, et al.: "Reliable IP Multicast Communication Over ATM Networks Using Forward Error Correction Policy," IEICE Transactions on Communications, JP, Institute of Electronics Information and Comm. Eng. Tokyo, vol. E78-V, No. 12, (Dec. 1995), pp. 1622-1637, XP000556183.
Feng, G., Error Correcting Codes over Z2m for Algorithm-Based Fault-Tolerance, IEEE Transactions on Computers, vol. 43, No. 3, Mar. 1994, pp. 370-374.
Fernando, et al., "httpstreaming of MPEG Media—Response to CfP", 93 MPEG Meeting; Jul. 26-30, 2010; Geneva; (Motion Picture Expert Group or ISO/IEC JTC1/SCE29/WG11), No. M17756, Jul. 22, 2010, XP030046346.
Fielding et al., "RFC 2616: Hypertext Transfer Protocol HTTP/1.1", Internet Citation, Jun. 1999, pp. 165, XP002196143, Retrieved from the Internet: URL:http://www.rfc-editor-org/ [retrieved on Apr. 15, 2002].
Frojdh, et al., "File format sub-track selection and switching," ISO/IEC JTC1/SC29/WG11 MPEG2009 M16665, London UK., Jul. 2009, 14 pp.
Gao, L. et al.: "Efficient Schemes for Broadcasting Popular Videos," Proc. Inter. Workshop on Network and Operating System Support for Digital Audio and Video, pp. 1-13 (1998).
GASIBA, Tiago et al., "System Design and Advanced Receiver Techniques for MBMS Broadcast Services" Proc. 2006 International Conference on Communications (ICC 2006), Jun. 1, 2006, pp. 5444-5450, XP031025781 ISBN: 978-1-4244-0354-7.
Gemmell, et al., "A Scalable Multicast Architecture for One-To-Many Telepresentations", Multimedia Computing and Systems, 1998/Proceedings. IEEE International Conference on Austin, TX, USA Jun. 28-Jul. 1, 1998, Los Alamitos, CA USA, IEEE Comput. Soc, US, Jun. 28, 1998, pp. 128-139, XP010291559.
Goyal: "Multiple Description Coding: Compression Meets the Network," In Signal Processing Magazine, IEEE, vol. 18., Issue 5 (Sep. 2001) pp. 74-93 URL:http://www.rle.nnit.edu/stir/docunnents/Goyal_SigProcMag2001_MD.pdf [Nov. 4, 2007].
Gozalvez D et, al: "Mobile reception of DVB-T services by means of AL-FEC protection" Proc. IEEE Intern. Symposium on Broadband Multimedia Systems and Broadcasting (BMSB '09), IEEE, Piscataway, NJ, USA, May 13, 2009, pp. 1-5, XP031480155 ISBN: 978-1-4244-2590-7.
Grineberg, et al., "Deliverable D3.2 MVC/SVC storage format" Jan. 29, 2009, XP002599508 Retrieved from the Internet: URL:http://www.ist-sea.eu/Public/SEA_D3.2_HHI FF_20090129.pdf [retrieved on Sep. 1, 2010] paragraph [02.3].
Hagenauer, J.: "Soft is better than hard" Communications, Coding and Cryptology, Kluwer Publication May 1994, XP002606615 Retrieved from the Internet : URL:http://www. Int . ei .turn.de/veroeffentlic hungen/I994/ccc94h. pdf [retrieved on Oct. 25, 2010].

(56) References Cited

OTHER PUBLICATIONS

He Wenge et al., "Asymmetric Stereoscopic Video Encoding Algorithm Based on Joint Compensation Prediction", IEEE International Conference on Communications and Mobile Computing, Jan. 6, 2009, pp. 191-194, XP031434775, ISBN: 978-0-7695-3501-2.
Hershey, et al., "Random Parity Coding (RPC)", 1996 IEEE International Conference on Communications (ICC). Converging Technologies for Tomorrow's Applications. Dallas, June 23-27, 1996, IEEE International Conference on Communications (ICC), New York, IEEE, US, vol. 1, Jun. 23, 1996, pp. 122-126, XP000625654.
Hitachi Ltd. et al., "High-Definition Multimedia Interface," Specification Version 1.4, Jun. 5, 2009, 425 pp.
Hua, et al., "Skyscraper broadcasting: A new broadcsting system for metropolitan videoon-demand systems", Proc. ACM SIGCOMM, pp. 89-100 (Cannes, France, 1997).
Ian Trow, "Is 3D Event Coverage Using Existing Broadcast Infrastructure Technically Possible?", International Broadcasting Conference, Sep. 9-13, 2009, XP030081671, pp. 4-5, "3D transmission over broadcast infrastructure" pp. 7-8, "Screen signaling"—Conclusions on 3D systems.
IETF RFC 2733: Rosenberg, J. et al. "An RTP Payload Format for Generic Forward Error Correction," Network Working Group, RFC 2733 (Dec. 1999).
Information Technology -Generic Coding of Moving Pictures and Audio: Systems, Amendment 4: Transport of Multiview Video over ITU-T Rec H.222.0 | ISO/IEC 13818-1 "Text of ISO/IEC 13818-1:2007/FPDAM 4—Transport of Multiview Video over ITU-T Rec H.222.0 | ISO/IEC 13818-1," Lausanne, Switzerland, 2009, 21 pp.
International Search Report and Written Opinion—PCT/US2011/044745—ISA/EPO—Dec. 12, 2011 (100875W0).
International Standard ISO/IEC 14496-12, Information Technology—Coding of audio-visual objects—Part 12: ISO base media file format, Third Edition, Oct. 15, 2008, 120 pp.
International Telecommunication Union, "ITU-T H.264, Series H: Audiovisual and Multimedia Systems, Infrastructure of audiovisual services—Coding of moving video, Advanced video coding for generic audiovisual services," Mar. 2010, 669 pp.
ISO/IEC 13818-1, "Information technology—Generic coding of moving pictures and associated audio information: Systems," Second edition, Dec. 1, 2000, 174 pp.
ISO/IEC JTC 1/SC 29, ISO/IEC FCD 23001-6, Information technology—MPEG systems technologies—Part 6: Dynamic adaptive streaming over HTTP (DASH), Jan. 28, 2011.
ISO/IEC JTC1/SC29/WG11: "Requirements on HTTP Streaming of MPEG Media", 92. MPEG Meeting; Apr. 19-23, 2010; Dresden; No. N11340, May 14, 2010, XP030017837, ISSN: 0000-0029.
Jin Li: "The Efficient Implementation of Reed-Solomon High Rate Erasure Resilient Codes" Proc. 2005 IEEE International Conference on Acoustics, Speech, and Signal Processing, Philadelphia, PA, USA, IEEE, Piscataway, NJ, vol . 3, Mar. 18, 2005, pp. 1097-1100, XP010792442, DOI: 10.1109/ICASSP.2005.1415905 ISBN: 978-0-7803-8874-1.
"Joint Draft 8.0 on Multiview Video Coding", 28th JVT meeting, Hannover, Germany, Document: JVT-AB204 (rev.1), Jul. 2008. available from http:// wftp3. itu.int/av-arch/jvt-site/2008_07_Hannover/JVT-AB204.
Juhn, L. et al.: "Adaptive Fast Data Broadcasting Scheme for Video-on-Demand Service," IEEE Transactions on Broadcasting, vol. 44, No. 2, pp. 182-185 (Jun. 1998).
Juhn, L. et al.: "Harmonic Broadcasting for Video-on-Demand Service," IEEE Transactions on Broadcasting, vol. 43, No. 3, pp. 268-271 (Sep. 1997).
Kallel, "Complementary Punctured Convolutional (CPC) Codes and Their Applications", IEEE Transactions on Communications, IEEE Inc., New York, US, vol. 43, No. 6, Jun. 1, 1995, pp. 2005-2009.
Kimata H et al., "Inter-View Prediction With Downsampled Reference Pictures", ITU Study Group 16—Video Coding Experts Group -ISO/IEC MPEG & ITU-T VCEG(ISO/IEC JTC1/SC29/WG11 and ITU-T SG16 Q6), No. JVT-W079, Apr. 19, 2007, XP030007039.

Kozamernik F: "Media streaming over the Internet", Internet Citation, Oct. 2002, XP002266291, Retrieved from the Internet: URL: http://www.ebu.ch/trev_292-kozamerni k. pdf [retrieved on Jan. 8, 2004] section "Video codecs for scalable streaming".
Lee L., et al.,"VLSI implementation for low density parity check decoder", Proceedings of the 8th IEEE International Conference on Elecctronics, Circuits and Systems, 2001. ICECS 2001, Sep. 2, 2001, vol. 3, pp. 1223-1226.
Lin, S. et al.: "Error Control Coding-Fundamentals and Applications," 1983, Englewood Cliffs, pp. 288, XP002305226.
Luby Digital Fountain A Shokrollahi Epfl M Watson Digital Fountain T Stockhammer Nomor Research M: "Raptor Forward Error Correction Scheme for Object Delivery; rfc5053.txt", IETF Standard, Internet Engineering Task Force, IETF, CH, Oct. 1, 2007, XP015055125, ISSN: 0000-0003.
Luby, et al., "Analysis of Low Density Codes and Improved Designs Using Irregular Graphs, 1998, Proceedings of the 30th Annual ACM Symposium on Theory of Computing", May 23, 1998, pp. 249-258, XP000970907.
Luby, et al., "FLUTE -File Delivery over Unidirectional Transport", IETF RFC 3926, pp. 1-29, (Oct. 2004).
Luby et al., "Improved Low-Density Parity-Check Codes Using Irregular Graphs and Belief Propogation", Information Theory, 1998. Proceedings. 1998 IEEE International Symposium on Cambridge, MA, USA Aug. 16-21, 1998, New York, NY, USA, IEEE, US Aug. 16, 199.
Luby et, al. "Layered Coding Transport (LCT) Building Block", IETF RFC 5651, pp. 1-42, (Oct. 2009).
Luby, et al.: "Analysis of Low Density Codes and Improved Designs Using Irregular Graphs," International Computer Science Institute Technical Report TR-97-045 (Nov. 1997) [available at ftp://ftp.icsi.berkeley.edu/pub/techreports/1997/tr-97-045.pdf].
Luby, M., et, al. "Forward Error Correction (FEC) Building Block", IETF RFC 5052, pp. 1-31, (Aug. 2007).
Luby, M., et al., "Raptor Forward Error Correction Scheme for Object Delivery", IETF RFC5053, pp. 1-46 (Sep. 2007).
Luby, M., et al., "RaptorQ Forward Error Correction Scheme for Object Delivery", IETF draft ietf-rmt-bb-fec-raptorq-04, Reliable Multicast Transport, pp. 1-68, (Aug. 24, 2010).
Luby, M., et al., "Request for Comments: 3453: The Use of Forward Error Correction (FEC) in Reliable Multicast," Internet Article, [Online] Dec. 2002, pp. 1-19.
Luby, M. et al.: "Efficient Erasure Correction Codes," 2001, IEEE Transactions on Information Theory, Vo. 47, No. 2, pp. 569-584, XP002305225.
Luby M et al: "IPTV Systems, Standards and Architectures: Part II -Application Layer FEC in IPTV Services" IEEE Communications Magazine, IEEE Service Center, Piscataway, US LNKDDOI: 10.1109/MCOM.2008.4511656, vol. 46, No. 5, May 1, 2008, pp. 94-101, XP011226858 ISSN: 0163-6804.
Luby, M. et al.: "Pairwise Independence and Derandonnization," Foundations and Trends in Theoretical Computer Science, vol. 1, Issue 4, 2005, Print ISSN 1551-305X, Online ISSN 1551-3068.
Luby, M. et al.: "Practical Loss-Resilient Codes: Tornado Codes," 29th Annual ACM Symposium on Theory of Computing, vol. SYMP. 29, May 4, 1997, pp. 1-10, XP002271229.
Luby, Michael G. "Analysis of Random Processes via and-or Tree Evaluation," Proceedings of the 9th Annual ACM-SIAM Symposium on Discrete Algorithnns,TR-97-0, 1998, pp. 364-373, (search date: Jan. 25, 2010) URL: <http://portal.acm.prg.citation.cfm?id=314722>.
Mandelbaum D.M., "An Adaptive-Feedback Coding Scheme Using Incremental Redundancy", IEEE Trans on Information Theory, vol. May 1974, pp. 388-389, XP002628271, the whole document.
Marpe, et al., "The H.264/MPEG4 Advanced Video Coding Standard and its Applications," Standards Report, IEEE Communications Magazine, Aug. 2006, pp. 134-143.
Matsuoka H., et al., "Low-Density Parity-Check Code Extensions Applied for Broadcast-Communication Integrated Content Delivery", Research Laboratories, NTT DOCOMO, Inc., 3-6, Hikari-No-Oka, Yokosuka, Kanagawa, 239-8536, Japan, ITC-SS21, 2010 IEICE, pp. 59-63.

(56) References Cited

OTHER PUBLICATIONS

McCanne et al., "Low-Complexity Video Coding for Receiver-Driven Layered Multicast", IEEE Journal on Selected Areas in Communication IEEE Service Center, Aug. 1, 1997, vol. 15, No. 6, pp. 983-1001, Piscataway, US, XP011054678, ISSN: 0733-8716.
Mimnaugh, A et, al. "Enabling Mobile Coverage for DVB-T" Digital Fountain Whitepaper Jan. 29, 2008, pp. 1-9, XP002581808 Retrieved from the Internet: URL:http://www.digitalfountain.com/ufiles/library/DVB-T-whitepaper.pdf> [retrieved on May 10, 2010].
Min-Goo Kim: "On systematic punctured convolutional codes", IEEE Trans on Communications, vol. 45, No. 2, Feb. 1997, XP002628272, the whole document, pp. 133-139.
Muller, et al., "A test-bed for the dynamic adaptive streaming over HTTP featuring session mobility" MMSys '11 Proceedings of the second annual ACM conference on Multimedia systems, Feb. 23-25, 2011, San Jose, CA, pp. 271-276.
Naguib, Ayman, et al., "Applications of Space-Time Block Codes and Interference Suppression for High Capacity and High Data Rate Wireless Systems," IEEE, 1998, pp. 1803-1810.
Narayanan, et al., "Physical Layer Design for Packet Data Over IS-136", Vehicular Technology Conference, 1997, IEEE 47th Phoenix, AZ, USA May 4-7, 1997, New York, NY, USA, IEEE, US May 4, 1997, pp. 1029-1033.
Nokia: "Reed-Solomon Code Specification for. MBMS Download and Streaming Services", 3GPP Draft; S4-050265_RS_SPEC, 3rd Generation Partnership Project (3GPP), Mobile Competence Centre ; 650, Route Des Lucioles ; F-06921 Sophia-Antipolis Cedex ; France, vol. SA WG4, no. San Diego, USA; 20050415, Apr. 15, 2005, XP050287675, [retrieved on Apr. 15, 2005].
Nokia Corp., "Usage of 'mfra' box for Random Access and Seeking," S4-AHI127, 3GPP TSG-SA4 Ad-Hoc Meeting, Dec. 14-16, 2009, Paris, FR, 2 pp.
Nonnenmacher, et al., "Parity-Based Loss Recovery for Reliable Multicast Transmission", IEEE / ACM Transactions on Networking, IEEE Inc. New York, US, vol. 6, No. 4, Aug. 1, 1998, pp. 349-361.
Ozden, B. et al.: "A Low-Cost Storage Service for Movie on Demand Databases," Proceedings of the 20th Very Large DataBases (VLDB) Conference, Santiago, Chile (1994).
PA. Chou, A. Mohr, A. Wang, S. Mehrotra, "FEC and Pseudo-ARQ for Receiver-Driven Layered Multicast of Audio and Video," pp. 440-449, IEEE Computer Society, Data Compression Conference (2000).
Pantos R et al., "HTTP Live Streaming; draft-pantos-http-1ive-streaming-OT.txt", HTTP Live Streaming; Draft-Pant0s-HTTP-Live-Streaming-01.TXT, Internet Engineering Task Force, IETF; Standardworkingdraft, Internet Society (ISOC) 4, Rue Des Falaises CH- 1205 Geneva, Switzerland, No. 1, Jun. 8, 2009, XP015062692.
Paris, et al., "A low bandwidth broadcasting protocol for video on demand", Proc. International Conference on Computer Communications and Networks, vol. 7, pp. 690-697 (Oct. 1998).
Paris, et al., "Efficient broadcasting protocols for video on demand", International Symposium on Modeling, Analysis and Simulation of Computer and Telecommunication systems (MASCOTS), vol. 6, pp. 127-132 (Jul. 1998).
Petition decision for Petition Under 37 C.F.R. § 1.78 to Accept an Unintentionally Delayed Priority Claim under 35 U.S.C. § 120 in U.S. Patent No. 7,532,132, dated Jul. 21, 2011, 2 pages.
Petition under 37 C.F.R. § 1.78 to Accept an Unintentionally Delayed Priority Claim under 35 U.S.C. § 120 in U.S. Patent No. 7,532,132, dated May 27, 2011, 2 pages.
Plank J. S., "A Tutorial on Reed-Solomon Coding for Fault-Tolerance in Raid-Like Systems", Software Practice & Experience, Wiley & Sons, Bognor Regis, GB, vol. 27, No. 9, Sep. 1, 1997, pp. 995-1012, XP00069594.
Pless and WC Huffman EDS V S: Algebraic geometry codes, Handbook of Coding Theory, 1998, pp. 871-961, XP002300927.
Pursley, et al.: "Variable-Rate Coding for Meteor-Burst Communications," IEEE Transactions on Communications, US, IEEE Inc. New York (1989) vol. 37, No. 11, pp. 1105-1112 XP000074533.
Pursley, M. et al.: "A Correction and an Addendum for Variable-Rate Coding for Meteor-Burst Communications," IEEE Transactions on Communications, vol. 43, No. 12 pp. 2866-2867 (Dec. 1995).
Pyle, et al., "Microsoft http smooth Streaming: Microsoft response to the Call for Proposal on httpstreaming", 93 MPEG Meeting; Jul. 26-30, 2010; Geneva; (Motion Picture Expert Group or ISO/IEC JTC1/SCE29/WG11), No. M17902, Jul. 22, 2010, XP030046492.
Qualcomm Europe S A R L: "Baseline Architecture and Definitions for HTTP Streaming", 3GPP Draft; S4-090603_HTTP_Streaming_Architecture, 3rd Generation Partnership Project (3GPP), Mobile Competence Centre; 650, Route Des Lucioles; F-06921 Sophia-Antipolis Cedex; France, no. Kista; 20090812, Aug. 12, 2009, XP050356889.
Qualcomm Incorporated: "Use Cases and Examples for Adaptive httpstreaming", 3GPP Draft; S4-100408-Usecases-HSD, 3rd Generation Partnership Project (JGPP), Mobile Competence Centre; 650, Route Des Lucioles; F-06921 Sophia-Antipolis Cedex; France, vol. SA WG4, no. Prague, Czech Republic; 20100621, Jun. 17, 2010, XP050438085, [retrieved on Jun. 17, 2010].
Rangan, et al., "Designing an On-Demand Multimedia Service," IEEE Communication Magazine, vol. 30, pp. 56-64, (Jul. 1992).
Realnetworks Inc, et al., "Format for httpstreaming Media Presentation Description", 3GPP Draft; S4-100020, 3rd Generation Partnership Project (3GPP), Mobile Competence Centre; 650, Route Des Lucioles; F-06921 Sophia-Antipolis Cedex; France, vol. SA WG4, no. S t Julians, Malta; 20100125, Jan. 20, 2010, XP050437753, [retrieved on Jan. 20, 2010].
Research in Motion UK Limited: "An MPD delta file for httpstreaming", 3GPP Draft; S4-100453, 3rd Generation Partnership Project (SGPP), Mobile Competence Centre; 650, Route Des Lucioles; F-06921 Sophia-Antipolis Cedex; France, vol. SA WG4, no. Prague, Czech Republic; 20100621, Jun. 16, 2010, XP050438066, [retrieved on Jun. 16, 2010].
Rhyu, et al., "Response to Call for Proposals on httpstreaming of MPEG Media", 93 MPEG Meeting; Jul. 26-30, 2010; Geneva; (Motion Picture Expert Group or ISO/IEC JTC1/SCE29/WG11) No. M17779, Jul. 26, 2010, XP030046369.
Roca, V., et, al. "Low Density Parity Check (LDPC) Staircase and Triangle Forward Error Correction (FEC) Schemes", IETF RFC 5170 (Jun. 2008), pp. 1-34.
Roca, V. et al.: "Design, Evaluation and Comparison of Four Large Block FEC Codecs, LDPC, LDGM, LDGM Staircase and LDGM Triangle, plus a Reed-Solomon Small Block FEC Codec," INRIA Research Report RR-5225 (2004).
Rost, S. et al.: "The Cyclone Server Architecture: streamlining delivery of popular content," 2002, Computer Communications, vol. 25, No. 4, pp. 403-412.
Roth, R., et al., "A Construction of Non-Reed-Solomon Type MDS Codes", IEEE Transactions of Information Theory, vol. 35, No. 3, May 1989, pp. 655-657.
Roth, R., "On MDS Codes via Cauchy Matrices", IEEE Transactions on Information Theory, vol. 35, No. 6, Nov. 1989, pp. 1314-1319.
Schwarz, Heiko et al., "Overview of the Scalable Video Coding Extension of the H.264/AVC Standard", IEEE Transactions on Circuits and Systems for Video Technology, vol. 17, No. 9, Sep. 2007, pp. 1103-1120.
Seshan, S. et al.: "Handoffs in Cellular Wireless Networks: The Daedalus Implementation and Experience," Wireless Personal Communications, NL; Kluwer Academic Publishers, vol. 4, No. 2 (Mar. 1, 1997) pp. 141-162, XP000728589.
Shacham: "Packet Recovery and Error Correction in High-Speed Wide-Area Networks," Proceedings of the Military Communications Conference. (Milcom), US, New York, IEEE, vol. 1, pp. 551-557 (1989) XP000131876.
Shierl T; Gruneberg K; Narasimhan S; Vetro A: "ISO/IEC 13818-1:2007/FPDAM 4—Information Technology Generic Coding of Moving Pictures and Audio Systems amendment 4: Transport of Multiview Video over ITU-T Rec H.222.0 ISO/IEC 13818-1" ITU-T Rec. H.222.0(May 2006)FPDAM 4, vol. MPEG2009, No. 10572, May 11, 2009, pp. 1-20, XP002605067 p. 11, last two paragraphs sections 2.6.78 and 2.6.79 table T-1.

(56) References Cited

OTHER PUBLICATIONS

Shokrollahi, A.: "Raptor Codes," Internet Citation [Online] (Jan. 13, 2004) XP002367883, Retrieved from the Internet: URL:http://www.cs.huji.ac.il/labs/danss/p2p/resources/raptor.pdf.

Shokrollahi, Amin. "Raptor Codes," IEEE Transactions on Information Theory, Jun. 2006, vol. 52, No. 6, pp. 2551-2567, (search date: Feb. 1, 2010) URL: <http://portal.acm.org/citation.cfm?id=1148681>.

Shokrollahi et al., "Design of Efficient Easure Codes with Differential Evolution", IEEE International Symposium on Information Theory, Jun. 25, 2000, pp. 5-5.

Sincoskie, W. D., "System Architecture for Large Scale Video on Demand Service," Computer Network and ISDN Systems, pp. 155-162, (1991).

Stockhammer, "WD 0.1 of 23001-6 Dynamic Adaptive Streaming over HTTP (DASH)", MPEG-4 Systems, International Organisation for Standardisation, ISO/IEC JTC1/SC29/WG11, Coding of Moving Pictures and Audio, MPEG 2010 Geneva/m11398, Jan. 6, 2011, 16 pp.

Sullivan et al., Document: JVT-AA007, "Editors' Draft Revision to ITU-T Rec. H.264|ISO/IEC 14496-10 Advanced Video Coding—in Preparation for ITU-T SG 16 AAP Consent (in integrated form)," Joint Video Team (JVT) of ISO/IEC MPEG & ITU-T VCEG (ISO/IEC JTC1/SC29/WG11 and ITU-T SG16 Q.6), 30th Meeting: Geneva, CH, Jan. 29-Feb.3 , 2009, pp. 1-683, http://wftp3.itu.int/av-arch/jvt-site/2009_01_Geneva/JVT-AD007.zip.

Sun, et al., "Seamless Switching of Scalable Video Bitstreams for Efficient Streaming," IEEE Transactions on Multimedia, vol. 6, No. 2, Apr. 2004, pp. 291-303.

Telefon AB LM Ericsson, et al., "Media Presentation Description in httpstreaming", 3GPP Draft; S4-100080-MPD, 3rd Generation Partnership Project (3GPP), Mobile Competence Centre; 650, Route Des Lucioles; F-06921 Sophia-Antipolis Cedex; France, vol. SA WG4, no. St Julians, Malta; 20100125, Jan. 20, 2010, XP050437773, [retrieved on Jan. 20, 2010].

Thomas Wiegand, et al., "Joint Draft ITU-T Rec. H.264 | ISO/IEC 14496-10 / Amd.3 Scalable video coding", Joint Video Team (JVT) of ISO/IEC MPEG & ITU-T VCEG (ISO/IEC JTC1/SC29/WG11 and ITU-T SG16 Q.6) 24th Meeting: Geneva, Switzerland, Jun. 29-Jul. 5, 2007, pp. 1-559.

U.S. Appl. No. 12/840,146, by Ying Chen et al., filed Jul. 20, 2010.
U.S. Appl. No. 12/908,537, by Ying Chen et al., filed Oct. 20, 2010.
U.S. Appl. No. 12/908,593, by Ying Chen et al., filed Oct. 20, 2010.
U.S. Appl. No. 13/082,051, by Ying Chen et al., filed Apr. 7, 2011.
U.S. Appl. No. 13/205,559, by Ying Chen et al., filed Aug. 8, 2011.
U.S. Appl. No. 13/205,565, by Ying Chen et al., filed Aug. 8, 2011.
U.S. Appl. No. 13/205,574, by Ying Chen et al., filed Aug. 8, 2011.

Universal Mobile Telecommunications System (UMTS); LTE; Transparent end-to-end Packet-switched Streaming Service (PSS); Protocols and codecs (3GPP TS 26.234 version 9.3.0 Release 9), Technical Specification, European Telecommunications Standards Institute (ETSI), 650, Route Des Lucioles; F-06921 Sophia-Antipolis; France, vol. 3GPP SA, No. V9.3.0, Jun. 1, 2010, XP014047290, paragraphs [5.5.4.2], [5.5.4.3], [5.5.4.4], [5.4.5], [5.5.4.6] paragraphs [10.2.3], [11.2.7], [12.2.3], [12.4.2], [12.6.2] paragraphs [12.6.3], [12.6.3.1], [12.6.4], [12.6.6].

Viswanathan, et al., "Metropolitan area video-on-demand services using pyramid broadcasting", Multimedia Systems, 4(4): 197-208 (1996).

Viswanathan, et al., "Pyramid Broadcasting for Video-on-Demand Service", Proceedings of the SPIE Multimedia Computing and Networking Conference, vol. 2417, pp. 66-77 (San Jose, CA, Feb. 1995).

Viswanathan,Subramaniyam R., "Publishing in Wireless and Wireline Environments," Ph. D Thesis, Rutgers, The State University of New Jersey (Nov. 1994), 180pages.

Wang,"On Random Access", Joint Video Team (JVT) of ISO/IEC MPEG & ITU-T VCEG (ISO/IEC JTC1ISC29/WG11 and ITU-T SG16 Q.6), 4th Meeting: Klagenfurt, Austria, Jul. 22-26, 2002, p. 13.

Watson, M., et, al. "Asynchronous Layered Coding (ALC) Protocol Instantiation", IETF RFC 5775, pp. 1-23, (Apr. 2010).

Wenger, et al., RFC 3984, "RTP Payload Format for H.264 Video," Feb. 2005, 84 pp.

Wong, J.W., "Broadcast delivery", Proceedings of the IEEE, 76(12): 1566-1577, (1988).

Yamauchi, Nagamasa. "Application of Lost Packet Recovery by Front Error Correction to Internet Multimedia Transfer" Proceedings of Workshop for Multimedia Communication and Distributed Processing, Japan, Information Processing Society of Japan (IPS), Dec. 6, 2000, vol. 2000, No. 15, pp. 145-150.

Yin et al., "Modified Belief-Propogation algorithm for Decoding of Irregular Low-Density Parity-Check Codes", Electronics Letters, IEE Stevenage, GB, vol. 38, No. 24, Nov. 21, 2002, pp. 1551-1553.

Ying Chen et al: "Response to the CfP on HTTP Streaming: Adaptive Video Streaming based on AVC", 93 MPEG Meeting; Jul. 26-30, 2010; Geneva; (Motion Picture Expert Group or ISO/IEC JTC1/SC29/WG11), No. M17909, Jul. 26, 2010, XP030046499.

Bross, et al., "High efficiency video coding (HEVC) text specification draft 6," Joint Collaborative Team on Video Coding (JCT-VC) of ITU-T SG16 WP3 and ISO/IEC JTC1/SC29/WG11 JCTVC-H1003, 7th Meeting: Geneva, CH, Nov. 21-30, 2011, pp. 259.

Bross, et al., "High efficiency video coding (HEVC) text specification draft 7," Joint Collaborative Team on Video Coding (JCT-VC) of ITU-T SG16 WP3 and ISO/IEC JTC1/SC29/WG11 9th Meeting: Geneva, CH, Apr. 27-May 7, 2012, JCTVC-I1003_d21, pp. 290.

Bross, et al., "High efficiency video coding (HEVC) text specification draft 8," Joint Collaborative Team on Video Coding (JCT-VC) of ITU-T SG16 WP3 and ISO/IEC JTC1/SC29/WG11 10th Meeting: Stockholm, SE, Jul. 11-20, 2012, JCTVC-J1003_d7, pp. 261.

Bross et al., "WD4: Working Draft 4 of High-Efficiency Video Coding," JCTVC-F803_d2, (JCT-VC) of ITU-T SG16 WP3 and ISO/IEC JTC1/SC29/WG11 Joint Collaborative Team on Video Coding, 6th Meeting, Torino, IT, Jul. 14-22, 2011, 226 pages.

Bross et al., "WD5: Working Draft 5 of High-Efficiency Video Coding," JCTVC-G1103_d2, (JCT-VC) of ITU-T SG16 WP3 and ISO/IEC JTC1/SC29/WG11 Joint Collaborative Team on Video Coding, 7th Meeting, Geneva, Switzerland (Nov. 2011), 214 pages.

Cataldi et al., "Sliding-Window Raptor Codes for Efficient Scalable Wireless Video Broadcasting With Unequal Loss Protection", IEEE Transactions on Image Processing, Jun. 1, 2010, pp. 1491-1503, vol. 19, No. 6, IEEE Service Center, XP011328559, ISSN: 1057-7149, DOI: 10.1109/TIP.2010.2042985.

European Search Report—EP10013235—Search Authority—The Hague—Aug. 20, 2012.

Gracie et al., "Turbo and Turbo-Like Codes: Principles and Applications in Telecommunications", Proceedings of the IEEE, Jun. 1, 2007, pp. 1228-1254, vol. 95, No. 6, IEEE, XP011189323, ISSN: 0018-9219, DOI: 10.1109/JPROC.2007.895197.

Huawei et al., "Implict mapping between CCE and PUCCH for ACK/NACK TDD", 3GPP Draft; R1-082359, 3rd Generation Partnership Project (3GPP), Mobile Competence Centre; 650, Route Des Lucioles; F-06921 Sophia-Antipolis Cedex; France, vol. RAN WG1, No. Warsaw, Poland, Jun. 24, 2008, XP050110650, [retrieved on Jun. 24, 2008].

ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.

Jiang., File Format for Scalable Video Coding, PowerPoint Presentation for CMPT 820, Summer 2008.

Kimura et al., "A Highly Mobile SDM-0FDM System Using Reduced-Complexity-and-Latency Processing", IEEE International Symposium on Personal, Indoor and Mobile Radio Communications (PIMRC), Sep. 1, 2007, pp. 1-5, IEEE, XP031168836, ISBN: 978-1-4244-1143-6, DOI: 10.1109/PIMRC.2007.4394758.

Luby Qualcomm Incorporated, "Universal Object Delivery using RaptorQ; draft-luby-uod-raptorq-OO.txt", Internet Engineering Task Force (IETF), Standardworkingdraft, Internet Society (ISOC), Mar. 7, 2011, pp. 1-10, XP015074424, [retrieved on Mar. 7, 2011].

Mackay, "Fountain codes Capacity approaching codes design and implementation", IEE Proceedings: Communications, Dec. 9, 2005, pp. 1062-1068, vol. 152, No. 6, Institution of Electrical Engineers, XP006025749, ISSN: 1350-2425, DOI: 10.1049/IP-C0M:20050237.

(56) References Cited

OTHER PUBLICATIONS

Pantos, "HTTP Live Streaming draft-pantos-http-live-streaming-02", Informational, Internet-Draft, Intended status: Informational, Expires: Apr. 8, 2010, http://tools.ietf.org/html/draft-pantos-http-live-streaming-02, pp. 1-20, Oct. 5, 2009.
Thomas Wiegand et al.,"WD1: Working Draft 1 of High-Efficiency Video Coding", JCTVC-C403, Joint Collaborative Team on Video Coding (JCT-VC), of ITU-T SG16 WP3 and ISO/IEC JTC1/SC29/WG11, 3rd Meeting: Guangzhou, CN, Oct. 7-15, 2010.
Todd, "Error Correction Coding: Mathematical Methods and Algorithms", Mathematical Methods and Algorithms, Jan. 1, 2005, pp. 451-534, Wiley, XP002618913.
Tsunoda T., et al., "Reliable Streaming Contents Delivery by Using Multiple Paths," Technical Report of The Institute of Electronics, Information and Communication Engineers, Japan, Mar. 2004, vol. 103, No. 692, pp. 187-190, NS2003-331, IN2003-286.
Wiegand et al., "WD3: Working Draft 3 of High-Efficiency Video Coding," Document JCTVC-E603, 5th Meeting: Geneva, CH, Mar. 16-23, 2011, 193 pp.
Wiegand T. et al., "WD2: Working Draft 2 of High-Efficiency Video Coding", Jan. 28, 2011, No. JCTVC-D503, Jan. 28, 2011, XP002679642, Retrieved from the Internet: URL: http://wftp3.itu.int/av-arch/jctvc-site/2011_01_D_Daegu/ [retrieved on Jul. 11, 2012].
Yamanouchi N., et al., "Internet Multimedia Transmission with Packet by Using Forward Error Correction," Proceedings of DPS Workshop, The Information Processing Society of Japan, Dec. 6, 2000, vol. 2000, No. 15, pp. 145-150.
Anonymous: "Technologies under Consideration", 100. MPEG Meeting; Apr. 30, 2012-May 4, 2012; Geneva; (Motion Picture Expert Group or ISO/IEC JTC1 /SC29/WG11), No. N12682, Jun. 7, 2012, XP030019156.
Gil A., et al., "Personalized Multimedia Touristic Services for Hybrid Broadcast/Broadband Mobile Receivers," IEEE Transactions on Consumer Electronics, 2010, vol. 56 (1), pp. 211-219, Feb. 2010.
Hannuksela M.M., et al., "DASH: Indication of Subsegments Starting with SAP", 97. MPEG Meeting; Jul. 18, 2011-Jul. 22, 2011; Torino; (Motion Picture Expert Group or ISO/IEC JTC1/SC29/WG11) No. m21096, Jul. 21, 2011, XP030049659.
Hannuksela M.M., et al., "ISOBMFF: SAP definitions and 'sidx' box", 97. MPEG Meeting; Jul. 18, 2011-Jul. 22, 2011; Torino; (Motion Picture Expert Group or ISO/IEC JTC1/SC29/WG11) No. m21435, Jul. 22, 2011, XP030049998.
Li, M., et al., "Playout Buffer and Rate Optimization for Streaming over IEEE 802.11 Wireless Networks", Aug. 2009, Worcester Polytechnic Institute, USA.
Roumy A., et al., "Unequal Erasure Protection and Object Bundle Protection with the Generalized Object Encoding Approach", Inria-00612583, Version 1, Jul. 29, 2011, 25 pages.
Stockhammer T., et al., "DASH: Improvements on Representation Access Points and related flags", 97. MPEG Meeting; Jul. 18, 2011-Jul. 22, 2011; Torino; (Motion Picture Expert Group or ISO/IEC JTC1/SC29/WG11) No. m20339, Jul. 24, 2011, XP030048903.
Supplementry European Search Report—EP08746007—Search Authority—Munich—Sep. 27, 2012.
Yamazaki M., et al., "Multilevel Block Modulation Codes Construction of Generalized DFT," Technical Report of the Institute of Electronics, Information and Communication Engineers, Jan. 24, 1997, vol. 96, No. 494, pp. 19-24, IT96-50.
Anonymous: "Technologies under Consideration", 98. MPEG Meeting; Nov. 28, 2011-Dec. 2, 2011; Geneva; (Motion Picture Expert Group or ISO/IEC JTC1/SC29/WG11) No. N12330, Dec. 3, 2011, XP030018825.
Anonymous: "Text of ISO/IEC IS 23009-1 Media Presentation Description and Segment Formats", 98. MPEG Meeting; Nov. 28, 2011-Dec. 2, 2012; Geneva; (Motion Picture Expert Group or ISO/IEC JTC1/SC29/WG11) No. N12329, Jan. 6, 2012, XP030018824.

"Digital Video Broadcasting (DVB); Framing structure, channel coding and modulation for digital terrestrial television; ETSI EN 300 744" ETSI Standards, LIS, Sophia Antipolis Cedex, France, V1.6.1, pp. 9, Jan. 10, 2009.
Kim J., et al., "Enhanced Adaptive Modulation and Coding Schemes Based on Multiple Channel Reportings for Wireless Multicast Systems", 62nd IEEE Vehicular Technology Conference, VTC-2005-Fall, Sep. 25-28, 2005, vol. 2, pp. 725-729, XP010878578, DOI: 1 0.11 09/VETECF.2005.1558019, ISBN: 978-0-7803-9152-9.
3GPP: "3rd Generation Partnership Project; Technical Specification Group Services and system Aspects; Multimedia Broadcast/Multicast Service (MBMS); Protocols and codecs (Release 6)", Sophia Antipolis, France, Jun. 1, 2005, XP002695256, Retrieved from the Internet: URL:http://www.etsi.org/deliver/etsi_ts/126300_126399/126346/06.01.00_60/ts_126346v060100p.pdf.
3rd Generation Partnership Project; Technical Specification Group Services and System Aspects; Transparent end-to-end Packet-switched Streaming Service (PSS); Progressive Download and Dynamic Adaptive Streaming over HTTP (3GP-DASH) (Release 10), 3GPP Standard; 3GPP TS 26.247, 3rd Generation Partnership Project (3GPP), Mobile Competence Centre ; 650, Route Des Lucioles ; F-06921 Sophia-Antipolis Cedex ; France, vol. SA WG4, No. V10.0.0, Jun. 17, 2011, pp. 1-94, XP050553206, [retrieved on Jun. 17, 2011].
Atis: "PTV Content on Demand Service", IIF-WT-063R44, Nov. 11, 2010, pp. 1-124, XP055045168, Retrieved from the Internet: URL:ftp://vqeg.its.bldrdoc.gov/Documents/VQEG_Atlanta_Nov10/MeetingFiles/Liaison/IIF-WT-063R44_Content_on_Demand.pdf [retrieved on Nov. 22, 2012].
Bouazizi I., et al., "Proposals for ALC/FLUTE server file format (14496-12Amd.2)", 77. MPEG Meeting; Jul. 17, 2006-Jul. 21, 2006; Klagenfurt; (Motion Pictureexpert Group or ISO/IEC JTC1/SC29/WG11), No. M13675, Jul. 12, 2006, XP030042344, ISSN: 0000-0236.
Frojdh P., et al., "Study on 14496-12:2005/PDAM2 ALU/FLUTE Server File Format", 78.MPEG Meeting; Oct. 23, 2006-Oct. 27, 2006; Hangzhou: (Motion Picturexpert Group or ISO/IEC JTC1/SC29/WG11) No. M13855, Oct. 13, 2006, XP030042523, ISSN: 0000-0233.
International Search Report and Written Opinion—PCT/US2012/053394—ISA/EPO—Feb. 6, 2013.
Luby et al., RaptorQ Forward Error Correction Scheme for Object Delivery draft-ietf-rmt-bb-fec-raptorq-00, Qualcomm, Inc. Jan. 28, 2010.
Michael G et al., "Improved low-density parity-check codes using irregular graphs", Information Theory, IEEE Transactions on, Feb. 2001, vol. 47, No. 2, pp. 585-598.
Motorola et al: "An Analysis of DCD Channel Mapping to BCAST File Delivery Sessions; OMA-CD-DCD-2007-0112-INP_DCD_Channel_Mapping_to_BCAST_File_Delivery", OMA-CD-DCD-2007-0112-INP_DCD_Channel_Mapping_to_BCAST_File_Delivery, Open Mobile Alliance (OMA), 4330 La Jolla Village Dr., Suite 110 San Diego, CA 92122; USA Oct. 2, 2007, pp. 1-13, XP064036903.
Ohashi A et al., "Low-Density Parity-Check (LDPC) Decoding of Quantized Data," Technical Report of the Institute of Electronics, Information and Communication Engineers, Aug. 23, 2002, vol. 102, No. 282, pp. 47-52, RCS2002-154.
Schulzrinne, et al., "Real Time Streaming Protocol (RTSP)" Network Working Group, Request for Comments: 2326, Apr. 1998, pp. 1-92.
Wadayama T, "Introduction to Low Density Parity Check Codes and Sum-Product Algorithm," Technical Report of the Institute of Electronics, Information and Communication Engineers, Dec. 6, 2001, vol. 101, No. 498, pp. 39-46, MR2001-83.
Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.
Makoto N., et al., "On Tuning of Blocking LU decomposition for VP2000 series" The 42th Information Processing Society of Japan Conference (1st term in 1991), Feb. 25, 1991, pp. 71-72, 4B-8.

(56) References Cited

OTHER PUBLICATIONS

Miller G., et al., "Bounds on the maximum likelihood decoding error probability of low density parity cgeck codes", Information Theory, 2000. Proceedings. IEEE International Symposium on, 2000, p. 290.
Muramatsu J., et al., "Low density parity check matrices for coding of multiple access networks", Information Theory Workshop, 2003. Proceedings. 2003 IEEE, Apr. 4, 2003, pp. 304-307.
Qualcomm Incorporated: "RaptorQ Technical Overview", pp. 1-12, Oct. 1, 2010.
Samukawa, H. "Blocked Algorithm for LU Decomposition" Journal of the Information Processing Society of Japan, Mar. 15, 1993, vol. 34, No. 3, pp. 398-408.
3GPP TSG-SA4 #57 S4-100015, IMS based PSS and MBMS User Service extensions, Jan. 19, 2010, URL: http://www.3gpp.org/ftp/tsg_sa/WG4_CODEC/TSGS4_57/docs/S4-100015.zip.
3rd Generation Partnership Project; Technical Specification Group Services and System Aspects; Transparent end-to-end Packet-switched Streaming Service (PSS);Protocols and codecs(Release 9) 3GPP TS 26.234 V9.3.0, Jun. 23, 2010 p. 85- 102, URL, http://www.3gpp.org/ftp/TSG_SA/WG4_CODEC/TSGS4_59/Docs/S4-100511.zip,26234-930.zip.
Lee, J.Y., "Description of Evaluation Experiments on ISO/IEC 23001-6, Dynamic Adaptive Streaming over HTTP", ISO/IEC JTC1/SC29/WG11MPEG2010/N11450, Jul. 31, 2010, 16 pp.
Luby M., "Simple Forward Error Correction (FEC) Schemes," draft-luby-rmt-bb-fec-supp-simple-00.txt, pp. 1-14, Jun. 2004.
Luby M., "LT Codes", Foundations of Computer Science, 2002, Proceedings, The 43rd Annual IEEE Symposium on, 2002.
Morioka S., "A Verification Methodology for Error Correction Circuits over Galois Fields", Tokyo Research Laboratory, IBM Japan Ltd, pp. 275-280, Apr. 22-23, 2002.
Moriyama, S., "5. Present Situation of Terrestrial Digital Broadcasting in Europe and USA", Journal of The Institute of Image Information and Television Engineers, Nov. 20, 1999, vol. 53, No. 11, pp. 1476-1478.
Qualcomm Incorporated: "Adaptive HTTP Streaming: Complete Proposal", 3GPP TSG-SA4 AHI Meeting S4-AHI170, Mar. 2, 2010, URL, http://www.3gpp.org/FTP/tsg_sa/WG4_CODEC/Ad-hoc_MBS/Docs_AHI/S4-AHI170.zip, S4-AH170_CR_AdaptiveHTTPStreaming-Full.doc.
Qualcomm Incorporated: "Corrections to 3GPP Adaptive HTTP Streaming", 3GPP TSG-SA4 #59 Change Request 26.234 CR0172 S4-100403, Jun. 16, 2010, URL, http://www.3gpp.org/FTP/tsg_sa/WG4_CODEC/TSGS4_59/Docs/54-100403.zip, S4-100403_CR_26234-0172-AdaptiveHTTPStreaming-Re1-9.doc.
Chikara S., et al., "Add-on Download Scheme for Multicast Content Distribution Using LT Codes", IEICE. B, Communications, Aug. 1, 2006, J89-B (8), pp. 1379-1389.
Gerard F., et al., "HTTP Streaming MPEG media—Response to CFP", 93. MPEG Meeting, Geneva Jul. 26, 2010 to Jul. 30, 2010.
Hasan M A., et al., "Architecture for a Low Complexity Rate-Adaptive Reed-Solomon Encoder", IEEE Transactions on Computers, IEEE Service Center, Los Alamitos, CA, US, vol. 44, No. 7, Jul. 1, 1995, pp. 938-942, XP000525729, ISSN: 0018-9340, DOI: 10.1109/12.392853.
Tetsuo M., et al., "Comparison of Loss Resilient Ability between Multi-Stage and Reed-Solomon Coding", Technical report of IEICE. CQ, Communication Quality, vol. 103 (178), Jul. 4, 2003, pp. 19-24.
Qualcomm Incorporated: "RatorQ Forward Error Correction Scheme for Object Delivery draft-ietf-rmt-bb-fec-raptorq-04", Internet Engineering Task Force, IETF, pp. 1-68, Aug. 24, 2010.
Watson M., et al., "Forward Error Correction (FEC) Framework draft-ietf-fecframe-framework-11," 2011, pp. 1-38, URL,http://tools.ietf.org/pdf/draft-ietf-fecframe-framework-11.pdf.
Watson M., et al., "Raptor FEC Schemes for FECFRAME draft-ietf-fecframe-raptor-04," 2010, pp. 1-21, URL,http://tools.ietf.org/pdf/draft-ietf-fecframe-raptor-04.pdf.
Ramsey B, "HTTP Status: 206 Partial Content and Range Requests," May 5, 2008 obtained at http://benramsey.com/blog/2008/05/206-partial-content-and-range-requests/.

* cited by examiner

DYNAMIC STREAM INTERLEAVING AND SUB-STREAM BASED DELIVERY

CROSS-REFERENCE TO RELATED APPLICATIONS

This application claims the benefit of U.S. Provisional Application No. 60/912,145 entitled "Dynamic Stream Interleaving and Sub-Stream Based Delivery," filed Apr. 16, 2007. The contents of this application are herein incorporated by reference in their entirety for all purposes.

The present disclosure also incorporates by reference, as if set forth in full in this document, for all purposes, the following commonly assigned applications/patents:

U.S. Pat. No. 6,307,487 to Luby (hereinafter "Luby I");

U.S. Pat. No. 7,068,729 to Shokrollahi, et al. (hereinafter "Shokrollahi I");

U.S. patent application Ser. No. 11/423,391 filed Jun. 9, 2006 and entitled "Forward Error-Correcting (FEC) Coding and Streaming" for Luby, et al. (hereinafter "Luby II"); and U.S. patent application Ser. No. 11/674,625 filed Feb. 13, 2007 entitled "Streaming and Buffering Using Variable FEC Overhead and Protection Periods" for Watson, et al. (hereinafter "Watson").

FIELD OF THE INVENTION

The present invention relates to improving streaming quality delivery, content zapping time, scalable distributed delivery of streams, and the use of FEC coding in all aspects to improve streaming solutions. Streaming comprises streaming of audio, video and data, at either constant or variable bit rate, for on-demand, play-list content or live presentation.

BACKGROUND OF THE INVENTION

Streaming media delivery is becoming more and more important as it is becoming more and more common that high quality audio and video is delivered over packet based networks, such as the Internet, cellular and wireless networks, powerline networks, and many other networks. The quality of the delivered streaming media depends on a number of factors, including the quality of the original content, the encoding quality of the original content, the capabilities of the receiving devices to decode and display the video, timeliness and quality of the signal received at the receivers, etc. To create a perceived good streaming media experience, transport and timeliness of the signal received at receivers are especially important. Good transport provides fidelity of the stream received at the receiver compared to what is sent from the sender, while timeliness represents how quickly a receiver can start playing out the content after the initial request for that content.

Recently, it has become common practice to consider using Forward Error Correction (FEC) codes for protection of streaming media during transmission. When sent over a packet network, examples of which include the Internet and wireless networks such as those standardized by groups such as 3GPP, 3GPP2 and DVB, the source stream is placed into packets as it is generated or made available, and thus the packets are used to carry the source or content stream in the order it is generated or made available to receivers.

In a typical application of FEC codes to these types of scenarios, an encoder uses FEC code in the creation of repair packets, which are then sent in addition to the original source packets containing the source stream. The repair packets have a property that, when source packet loss occurs, received repair packets can be used to recover the data contained in the lost source packets. Repair packets can be used to recover content of lost source packets that are lost entirely, but might also be used to recover from partial packet loss occurs, either entirely received repair packets or even partially received repair packets. Thus, wholly or partially received repair packets can be used to recover wholly or partially lost source packets.

In yet other examples, other types of corruption can occur to the sent data, e.g., values of bits may be flipped, and thus repair packets may be used to correct such corruption and provide as accurate as possible recovery of the source packets. In other examples, the source stream is not necessarily sent in discrete packets, but instead may be sent for example as a continuous bit-stream.

There are many examples of FEC codes that can be used to provide protection of a source stream. Reed-Solomon codes are well known codes for error and erasure correction in communication systems. For erasure correction over, for example, packet data networks, a well-known efficient implementation of Reed-Solomon codes uses Cauchy or Vandermonde matrices as described in L. Rizzo, "Effective Erasure Codes for Reliable Computer Communication Protocols", Computer Communication Review, 27(2):24-36 (April 1997) (hereinafter "Rizzo") and Bloemer, ET AL., "An XOR-Based Erasure-Resilient Coding Scheme", Technical Report TR-95-48, International Computer Science Institute, Berkeley, Calif. (1995) (hereinafter "XOR-Reed-Solomon") or elsewhere.

Other examples of FEC codes include LDPC codes, chain reaction codes such as those described in Luby I and multi-stage chain reaction codes such in Shokrollahi I.

Examples of the FEC decoding process for variants of Reed-Solomon codes are described in Rizzo and XOR-Reed-Solomon. In those examples, decoding is applied after sufficient source and repair data packets have been received. The decoding process may be computationally intensive and, depending on the CPU resources available, this may take considerable time to complete, relative to the length of time spanned by the media in the block. The receiver must take into account this length of time required for decoding when calculating the delay required between the start of reception of the media stream and play-out of the media. This delay due to decoding is perceived by the user as a delay between their request for a particular media stream and the start of playback. It is thus desirable to minimize this delay.

In many applications, packets are further subdivided into symbols on which the FEC process is applied. A packet can contain one or more symbol (or less than one symbol, but usually symbols are not split across packets). A symbol can have any size, but often the size of a symbol is at most equal to the size of the packet. Source symbols are those symbols that encode the data that is to be transmitted. Repair symbols are symbols generated from source symbols, directly or indirectly that are in addition to the source symbols (i.e., the data to be transmitted can be entirely recovered if all of the source symbols are available and none of the repair symbols are available.

Some FEC codes are block-based, in that encoding operations depend on the symbol(s) that are in a block and can be independent of the symbols not in that block. With block-based encoding, an FEC encoder can generate repair symbols for a block from the source symbols in that block, then move on to the next block and not need to refer to source symbols other than those for the current block being encoded. In a transmission, a source block comprising source symbols can be represented by an encoded block comprising encoded symbols (which might be some source symbols, some repair symbols, or both). With the presence of repair symbols, not all of the source symbols are required in every encoded block.

For some FEC codes, notably Reed-Solomon codes, the encoding and decoding time grows impractical as the number of encoded symbols per source block grows. Thus, in practice, there is often a practical upper bound (255 is an approximate practical limit for some applications) on the total number of encoded symbols that can be generated per source block, especially in a typical case where the Reed-Solomon encoding or decoding process is performed by custom hardware, e.g., the MPE-FEC processes that use Reed-Solomon codes included as part of the DVB-H standard for protecting streams against packet loss are implemented in specialized hardware within a cell phone that is limited to 255 Reed-Solomon total encoded symbols per source block. Since symbols are often required to be placed into separate packet payloads, this places a practical upper bound on the maximum length of the source block being encoded. For example, if a packet payload is limited to 1024 bytes or less and each packet carries one encoded symbol, then an encoded source block can be at most 255 KB (kilobytes), and this is also, of course, an upper bound on the size of the source block itself.

Other concerns, such as being able to decode the source blocks fast enough to keep up with the source streaming rate, to minimize the decoding latency introduced by FEC decoding, and to only use a small fraction of the available CPU on the receiving device at any point in time during FEC decoding are issues.

Other concerns include the ability to start playing out a stream, for example decoding and rendering received audio and video streams using a personal computer and displaying the video on a computer screen and playing the audio through built in speakers, or as another example decoding and rendering received audio and video streams using a set top box and displaying the video on a television display device and playing the audio through a stereo system. A primary concern is to minimize the delay between when a user decides to watch a new content delivered as a stream and when the content starts playing, hereinafter called the "content zapping time". An example of content zapping is when a user is watching a first content delivered via a first stream and then the user decides to watch a second content delivered via a second stream and initiates an action to start watching the second content. The second stream may be sent from the same set or a different set of servers as the first stream. Another example of content zapping is when a user is visiting a website and decides to start watching a first content delivered via a first stream by clicking on a link within the browser window. Another example of content zapping is when a user wants to seek to and start viewing at a new position, either forwards or backwards, within the same content stream. Minimizing content zapping time is important for video watching to allow users a high quality fast content surfing experience when searching and sampling a wide range of available contents. A high quality quick content surfing experience is often positively correlated with the amount of content that users consume.

It is often the case that a primary contributor to the content zapping time is the underlying FEC structure. Another concern is minimizing the time gap between the end of the playing of one piece of content and the start of the play of another piece of content, which is preferably consecutive with little or no pause. For example, where the one piece of content is a broadcast show and the next piece of content is an advertisement, or vice versa, a long gap (herein referred to as the "content transition time") between their play-out is undesirable.

Clearly, minimizing the content transition time is desirable, while at the same time minimizing the rate of the streaming to the receiver during the periods of time surrounding the transition.

Another concern is to maximize the quality of the delivered stream when using a best effort delivery network such as the Internet which can drop packets and which can cause wide variations in the amount of time it takes for packets to be delivered, while at the same time minimizing usage of network resources such as bandwidth.

Another concern is to provide a robust and scalable streaming delivery solution that allows components of the system to fail without adversely affecting the quality of the streams delivered to receivers.

Interleaving can be used to provide superior protection against channel imperfections such as intermittent packet loss. For example, packet loss is often somewhat bursty and thus spreading out a source block over longer periods of time can be advantageous. For some FEC codes the native use of large source blocks is practical, but for other FEC codes such as Reed-Solomon codes there are often practical limitations of the size of a source block that can be used. Thus, to spread out the transmission of packets associated with a source block over a longer interval of time it can be advantageous to interleave the sending of packets containing encoded symbols for different source blocks.

Previously, methods have been introduced which address some of the concerns expressed above. For example, some novel FEC source block formation and interleaving methods are described in Luby II. Some interleaving methods are static, in the sense that the amount of interleaving is fixed for the entire stream. Thus, there is sometimes a trade-off between the amount of interleaving, which affects the quality of the protection offered by such methods, and the content zapping time, i.e., greater amounts of interleaving provide better stream protection but longer content zapping times, and this trade-off is determined in a fixed way for the entire duration of the streaming to a receiver.

There are some methods that provide short content zapping times and greater amounts of interleaving during the majority of the stream sending process, for example some methods described in Watson. Some of the methods described in Watson dynamically transition from short initial source blocks to increasingly longer source blocks, and during the transition period send at a slightly faster rate than the content streaming rate. Such methods provide a short content zapping time while at the same time allowing for the build up of the quality of protection provided as the stream progresses. For example, one way of applying some of the methods described in Watson is to determine the source block structure and perform the FEC encoding while the stream is being sent, i.e., the short to long source block structure is determined and are FEC encoded as they are being sent at each point where they are accessed to individual receivers, and thus the source block structure formation and FEC encoding is performed uniquely for each receiver, and the stream sent to each receiver is unique. However, it is sometimes desirable to have the source block structure of the content stream determined independently of the delivery of the stream, e.g., independently of the receivers, independently of when the content is viewed and where in the content stream the viewing commences, and independent of which order the data within the stream is delivered. This is especially important if a content stream is to be delivered from multiple servers to a single receiver.

Thus, it is desirable to have improved processes and apparatus.

BRIEF SUMMARY OF THE INVENTION

Embodiments of encoders, decoders and communications system according to aspects of the present invention provide for methods of dynamically interleaving streams, including methods for dynamically introducing greater amounts of interleaving as a stream is transmitted independently of any source block structure. Some benefits of these methods are that they spread out losses or errors in the channel over a much larger period of time within the original stream than if interleaving were not introduced, they provide superior protection against packet loss or packet corruption when used with FEC coding, they provide superior protection against network jitter, and they allow content zapping time and the content transition time to be reduced to a minimum. Some additional benefits of these methods include smoothing transmitted streaming rates, including across transitions from streaming one content to another content, and minimal content transition times.

Embodiments of encoders, decoders and communications system according to aspects of the present invention also may provide for partitioning a stream of data into sub-streams, delivering the sub-streams to receivers along different paths through a network and receiving concurrently different sub-streams at a receiver sent from potentially different servers. When used in conjunction with FEC encoding, the methods include delivering portions of an encoding of each source block from potentially different servers. Some benefits of these methods include improved content zapping times, robustness to server failures and path failures, robustness to disk failures, improved robustness to loss and/or corruption of packets, improved scalability of an overall streaming delivery solution, and improved content storage and streaming rate balancing among servers.

Embodiments of encoders, decoders and communications system according to aspects of the present invention may also provide for combining dynamic interleaving with sub-stream delivery. For example, using dynamic interleaving the source block structure and the FEC encoding can be determined, the encoded stream can be partitioned into sub-streams, and combinations of sub-streams can be delivered to receivers using dynamic interleaving to provide a robust streaming delivery system that provides minimal content zapping times. The benefits of these combined methods are a combination of the benefits of dynamic interleaving and sub-stream delivery.

The following detailed description together with the accompanying drawings will provide a better understanding of the nature and advantages of the present invention.

DETAILED DESCRIPTION OF THE INVENTION

Figure 1:
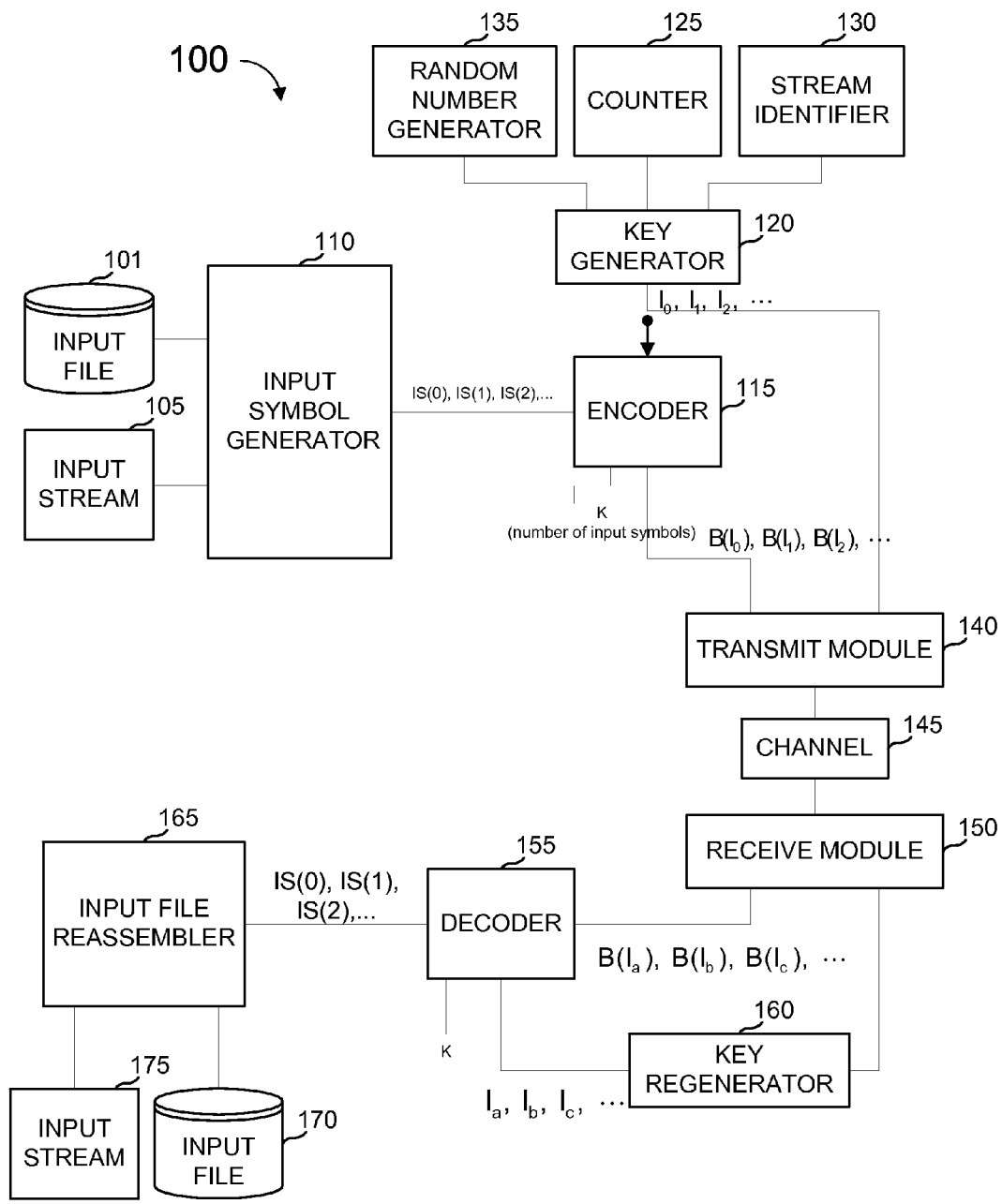
FIG. 1 is a block diagram of a communications system according to one embodiment of the present invention.

Embodiments present novel methods of dynamically interleaving streams, including methods for dynamically introducing greater amounts of interleaving as a stream is transmitted independently of any source block structure, where the transmission is over a network or the like. Embodiments also present novel methods of partitioning a stream of data into sub-streams, delivering the sub-streams to receivers along different paths through a network and receiving concurrently different sub-streams at a receiver sent from potentially different servers. When used in conjunction with FEC encoding, the methods include delivering portions of an encoding of each source block from potentially different servers. Embodiments also present novel methods of combining dynamic interleaving with sub-stream delivery.

Hereafter, the network carrying data is assumed to be packet-based in order to simplify the descriptions herein, with the recognition that one skilled in the art can easily see how the processes and methods described herein can be applied to other types of transmission networks such as continuous bit-stream networks. Hereafter the FEC codes are assumed to provide protection against lost packets or lost partial data within packets in order to simplify the descriptions herein, with the recognition that one skilled in the art can easily see how the processes and methods described herein can be applied to other types of data transmission corruption such as bit-flips. In this description, assume that the data to be encoded (source data) has been broken into equal length "symbols", which can be of any length (down to a single bit), but that could be of different lengths for different parts of the data.

Symbols can be carried over the data network in packets, with a whole number of symbols explicitly carried or implied in each packet. In some cases, it is possible that a source packet is not a multiple of the symbol length, in which case the last symbol in the packet may be truncated. In this case, for the purposes of FEC coding, this last symbol is implicitly assumed to be padded out with a fixed pattern of bits, e.g., zero-valued bits, so that even though these bits are not carried in the packet the receiver can still fill this last truncated symbol out to a full symbol. In other embodiments, the fixed pattern of bits can be placed into the packet, thereby effectively padding the symbols to a length equal to that of the packet. The size of a symbol can often be measured in bits, where a symbol has the size of M bits and the symbol is selected from an alphabet of 2^M (two to the power of M) symbols. Nonbinary digits are also contemplated, but binary bits are preferred as they are more commonly used.

The FEC codes considered for use with streaming are typically systematic FEC codes, i.e., the source symbols of the source block are included as part of the encoding of the source block and thus the source symbols are transmitted. As one skilled in the art will recognize, the methods and processes described herein apply equally well to FEC codes that are not systematic. A systematic FEC encoder generates, from a source block of source symbols, some number of repair symbols and the combination of at least some of the source and repair symbols are the encoded symbols that are sent over the channel representing the source block. Some FEC codes are useful for efficiently generating as many repair symbols as needed, such as "information additive codes" or "fountain codes" and examples of these codes include "chain reaction codes" and "multi-stage chain reaction codes". Other FEC codes such, as Reed-Solomon codes can practically only generate a limited number of repair symbols for each source block.

There are many other methods for carrying symbols, and although the description below uses the method of packets for simplicity, it is not meant to be limiting or comprehensive. In the context of the description below, the term "packet" is not meant to be constrained to mean literally what is sent as a single unit of data. Instead, it is meant to include the broader notion of defining a logical grouping of symbols and partial symbols that may or may not be sent as a single unit of data.

There are also forms of corruption of data other than loss of symbols, e.g., symbols that in transmission change their value or are corrupted in other ways, to which the methods described below apply equally. Thus, although the descriptions below will often describe the loss of symbols, the methods apply equally well to other types of corruption and to other types of FEC codes beyond FEC erasure codes, such as FEC error-correcting codes.

An FEC Code Example

FIG. 1 is a block diagram of a communications system 100 that uses chain reaction FEC coding. In communications system 100, an input file 101, or an input stream 105, is provided to an input symbol generator 110. Input symbol generator 110 generates a sequence of one or more input symbols (IS(O), IS(1), IS(2), . . . ) from the input file or stream, with each input symbol having a value and a position (denoted in FIG. 1 as a parenthesized integer). The possible values for input symbols, i.e., its alphabet, is typically an alphabet of two million symbols, so that each input symbol codes for M bits of the input file. The value of M is generally determined by the use of communication system 100, but a general purpose system might include a symbol size input for input symbol generator 110 so that M can be varied from use to use. The output of input symbol generator 110 is provided to an encoder 115.

Key generator 120 generates a key for each output symbol to be generated by the encoder 115. Each key can be generated according to one of the methods described in Luby I or in Shokrollahi I, or any comparable method that insures that a large fraction of the keys generated for the same input file or block of data in a stream are unique, whether they are generated by this or another key generator. For example, key generator 120 may use a combination of the output of a counter 125, a unique stream identifier 130, and/or the output of a random generator 135 to produce each key. The output of key generator 120 is provided to encoder 115. In other examples, for example some streaming applications, the set of keys may be fixed and reused again for each block of data in a stream. In a typical embodiment, the number of keys that can be generated is dictated by a resolution of a key generator rather than the size or other characteristic of the input file or stream. For example, if the input is expected to be on the order often thousand symbols or less, a key resolution might be 32-bits, allowing for up to 4 billion unique keys. One result of these relative numbers is that an encoder that encodes according to the keys might be capable of generating 4 billion unique output symbols for four thousand symbols of input. As a practical matter, most communication systems will not lose a 0.999999 fraction of the symbols, so nowhere near 4 billion output symbols will need to be generated and therefore, the number of possible keys can be treated as being effectively unlimited and would not have to be repeated and the probability of two independent selections of keys would grab the same key is vanishingly small. However, if that were the case for some reason, the resolution of the key generator can be increased so that the processes that use the keys can behave as if there were an endless supply of keys.

From each key I provided by key generator 120, encoder 115 generates an output symbol, with a value B(I), from the input symbols provided by the input symbol generator.

The value of each output symbol is generated based on its key and on some function of one or more of the input symbols, referred to herein as the output symbol's "associated input symbols" or just its "associates". Typically, but not always, M is the same for input symbols and output symbols, i.e., they both code for the same number of bits. In some embodiments, the number K of input symbols is used by the encoder to select the associates. If K is not known in advance, such as where the input is a stream and K can vary between each block in the stream, K can be just an estimate. The value K might also be used by encoder 115 to allocate storage for input symbols.

Encoder 115 provides output symbols to a transmit module 140 and key generator 120 provides the key of each such output symbol to transmit module 140. Transmit module 140 transmits the output symbols, and depending on the keying method used, transmit module 140 might also transmit some data about the keys of the transmitted output symbols, over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The value of K, if used to determine the associates, can be sent over channel 145, or it may be set ahead of time by agreement of encoder 115 and decoder 155.

Channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Where channel 145 comprises a packet network, communications system 100 might not be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbols to a decoder 155, and any data receive module 150 receives about the keys of these output symbols is provided to a key regenerator 160. Key regenerator 160 regenerates the keys for the received output symbols and provides these keys to decoder 155. Decoder 155 uses the keys provided by key regenerator 160 together with the corresponding output symbols, to recover the input symbols (again IS(O), IS(1), IS(2), . . . ). Decoder 155 provides the recovered input symbols to an input file reassembler 165, which generates a copy 170 of input file 101 or a copy 175 of input stream 105.

Media Streaming Applications

When used in media streaming applications, source packets forming the source media stream are sometimes collected in groups called source blocks. For example a source block could be a group of source packets spanning a fixed length of time, and for example a Reed-Solomon erasure code could be applied independently to these source blocks to generate repair packets that are sent, together with the original source packets of the source block, to receivers.

At the sender, the source stream can be continuously partitioned into source blocks as source packets arrive, and repair packets are generated for each source block and sent. It is sometimes preferable to minimize the total end-to-end delay added by the use of FEC codes, especially for live or interactive streaming applications, and thus it is sometimes preferable if the overall design of the FEC solution is such that source packets are delayed as little as possible at the sender before being sent, and all source and repair packets for a source block are sent with as little total delay as possible. It is also preferable if the rate of the FEC encoded stream is as smooth as possible, i.e., there is as little variability as possible in the FEC encoded stream rate or at least there is no amplification of any variability that already exists in the original source stream, because this makes the FEC encoded stream bandwidth usage more predictable and minimizes the impact on the network and on other possibly competing streams. It is also preferable if the data sent in packets for a source block is spread as uniformly as possible over the period when packets are sent for that source block, since this provides the best protection against burst losses. It is also preferable that source blocks are constructed in such a way so as to minimize content zapping time and content transition time. It is also preferable that the logic at the receiver be as simple as possible.

At the receiver, if packets are lost or received with errors (which can be detected and discarded, for example, using CRC checks), then, assuming sufficient repair packets have been received, the repair packets may be used to recover the lost source packets.

In some applications, packets are further sub-divided into symbols on which the FEC process is applied. For some FEC codes, notably Reed-Solomon codes, the encoding and decoding time grows impractical as the number of encoded symbols per source block grows and there is often an upper bound on the total number of encoded symbols that can be generated per source block. Since symbols are placed into different packet payloads, this places a practical upper bound on the maximum length on the encoding of a source block and also, of course, places an upper bound on the size of the source block itself.

For many applications, when protection is to be provided over a long period of time or when the media streaming rate is high, it can be advantageous to provide protection over data that exceeds the maximum source block size. In these cases, using source blocks that are shorter than the maximum source block size and then interleaving the source packets from different source blocks provides a solution where the source packets from an individual source block sent are spread out over larger periods of time. For other applications, when short content zapping time is desirable and when the source block structure is determined independently of the interleaving methods, it is desirable to use shorter source blocks and send them sequentially initially when the content is accessed by a receiver and then to increase the interleaving amount as the content streaming continues in order to spread the sending of the source blocks over longer intervals of time to increase the level of protection against bursty loss.

Another concern is to be able to decode the source blocks fast enough to keep up with the source streaming rate, to minimize the decoding latency introduced by FEC decoding, and to only use a small fraction of the available CPU on the receiving device at any point in time during FEC decoding. Thus, it is desirable to use a source block interleaving that allows the FEC decoding of each source block to be spread out as equally as possible over time and minimizes FEC decoding latency.

Various embodiments described herein provide one or more of these advantages.

Streaming and FEC Codes

For the purposes of providing FEC protection of a source stream, the source stream may be a combination of one or more logical streams, examples of which are a combination of an audio RTP stream and a video RTP stream, a combination of a MIKEY stream and an RTP stream, a combination of two or more video streams, and a combination of control RTCP traffic and an RTP stream. As the source stream arrives at the sender, in a format that for example is a source bit stream, a source symbol stream, or a source packet stream, the sender may buffer the stream into source blocks and generate a repair stream from the source blocks. The sender can schedule and send the source stream and the repair stream, for example, in packets to be sent over a packet network. The FEC encoded stream is the combined source and repair stream. The FEC receiver receives the FEC encoded stream, which may have been corrupted, for example, due to losses or bit-flips. The FEC receiver attempts to reconstruct the original source blocks of the source stream and schedules and makes available the original source stream at the receiver.

For many applications, the source block structure is determined in conjunction with the structure of the underlying streams, e.g., the GOP structure and/or frame structure of an H.264AVC video stream. For some of these applications, the source block structure is determined prior to and/or independently of the stream sending order of the packets, wherein the stream sending order of the packets may depend on when and where the stream is accessed by receivers in order to receive the stream. For such applications, it is preferable that the source block structure is determined in such a way that each source block comprises a consecutive set of source packets from the stream, in order to allow the minimization of content zapping time and content transition time.

For some applications, the source block structure formation and FEC encoding of the stream is preferably performed prior to the sending of a stream. One reason for this is that a stream may be sent to many receivers, and thus the source block structure formation and the FEC encoding is done once for all the receivers, which provides some scalability benefits.

For a streaming application, there are several key parameters that are inputs to the design of how to use FEC codes to protect the source stream and several key metrics that are typically of importance to optimize.

One possible key input parameter in the design of a source block structure is the source block duration. The source block duration for a source block can be defined as the duration of time over which symbols generated from that source block would be sent if the source blocks were sent sequentially, i.e., not interleaved, and if they were sent at a normal speed, i.e., at essentially the normal play-out speed. Alternatively, the source block duration can be defined to be the play-out time of the video represented by the source block. In some cases these two definitions coincide, but they may not coincide. However, for simplicity in the descriptions herein, we use source block duration without specifying which definition is meant, making the simplifying assumption that the two definitions coincide. One skilled in the art will recognize that the methods and processes described herein pertain to either definition of source block duration, even if the two definitions do not coincide, and even in some cases the source block may be sent much faster than its play-out rate. Furthermore, one skilled in the art will recognize that there are other ways of specifying the size or play-out time of a source block, e.g., by specifying the number of symbols in the source block and the symbol size for a source block.

The protection period for a source block is the period of time over which the source block is sent, whether or not the source block sending interleaves sending of packets from some source blocks with sending of packets from other source blocks. Note that the protection period is generally equal to the source block duration if no source block interleaving is used, but the protection period can be longer than and sometimes substantially longer than the source block duration when interleaving is used.

The protection amount for a source block is the number of FEC repair symbols sent for the source block, expressed as a fraction or a percentage of the number of source symbols in the source block. For example, if the protection amount is 20% and there are 10,000 source symbols in the source block then there are 2,000 repair symbols generated from the source block. The protection amount is a relative concept, i.e., the protection amount for the same source block may vary depending on where the source block is being sent from and where the source block is being sent to. For example, a source block may be sent from a first server to another server with a protection amount of 50%, whereas the same source block may be sent from the second server to a receiver with a protection amount of 10%.

Both the source block duration and the protection amount per source block can vary from one source block to the next. For example, when a source block preferably does not span between certain source packets in a source stream, e.g., when a first packet is the last packet of a Group of Pictures (GOP) in a MPEG2 video stream and a second consecutive packet is the first packet of a next GOP, then a source block might be terminated after the first packet and a new source block started at the second packet. This allows the FEC encoded block to be aligned with the video coding block, which can have many advantages, including the advantage that receiver latency or channel zapping time can be minimized due to the possibility of minimizing the combination of video buffering and FEC buffering at the receiver. In other applications, it can be advantageous for a variety of reasons to always maintain the same source block duration and/or source block size for each consecutive source block. In some of the descriptions below for simplicity both the source block duration and protection amount are assumed to be the same for each subsequent source block. For those skilled in the art, it should be clear after reading this disclosure that this is not limiting, as one can easily determine upon reading this disclosure how the processes and methods described herein also apply when either the protection amount or source block duration or both vary from one source block to the next, and when source block sizes vary from one to the next.

To simplify some of the subsequent discussions, it is sometimes assumed that source symbols of the original stream arrive at a steady rate at a sender that is to perform source block formation and FEC encoding, and that once the FEC receiver first makes source symbols available at the receiver, then subsequent source symbols are made available by the FEC receiver at the same steady rate, assuming that in the first source block from which a source symbol is received there is no source symbol loss and that in each subsequent source block the encoded symbol loss is at most the maximum possible to allow successful FEC decoding. This simplifying assumption is not inherent in the operation or design of the processes and methods described subsequently and is not meant to be limiting these processes to this assumption in any way, but is introduced merely as a tool to simplify some of the descriptions of the properties of the processes and methods. For example, for variable rate streams the corresponding condition is that the source symbols are made available by the FEC receiver at the same or close to the same rate as they arrive at the sender. In some applications, it is preferable to deliver decoded source symbols at a receiver to a video player as soon as possible in order to minimize content zapping time, and in such cases the source symbols may be delivered in bursts of source blocks. In some applications, it is desirable to separate source block formation, FEC encoding and sending steps into two or more different steps. For example, as described later, the source block formation and FEC encoding may be performed in one server and the encoded stream is then partitioned into sub-streams and then the sub-streams are sent to one or more distributed servers and cached locally, and then some or all of the sub-streams are sent to a receiver from some of the one or more distributed servers.

Some key metrics of importance to minimize include the sender latency, which is the latency introduced by the sender. Minimizing the sender latency is desirable for some applications such as live video streaming or interactive applications such as video conferencing. One aspect of an overall design that helps to minimize the sender latency is for the sender to send encoded symbols for the initial source block or blocks for a stream to a receiver in consecutive order. Other design aspects that minimize the sender latency are described later.

Figure 2:
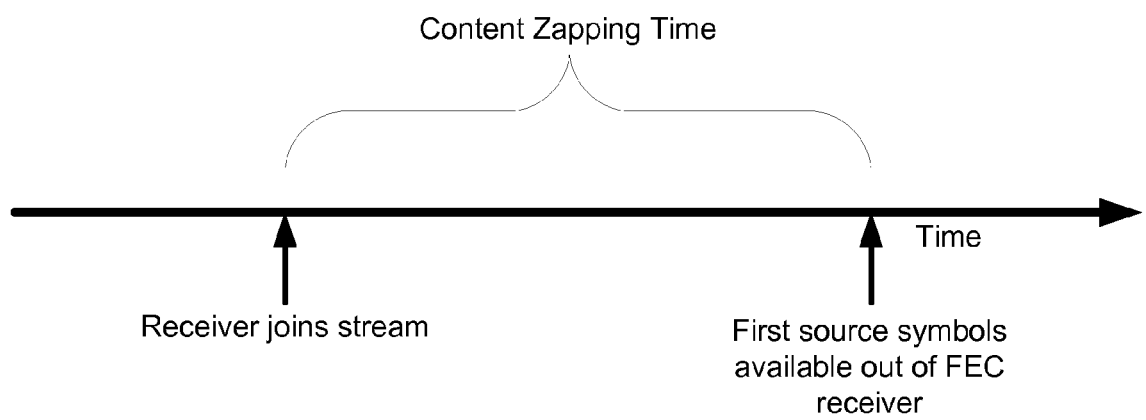
FIG. 2 is a diagram illustrating content zapping time.

Another important metric is the content zapping time. As shown in FIG. 2, this is the time between when the receiver joins or requests the stream until the time when the FEC receiver first makes available source symbols from the stream. In general, it is desirable to minimize the content zapping time, since this minimizes the amount of time between when a stream is joined by a receiver and when the stream first starts becoming available at the receiver, for example for playback of a video stream. One important aspect of minimizing the content zapping time is for the sender to maintain the original sending order of the encoded symbols for initial source blocks, but as described below, there are many other important design aspects that have a large impact on the content zapping time.

Figure 3A:
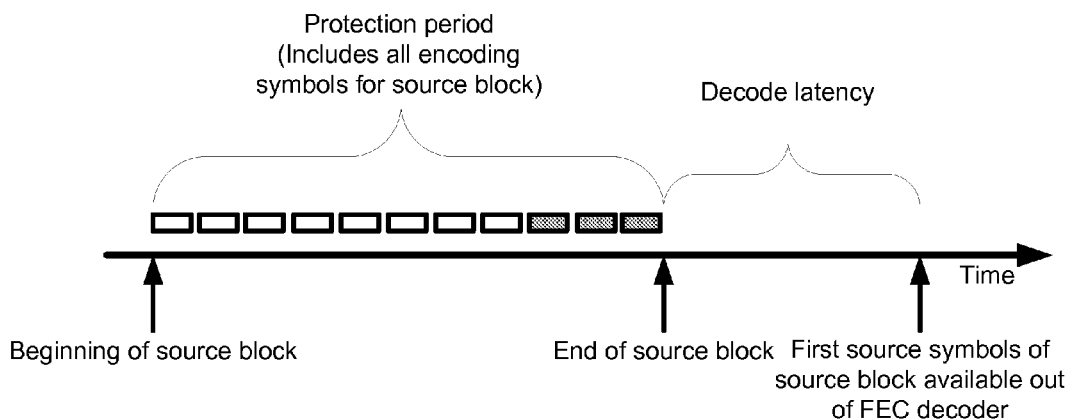
FIG. 3A is a drawing exemplifying components of content zapping time.
Figure 3B:
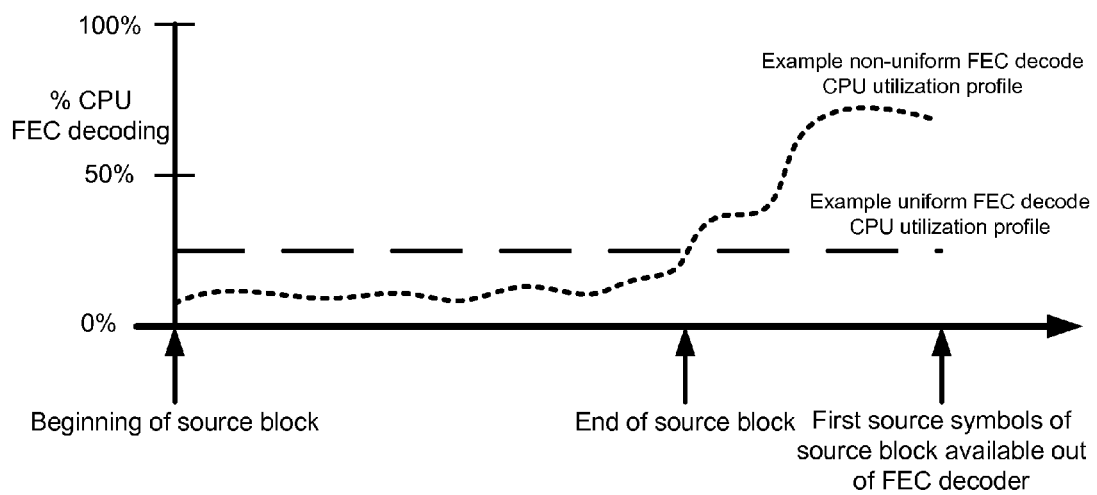
FIG. 3B is a drawing exemplifying CPU utilization for FEC during decoding.

The content zapping time typically comprises multiple components. An example of these components for a stream that is partitioned into sequential source blocks is shown in FIGS. 3A and 3B where interleaving is not used. FIG. 3A shows a single source block per protection period, and the example shows the case where the receiver joins the stream at the beginning of the source block. The two components of the content zapping time in this example are the protection period and the FEC decode latency. The receiver protection period for a source block is the time during which the receiver is buffering received encoded symbols from a source block. Note that the sender protection period and the receiver protection period are the same if the channel between the sender and receiver does not have any variation in terms of the amount of time it takes each bit, byte, symbol or packet to travel from the sender to the receiver. Thus, in practice the sender protection period may differ from the receiver protection period for the same source block due to network timing variations in delivery.

To simplify the illustrations here, the sender protection period and the receiver protection period are assumed to be the same for each source block (and "protection period" is used synonymously for the sender protection period and the receiver protection period), but that need not be the case always. In other words, there is an assumption that the network delivery time is the same for all data. One of ordinary skill in the art can, after reading this disclosure, make the necessary changes to the methods and apparatus described herein to take into account differences in sender and receiver protection periods due to network delivery fluctuations.

The protection period component of the content zapping time is inevitable, because even if in the first source block there is no loss of any source symbols, one still has to delay making the source symbols available for at least the protection period in order to ensure smooth source symbol delivery of all subsequent source symbols when there is loss of encoded symbols in subsequent source blocks. During the protection period some or most or all of the FEC decoding of the source block can be occurring concurrently with the reception of encoded symbols. At the end of the protection period, there may be additional FEC decoding that occurs before the first source symbol of the source block is available from the FEC receiver, and this period of time is labeled as the FEC decode latency in FIG. 3A. In addition, even after the first source symbol is available there may be additional FEC decoding that occurs before the second and subsequent source symbols of the source block are available. For simplicity, this additional FEC decoding is not shown in FIG. 3A, and it is assumed in this example that there are sufficient available CPU resources to decode all source symbols after the first at a fast enough rate.

Another possible component of content zapping time can be the time between when a receiver requests to join a stream and when the first packets for that stream arrive at the receiver. This amount of time can be variable and depend on the round-trip time(s) between the receiver and the one or more senders of packets for the stream. This component of content zapping time is not described in detail herein, but one skilled in the art will recognize that sometimes this can be an important contributor to the content zapping time that should be taken into account and that the methods and processes described herein can be easily modified to take into account this potential contributor to the content zapping time.

FIG. 3B shows two potential FEC decoding CPU utilization curves that could correspond to the example shown in FIG. 3A. In one of the two curves shown in FIG. 3B, the CPU utilization used for FEC decoding is the same at each point in time, i.e., the CPU utilization is uniformly distributed. This is a desirable CPU utilization curve, since it predictably uses the same amount of CPU resources at each point in time, and minimizes the maximum CPU resources assuming that the same amount of total CPU resources are needed to decode the entire source block. In the other of the two curves shown in FIG. 3B, the CPU utilization used for FEC decoding is not the same at each point in time, and in particular the CPU utilization towards and just after the end of the reception of the encoded symbols for the source block is significantly higher than at other points in time. This is not a desirable CPU utilization curve, since the CPU resource usage spikes at certain points in time that might be the points in time when other processes, such as a video player, are also placing demands on the CPU, and thus raising the possibility of causing, for example, a glitch in the playback of a video stream. Thus, the design of an FEC solution for protecting streams is to provide a solution where the FEC decoder uses the CPU as smoothly and uniformly over time as possible. As an example, the design criteria might be that the maximum CPU utilization at any point in time in the FEC decoding process under the worst case pattern of encoded symbol loss is below a certain threshold, e.g., uses at most 10% of the CPU over each interval of 100 milliseconds.

In some streaming applications, when the receiver happens to join the stream in the middle of a source block then the content zapping time can be as small as the source block duration plus the decode latency when there is no loss of source symbols from that first partial source block as long as the original sending order and delivery speed of the source packets is initially maintained by the sender. In other video streaming applications, the sender always starts sending a stream to a receiver from the beginning of a GOP, where preferably the beginning of a source block is aligned with the beginning of the GOP. Thus, in order to minimize content zapping delay it is desirable for the sender to maintain the original sending order of the source symbols for the initial source blocks.

An FEC streaming solution can also be used to minimize the FEC end-to-end latency, which for a live streaming application is the worst-case overall latency introduced by the use of FEC between when a source packet is ready for streaming at the sender before FEC encoding is applied and when it is available for playback at the receiver after FEC decoding has been applied. For other types of streaming applications, such as on-demand streaming or play-list content streaming, the FEC end-to-end latency is not a major concern.

In streaming applications of all types, it is important to minimize content zapping time and content transition time. At the same time, it is important to minimize the sending rate of the stream, i.e., to constrain the sending rate at all times to be a small fraction above the content streaming rate, including during content zapping and content transitions.

An FEC streaming solution can also be used to minimize fluctuations in the sending rate when FEC is used. One benefit of this is that, within packet networks, streams with a fluctuating sending rate are more susceptible to packet loss due to congestion or buffer overflow when peaks in the sending rate of the stream coincide with peaks in other traffic at points in the network with limited capacity. At a minimum, the fluctuations in the rate of the FEC encoded stream should be no worse than the fluctuations in the rate of original source stream, and preferably as more FEC protection is applied to the original source stream the fluctuations in the rate of the FEC encoded stream become smaller. As a special case, if the original stream sends at a constant rate, then it is preferable that the FEC encoded stream is sent at a rate that is as close as possible to a constant.

The property that the time when the last encoded symbol for each subsequent source block is received is as uniformly spread out over time as possible is a desirable property. The time when the last encoded symbol is received for a source block is a time when all information for decoding the source block is available to the FEC decoder, and this is typically the time when under worst case loss conditions that the FEC decoder has to work hardest to finish off decoding within the prescribed decoding latency budget. Thus, uniformly spreading out the reception of the last encoded symbol for the source blocks allows smoother use of the CPU for FEC decoding.

An FEC streaming solution should provide as simple logic as possible at the FEC receiver. This is important in many contexts because the FEC receiver may be built into a device with limited computational, memory and other resource capabilities. Furthermore, in some cases there may be significant loss or corruption of symbols in transmission, and thus the FEC receiver may have to recover from catastrophic loss or corruption scenarios where when conditions improve there is little or no context to understand where in the stream reception is continuing from. Thus, the simpler and more robust the FEC receiver logic the more quickly and reliably the FEC receiver will be able to start recovering and making available again the source symbols of the source stream from reception of the FEC encoded stream.

The repair packets for a source block can be sent either before, after or intermixed with the source packets for the source block, and as explained herein there are advantages to different strategies.

Some of the overall desirable features of an FEC streaming solution include:

1. Short content zapping time.
2. Short content transition time.
3. Sending stream rate at all times should be constrained, i.e., to a small fraction above the content stream rate.
4. The sending stream rate should be smooth, and should be at least as smooth as the content stream rate.
5. When FEC coding is used, source block formation and FEC encoding can be performed for a stream and the same encoded stream can be sent at possibly different times to many receivers.
6. When FEC coding is used, protection against packet loss should be high using small source block durations with minimal protection amounts needed, especially when the losses are somewhat bursty in nature.
7. When FEC coding is used, source blocks should comprise contiguous portions of a stream.
8. When FEC coding for live streaming applications the FEC end-to-end latency should be small.
9. When FEC coding is used, FEC decoding should spread out CPU utilization smoothly.

Basic Sending of an FEC Encoded Stream

In this section, we describe basic methods and processes for the sender to time the sending of packets of a stream, which may be FEC encoded. Let k be the number of source symbols in a source block, let T be the source block duration for the source block, let p be the protection amount expressed as a fraction, and thus p*k repair symbols will be sent for the source block. The values of k, T and p may be determined dynamically as each source block is being formed, and thus the values of k and T for a source block may only be known to the source block formation process when most or all of the source symbols for that source block have arrived to the process, and the value of p may be determined after all the source symbols for the source block have arrived at the source block formation process or by a separate process. Also, the source block formation process may vary the symbol size for different source blocks. Thus, many or all of these parameters for a particular source block may be known to the source block formation process well into the reception of data for that source block.

The following process describes a basic sender that uses no interleaving. For simplicity, it is assumed for this basic sender that the source block formation process has already been applied to the stream, and that it has been partitioned into consecutive source blocks, each such source block comprising k source symbols and with a source block duration of T seconds, and that for each such source block p*k repair symbols have already been generated.

When a receiver requests the stream starting at a particular source block (or is proactively sent the stream with an explicit start request from a receiver), the basic sender starts sending the (1+p)*k encoded symbols for the requested source block over a period of T seconds, and then subsequently sends the encoded symbols for the next source block after the requested source block, etc.

The basic sender has the following properties:

1. The protection period is T, which is the same as the source block duration.
2. The symbols sent for the source block are spread out evenly over a period of T seconds. This implies that the level of protection provided against loss when there is a burst outage of a fixed duration does not depend on when the outage occurs during transmission of the symbols, which is desirable.
3. The sender does not introduce fluctuations in the overall sending rate of symbols. In particular, if the original sending rate of source symbols is constant then the sending rate of all symbols is still constant, and if the original arrival rate of source symbols at the sender is variable then at least the constant sending rate of symbols per source block dampens fluctuations. This is a desirable property.
4. The content zapping time can be as little as T. This implies minimal buffering of (1+p)*k symbols (assuming that all source blocks comprise k source symbols), which is the minimal possible for the given protection period and is thus desirable.

One property that the basic sender has is that content zapping time is at least the time for a protection period, and the protection period is directly related to the quality of the protection against bursty losses. Thus, there is sometimes a compromise that needs to be made between the protection period and the content zapping time. For example, it is desirable to have content zapping times under one second, whereas it is also desirable to have protection periods that span several seconds in order to provide better protection against temporary network outages or other types of intermittent network issues that cause burst packet loss that can last on the order of tens or hundreds of milliseconds, and in some cases seconds, while at the same time using a reasonably small protection amount such as 10%. It would be desirable to be able to have a protection period that is much larger than the content zapping time, and that is one of many advantages that the interleaving methods described in the next section provide.

Stream Interleaving

This section describes novel methods and processes for taking a stream of data and applying differential time delays to different parts of the data stream in a way that some parts are delayed in the sending process more than other parts. One of the more important aspects of these methods and processes is a means for dynamically adjusting the amounts of delay induced in different parts of the stream as the data stream is sent.

It is often preferable to align source blocks with the Group of Pictures (GOP) structure or other frame structure of a video stream in order to minimize content zapping time and to provide better protection of the stream. In some applications it is desirable that the interleaving process can occur independently of the source block formation process, perhaps performed at a different time or perhaps performed at a different location. In some cases perhaps an interleaving process is desirable for example to spread bursty errors more evenly through the stream, even though a source block formation process is not used, for example because no FEC encoding is used. The methods described herein apply even when source block formation and FEC encoding is not used, as one skilled in the art will recognize.

In some cases, there may be benefits for allowing the sender to interleave the sending of symbols from different source blocks so that the symbols for each source block can be spread out over a longer protection period than the source block duration. One reason for doing this is that better protection is provided against time-dependent losses (e.g., bursty loss), i.e., a smaller protection amount is needed to provide protection against a burst loss of a fixed duration as the protection period for a source block grows. While the source block duration may be t seconds, the desired protection period for the source block may be p seconds, where p>>t. Other desirable properties of a sender that uses interleaving include (1) source packets are sent in their original order within a source block, and (2) the time when the last encoded symbol for each subsequent source block is received is as uniformly spread out over time as possible.

When FEC coding is used, methods are introduced that statically interleave sending of encoded symbols for source blocks and methods are introduced that dynamically adjust the amount of interleaving as the stream is sent, typically with little or no interleaving at the start of sending of a stream and thus protection periods approximately the same as the source block durations, and smoothly introducing more and more interleaving as the sending of the stream progresses and thus protection periods grow to be much longer than source block durations. This allows content zapping time to be minimized at the receiver while at the same time more and more protection against bursty losses or corruption as the sending progresses. Another advantage of the methods described is the ability to gradually protect against more and more network jitter as the sending of a stream progresses.

To simplify the descriptions below, it is assumed that the source block formation and FEC encoding process occur prior to the sending of a stream. This is not a limitation of the methods, as one skilled in the art will recognize that processes of forming source blocks and performing FEC encoding on these source blocks and sending streams as described below can operate concurrently, and in some cases this is advantageous. Furthermore, for some applications the source block formation, FEC encoding process and methods described below for interleaved sending of streams may be dynamically interdependent, i.e., how the source blocks are formed and FEC encoded may depend in some cases on the sending stream strategy.

Tape Method of Stream Sending

Figure 4:
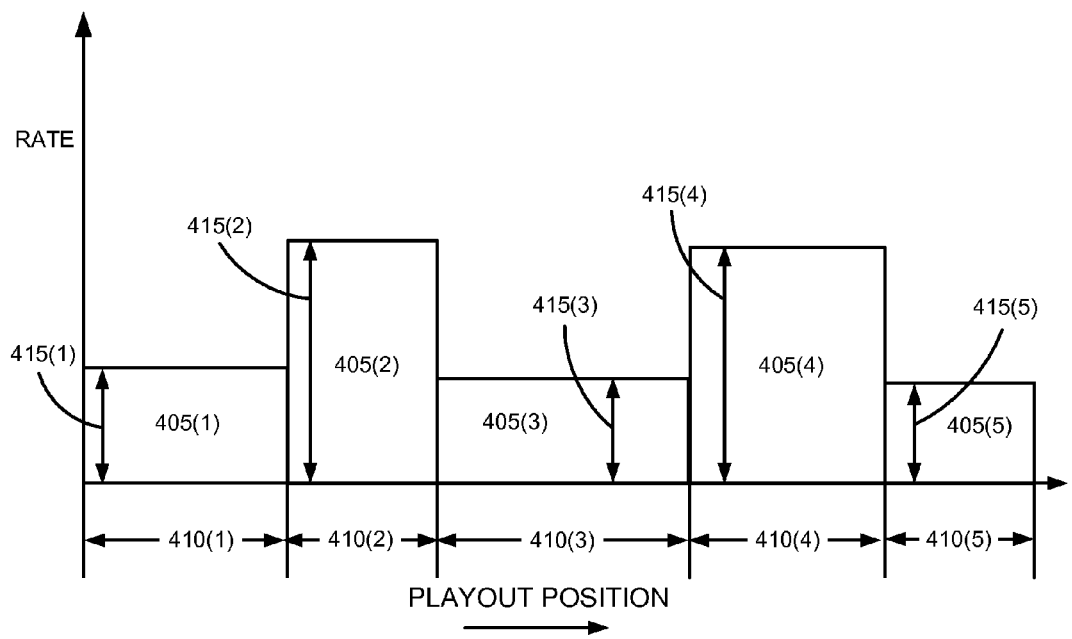
FIG. 4 is a drawing exemplifying a source block structure of a content stream, and a representation of the corresponding content stream rate for each source block.

In order to describe the new interleaving methods, it is useful to introduce the following tape method of stream sending. FIG. 4 is an illustrative drawing of a content stream for which the source block structure has already been determined. For each source block 405(1), 405(2), . . . , the width 410(1), 410(2), . . . , shows the content play-out duration of that source block, and the height of each source block 415(1), 415(2), shows the average play-out rate of each content stream source block, where in this example the different source blocks have different play-out rates.

Figure 5:
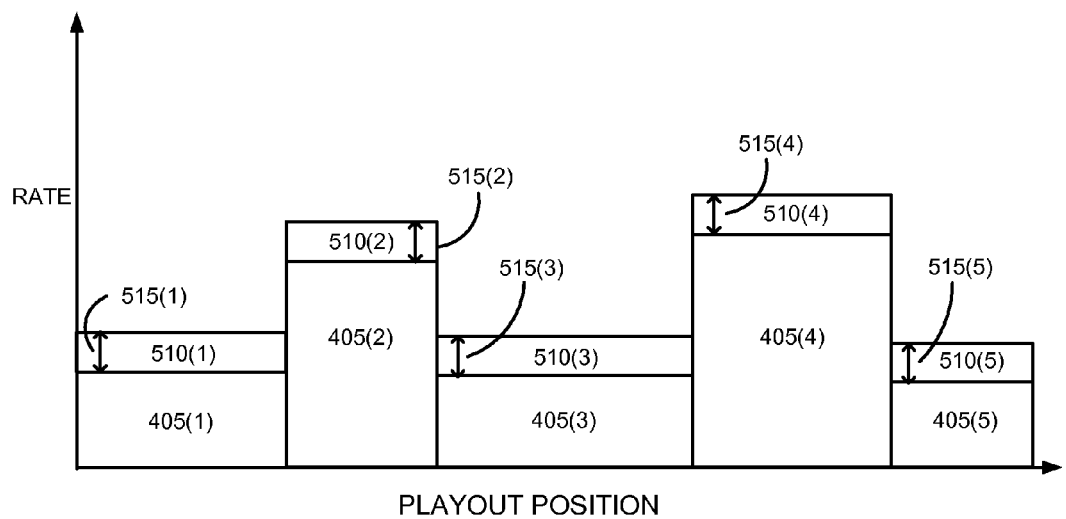
FIG. 5 is a drawing exemplifying an encoded block structure corresponding to the content stream of FIG. 4.

FIG. 5 shows a corresponding encoded block structure corresponding to FIG. 4, i.e., FEC encoding has been applied to each source block to generate additional repair data 510(1), 510(2), . . . , for each source block to form encoded blocks. The height 515(1), 515(2), . . . , of 510(1), 510(2), . . . , indicates the amount of additional repair data generated for each source block in each encoded block, i.e., if the encoded block is sent over the same duration of time as the corresponding source block then the height indicates the average sending rate of the encoded source block. This drawing is only illustrative and not limiting, as for example the amount of repair data generated for each encoded block may be much larger than the amount sent for each encoded block, and the amount sent for each encoded block may vary from receiver to receiver. Furthermore, FIG. 5 is not meant to suggest a representation of the ordering of the source and repair symbols within an encoded source block.

Figure 6:
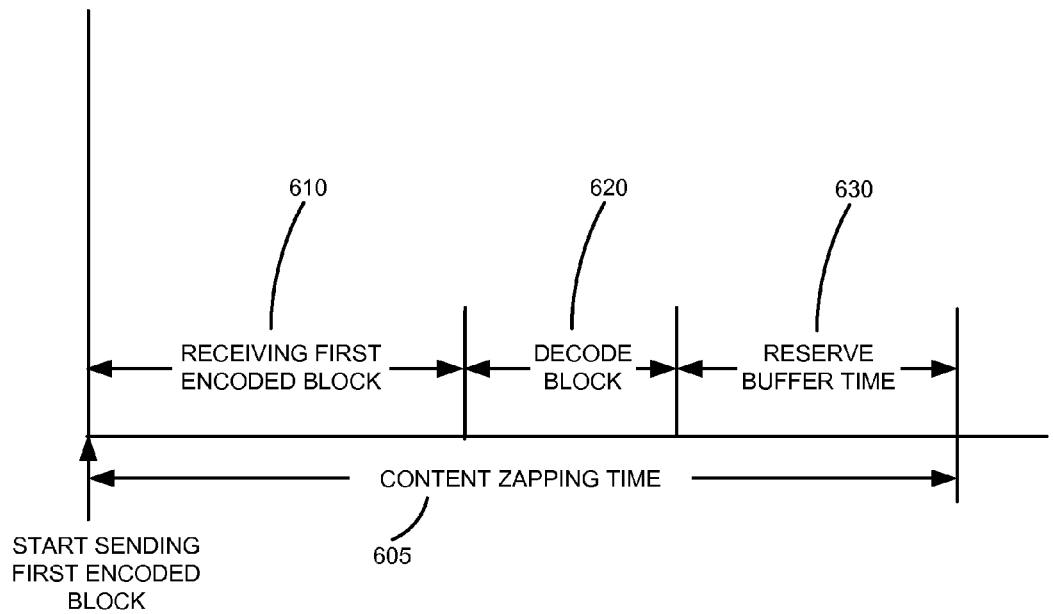
FIG. 6 is a drawing exemplifying a receiver and the content zapping time corresponding to a basic sender method.

FIG. 6 is an illustrative drawing showing the content zapping time experience by a receiver corresponding to a basic sender method. Some of the components of the content zapping time 605 comprise the time 610 it would take for the receiver to receive enough of the first encoded block of the stream to decode the first source block, the time it takes the receiver to decode first source block from the received parts of the first encoded block 620, and reserve buffer time 630 reserved for absorbing network jitter, variations in source block durations, and decode times of source blocks from parts of received encoded blocks during the reception of the stream.

Figure 7:
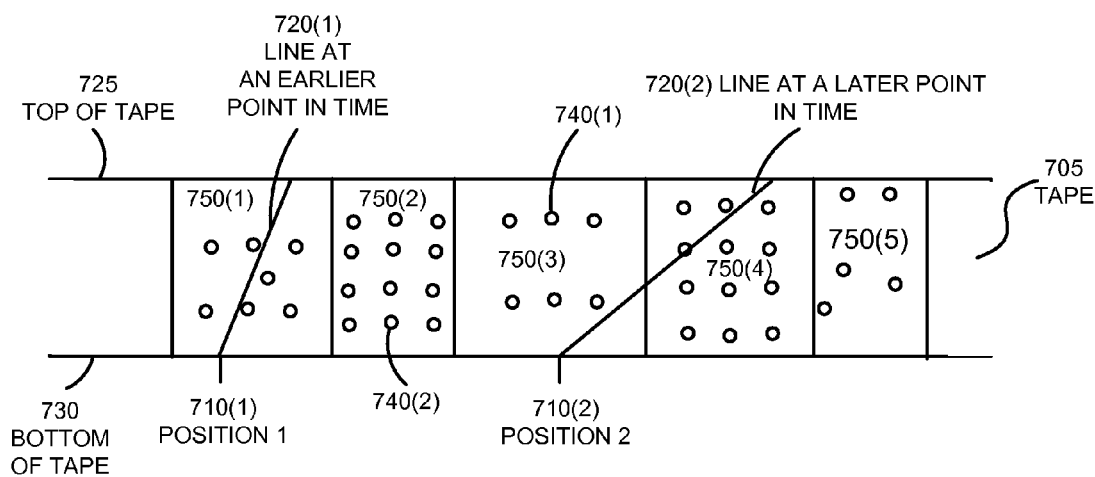
FIG. 7 is a drawing exemplifying the tape method of stream sending.

The tape method of sending streams is described, and one skilled in the art will recognize that there are many equivalent descriptions producing similar methods and variations on this description producing variants of the methods described here. FIG. 7 shows an example of the tape method corresponding to the encoded block structure shown in FIG. 5. In the tape method, the sending of a stream of data is indicated by representing the stream to be sent as a tape 705, where each position 710 along the X-axis of the tape corresponds to a different point in time in the encoded block structure, and where the height of the tape is always the same, e.g., nominally of height one, independent of the rate of the encoded source block at that point in time along the tape. The sending of the stream represented by a tape can be indicated by a moving line 720(1), 720(2) that goes from the top of the tape 725 to the bottom of the tape 730. In one representation, the movement of the line 720(1), 720(2) over time represents the sending order of the data from the encoded blocks of the stream. Each point within the tape 740(1), 740(2), . . . , represents a piece of stream data that is to be sent, for example each point may represent a packet of encoded symbols for an encoded block or each point may represent an individual encoded symbol for an encoded block. Points that fall within a region corresponding to an encoded block 750(1), 750(2), . . . , represent data that is associated with that encoded block.

The process of sending according to the tape method of sending streams is represented by sweeping the line 720(1), 720(2) across the tape over time as the stream is sent, and each time the line sweeps through a point the data of the stream corresponding to that point is sent. FIG. 7 shows the line at two different times in the sending process, where line 720(1) is its configuration at the first time and line 720(2) is its configuration at the second time. Thus, the sending process sends all the data associated with the points within the region bounded by 720(1), 720(2), 725 and 730 during the interval of time between the first time and the second time. The distribution of the points within each encoded block are preferably uniformly distributed within the tape area for that encoded block according to their weight, e.g., randomly distributed or pseudo-randomly distributed or distributed deterministically by a process that ensures the points are uniformly distributed according to the weight of each point, where the weight of a point is the amount of data represented by that point.

As described above, the line 720 is straight, but one skilled in the art will realize that there are many variations, e.g., the line may be curved or comprise a sequence of consecutive line segments, and the line may change its shape as it sweeps across during the sending process. There are other variations of the tape sending method as well, including representing the tape such that the tape is not of the same height, but instead its height varies according to the rate of the stream at that position 710 of the tape.

There are various methods for specifying the movement of the line across the tape during the sending process as described in more detail below.

Static Interleaving Methods

The tape method of sending streams can be used to achieve static interleaving of any depth for any type of content stream or encoded content stream, whether FEC coding is used or not, and whether or not a source block structure is used. For illustrative purposes, it is assumed that a source block structure has already been defined and that FEC coding is used.

One way of achieving static interleaving of a given amount using the tape method of sending streams is described by an example with reference to FIG. 7. In this example, each encoded block is interleaved by an amount of time D with other neighboring encoded blocks, i.e., the interleaving depth is D. In this example, when requesting a stream a receiver communicates a position X and a value for D. Then, the sending process at the sender is described by configuring the line 720 such that initially the line 720 intersects the bottom of the tape 730 at position X−D, initially the line 720 intersects the top of the tape 725 at position X, and then the sending process sweeps the line 720 forward in time at the same rate as the play-back rate of the stream, i.e., at time t after the start of the sending process the line 720 has swept across so that it intersect the bottom of the tape 730 at position X−D+t and the line 720 intersects the top of the tape 725 at position X+t.

In this description of the static interleaving method, if the method is being used to send a newly requested stream to a receiver, it is advantageous for X to be at a position in the stream where playback is to begin at the receiver, e.g., X is the position of a beginning of an encoded block or X is the position of a beginning of a GOP in a video stream and the beginning of an encoded block is aligned with the beginning of the GOP. Furthermore, in these cases, it is advantageous for the sender to not send any of the data before the position X along the tape to the receiver, because generally the receiver will only receive a portion of the encoded blocks and most likely not enough to fully decode the partially received encoded blocks.

Figure 8:
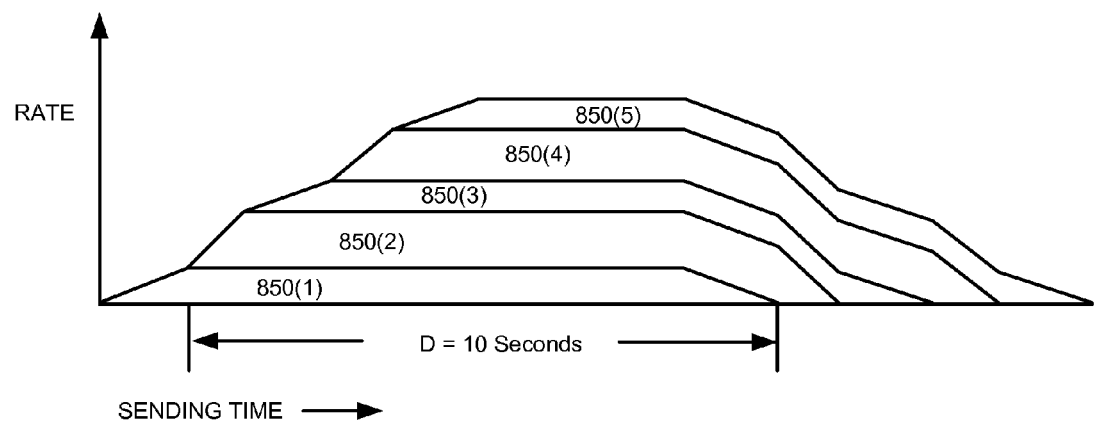
FIG. 8 is a drawing exemplifying a static interleaving according to the tape method of stream sending.

FIG. 8 is an illustrative drawing exemplifying the shape of the sent stream when a sender is using the static interleaving method just described. In this case, the static interleaving method is applied to the tape shown in FIG. 7, which corresponds to the encoded stream shown in FIG. 5. In this example, the receiver specifies the value of X as the position of the start of the first encoded block 750(1) in FIG. 7, and thus in this example there is no data to be sent that is along the tape before position X. In this example, the receiver also specifies a value for D, which could be a value such as 10 seconds. The resulting stream that is sent by the sender according to this process is as shown in FIG. 8, where the area of 850(1), 850(2), . . . , is the same as the area of 405(1) plus 510(1), 405(2) plus 510(2), . . . of FIG. 5, respectively. Note that the sending rate as shown in FIG. 8 is a smoothed version of the original content rate as shown in FIG. 5.

Figure 9:
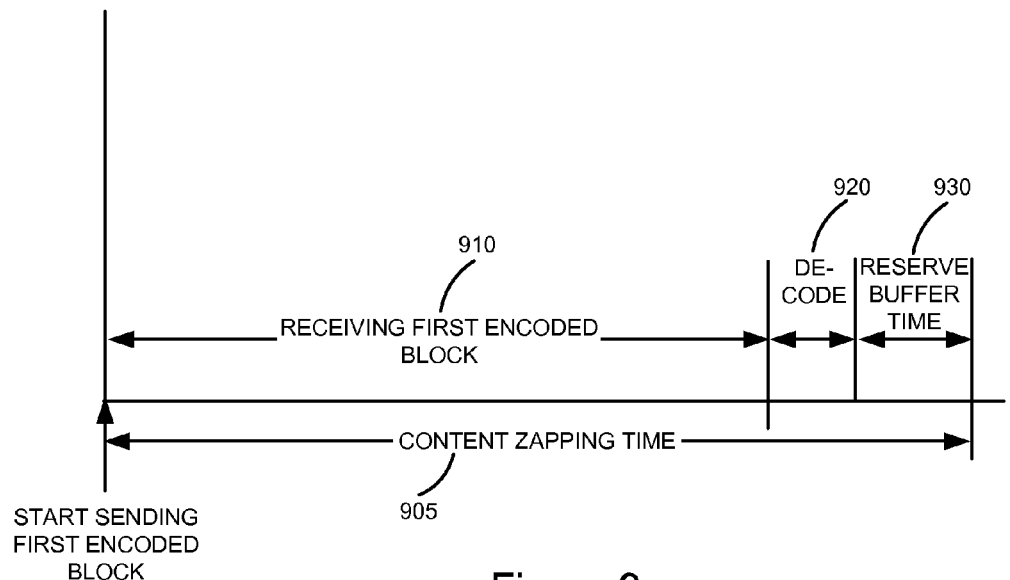
FIG. 9 is a drawing exemplifying a receiver and the content zapping time corresponding to a static interleaving sender method.

FIG. 9 is an illustrative drawing showing the content zapping time experienced by a receiver corresponding to a static interleaving method described above. Some of the components of the content zapping time 905 comprise the time 910 it would take for the receiver to receive enough of the first encoded block of the stream to decode the first source block, which is the sum of the source block duration and the interleaving depth D, the time it takes the receiver to decode first source block from the received parts of the first encoded block 920, and a reserve buffer time 930 reserved for expected network jitter delay, variations in source block durations, and decode times of source blocks from parts of received encoded blocks during the reception of the stream. Note that since the protection period, which in this case is the source block duration plus the interleaving depth D, can be much larger than source block duration, the content zapping time 905 can be much larger than a source block duration using this method as described.

Dynamic Interleaving Methods

The tape method of sending streams can be used to achieve dynamic interleaving at any pace of any interleaving depth for any type of content stream or encoded content stream, whether FEC coding is used or not, and whether or not a source block structure is used. For illustrative purposes, it is assumed that a source block structure has already been defined and that FEC coding is used.

One way of achieving dynamic interleaving starting at no interleaving and progressing up to a given interleaving depth using the tape method of sending streams is described by an example with reference to FIG. 7. In a typical use of this method, the first encoded block is sent with little interleaving and then gradually over time subsequent encoded blocks are smoothly interleaved more and more until an interleaving depth of D is achieved with other neighboring encoded blocks. However, other uses of this method are also disclosed below, and as one skilled in the art will recognize there are a variety of other variants as well. In this example way of expressing the parameters for the method, when requesting a stream a receiver communicates an initial upper position UI for the line 720, an initial lower position LI for the line 720, a final upper position UF for the line 720, a final lower position LF for the line 720, and a time value T. For simplicity, it is assumed hereafter that UF>=UI, LF>=LI, UF>=LF, UI>=LI, T>=0. Typically, it is preferable to have UF>=UI+T and LF>=LI+T to help ensure that data at the receiver is always available when needed. As explained in the examples below, these values for UF, UI, LF, LI, and T can allow a reserve buffer of content to be smoothly built up at the receiver as the interleaving is dynamically adjusted.

The sending method at the sender performs the tape method as follows using the parameters LI, UI, LF, UF and T. First, the line 720 of FIG. 7 is initially configured at send time t=0 such that initially the line 720 intersects the bottom of the tape 730 at position LI and initially the line 720 intersects the top of the tape 725 at position UI, then, during the sending time t=0 through t=T, the line 720 is swept across the tape so that at time t the line 720 intersects the bottom of the tape 730 at position t*(LF−LI)/T+LI and at time t the line 720 intersects the top of the tape 725 at position t*(UF−UI)/T+UI. Then, for all sending times t>T, the line 720 is swept across the tape so that at time t the line 720 intersects the bottom of the tape 730 at position t−T+LF and at time t the line 720 intersects the top of the tape 725 at position t−T+UF, i.e., for t>T the interleaving is static with an interleaving depth of D=UF−LF is used.

Dynamic Interleaving Methods for Newly Requested Streams

Figure 10:
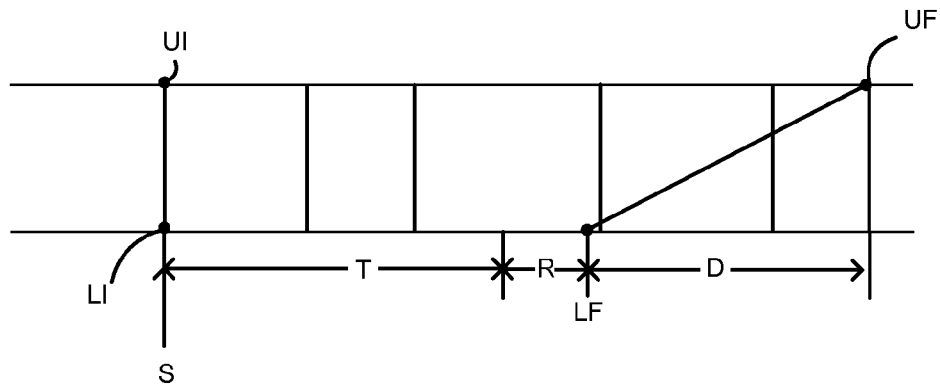
FIG. 10 is a drawing exemplifying a dynamic interleaving sender method when a new stream is sent to a receiver.

One example use of the dynamic interleaving method is to send a newly requested stream to a receiver. As an example, as shown in FIG. 10, the initial values can all be set to the same value I=UI=LI, i.e., initially there is no interleaving, and for the position S at which the receiver will start playing out the content stream satisfies S=I. This ensures that the receiver has been sent the entire tape of content from the position S and beyond. As shown in FIG. 10, preferably S=UI=LI where S is the position in the content stream where it can be played out, e.g., S is the start of an encoded block whose start is aligned with the start of a GOP. Furthermore, it is advantageous that T<=LF−S. This ensures that if the receiver is playing out the content at the content rate then the sending of the content is at a rate that is at least as fast as the playing out of the content at the receiver, and a reserve buffer time of R=LF−S−T seconds is smoothly built up and continues as the static interleaving is reached at sending time T from the beginning of sending to the receiver, where the reserve buffer can absorb network jitter, varying source block durations and decode times. The interleaving amount is smoothly built up from no interleaving to D=UF−LF seconds of interleaving.

As a particular example of the dynamic interleaving method, suppose that the receiver is accessing the content from the very beginning and that in steady state reaches a 5 second reserve buffer, and that an interleaving depth of 10 seconds is desired in steady state, and the rate of sending is to be approximately 10% more than the encoded stream rate during the period of time when the interleaving and the reserve buffer are being increased. Then, a possible setting for the parameters is: S=UI=LI is the desired start position, T=100 seconds, LF=S+T+5 seconds, and UF=LF+10 seconds. Thus, if the content stream rate were 1 Mbps for this example and a 10% protection amount were used then the encoded stream rate would be 1.1 Mbps. Then, for the first 100 seconds of sending using the dynamic interleaving method using the parameter settings just discussed, the sending rate would be approximately 1.21 Mbps, since 100+(5+15)/2=110 seconds of the stream is sent within the first 100 seconds. After 100 seconds of sending the reserve buffer would be 5 seconds and the interleaving depth would be 10, and then the sending rate thereafter would be 1.1 Mbps. For the few seconds just before the 100 seconds of streaming have occurred, the sending rate will smoothly transition from the 1.21 Mbps rate to the 1.1 Mbps rate. Note also that at the beginning the sending rate follows the encoded stream rate, and smoothly as the interleaving depth and reserve buffer increase the sending rate smoothes out and more and more closely matches the average encoded stream rate.

Figure 11:
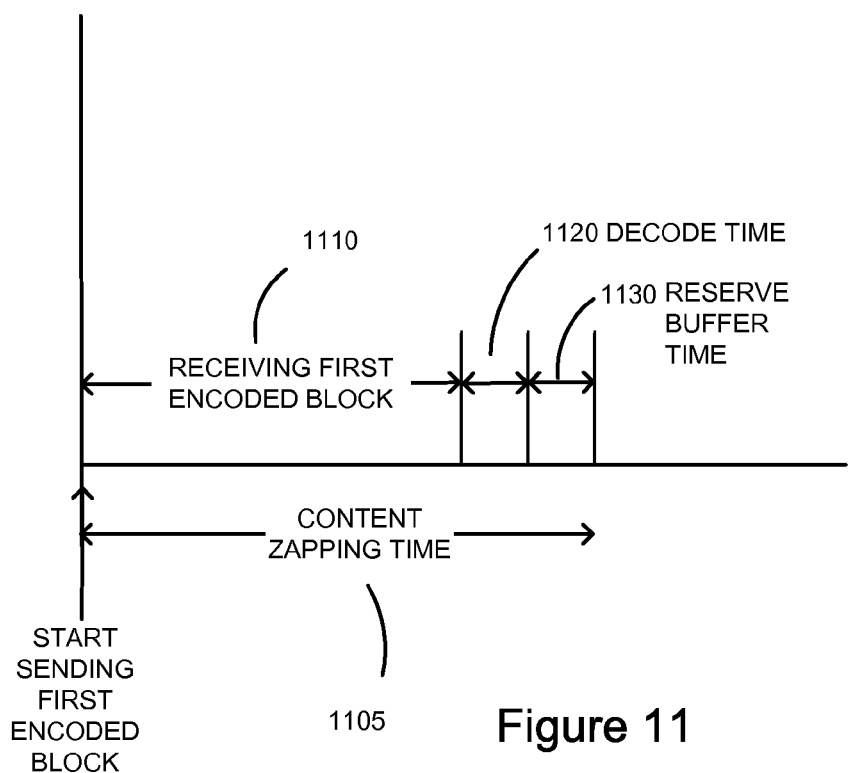
FIG. 11 is a drawing exemplifying the content zapping time and long-term protection period experienced by a receiver for a dynamic interleaving sender method.

The content zapping time experienced by a receiver corresponding to a dynamic interleaving method described above is described with reference to FIG. 11. Some of the components of the content zapping time 1105 comprise the time 1110 it would take for the receiver to receive enough of the first encoded block of the stream to decode the first source block, the time it takes the receiver to decode first source block from the received parts of the first encoded block 1120, and an initial reserve buffer time 1130 reserved for expected network jitter delay, source block duration variations, and decode times of source blocks from parts of received encoded blocks during the reception of the stream.

Because the reserve buffer is building up over time when using dynamic interleaving, the initial reserve buffer time 1130 can be much shorter when using dynamic interleaving than is the case when the reserve buffer size is fixed for the entire duration of the stream sending. For example, using the basic stream sender, the reserve buffer size might be set to two seconds to buffer against long-term network jitter of up to two seconds, whereas with the dynamic interleaved sending method the initial reserve buffer time 1130 can be set to something much shorter, e.g., 200 milliseconds, because there is likely to be little network jitter during the first few seconds of the stream sending and by then the reserve buffer has built up substantially.

Because the protection period for each source block gradually builds up when using dynamic interleaving, the initial source block duration can be much shorter when using dynamic interleaving than when the protection period is the source block duration for the entire duration of the stream sending. For example, using the basic stream sender, the source block duration might be set to five seconds and the protection amount might be set to 20% to protect against short burst packet losses of 500 milliseconds, whereas with the dynamic interleaved sending method the source block duration can be set to something much shorter, e.g., 500 milliseconds, and the protection amount can be set much smaller, e.g., 5%, to provide the same level of protection against such bursts, because it is unlikely that such a burst occurs during the first few seconds of sending the stream and by then the protection period has built up substantially to for example the original source block duration plus 10 seconds of interleaving depth to protect against such bursts.

Thus, overall, using the dynamic interleaving method, the content zapping time can be short, e.g., a content zapping time under 1 second versus several seconds using the basic stream sending method in the same network conditions, and yet the dynamic interleaving methods can provide superior long-term protection against network jitter and bursty packet loss.

There are many variations on how the parameters can be specified. For example, one could instead specify an initial starting position on the tape, an initial amount of interleaving, a final amount of interleaving, and a time period over which to smoothly transition from the initial interleaving to the final interleaving. Alternatively, instead of specifying a time period over which to smoothly transition from the initial to the final interleaving, one could specify a rate relative to the content streaming rate at which to do the transition. As another example of a variation, additional parameters could be known to the sender or specified by a receiver, e.g., the receiver could explicitly signal a start position S at which the receiver will start playing out the content from.

There are many variations of the dynamic interleaving methods as one skilled in the art will recognize. For example, the sender may decide to filter out and not send some of the encoded data from some or all the encoded blocks to individual receivers, for example because those receivers are not experiencing much loss. As another variation, the source block structure could be predetermined, but as the sending process is operating the FEC encoding is operating to produce the encoded blocks for individual receivers, or occasionally generating a large supply of repair symbols for some encoded blocks as receivers are encountered that need larger protection amounts than previous receivers.

As another variation that is often preferable, the receiver can control the setting of the initial parameters for the dynamic interleaving methods, and the server or set of servers can determine the final target parameters for the dynamic interleaving methods. For example, the receiver may specify that a content stream is to be started with an interleaving depth of 2 seconds and a reserve buffer of 1 second, and the server may then determine that it will send in such a way that an interleaving depth of 20 seconds with a reserve buffer of 10 seconds is achieved in the first 2 minutes of sending. One advantage to having the server or servers dictate the final parameters for dynamic interleaving methods is that it is much easier to support live streaming, where portions of the content stream beyond the current time are not available, and thus the server can guide the dynamic interleaving parameters to a final setting that works under the given constraints. As another example of an advantage of having the servers dictate the final parameters is that the server can in some cases adjust the parameters for multiple clients being served the same content stream from essentially the same position within the stream in such a way that ultimately many of the receivers are guided towards the same final parameters, which leads to server efficiencies in sending packets to these receivers since at the same point in time the same packet is to be sent from the content stream to all of these receivers.

Dynamic Interleaving Methods for Content Segment Transitions

One example use of the dynamic interleaving method is when a receiver transitions from one content segment to a next content segment within a list of content segments, for example when transition from a segment of an episode of a show, to an ad, and then back to a next segment of the show, where all transitions occur without any receiver interaction. The different content segments may be sent by different senders, e.g., the segments of a show episode might be sent to the receiver by a content server whereas the intervening ads might be sent to the receiver by ad servers.

A first example is when a receiver has been watching a first content segment that is being sent by a first sender using the dynamic interleaving methods described above, and the first sender has been sending for long enough that the full interleaving depth D and reserve buffer time R have been built up. Then, a smooth transition to a second content segment can be achieved as follows using the dynamic interleaving method:

1. At D+R seconds before the end of the sending of the first content segment, the sending rate for the first segment will linearly decrease from the encoded stream rate to zero over a period of D seconds, and at that point the first sender will stop sending for the first segment.

2. At D+R seconds before the first content segment ends playing out, the receiver requests the second content segment from the second server with parameters UI=0, LI=−D, UF=0, LF=−D, T=0. Assuming no network latency, the second server will start sending the stream for the second content segment, increasing the rate linearly over the first D seconds of the sending, and thereafter sending is at the encoded stream rate.

3. When the first content segment finishes playing out, the reserve buffer for the second content has built up to R seconds, and the interleave depth has built up to D seconds. At this point in time the play-out of the second content can be started.

Figure 12:
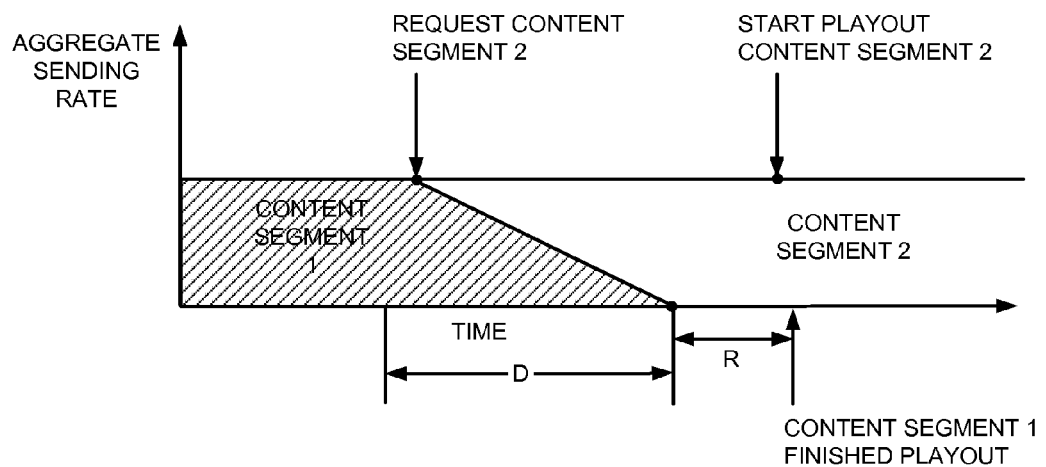
FIG. 12 is a drawing exemplifying a content transition between two consecutive content segments for a dynamic interleaving sender method.

Thus, the transition from the first content segment to the second content segment keeps the reception rate at the receiver at the encoded stream rate, i.e., while the sending rate for the first content segment is linearly ramping down the sending rate for the second content segment is linearly ramping up in such a way that the combined rate across the transition is the same as if though there were one content segment continuously being sent. Furthermore, the reserve buffer protection and the interleave protection for the second stream are the same as for the first stream in the steady state. FIG. 12 is an illustration of this.

Even if the timing is off a bit on the starting of the sending of the stream for the second content segment compared to ending of the sending of the first content segment, since the ramp down rates and the ramp up rates are smoothly linear, the net error in streaming rate is minor. For example, if there is a 500 milliseconds error in the timing of the transition between the two streams, and the interleaving depth is 10 seconds, then the error in streaming rate is at most 5%. This also means that the parameters for the second content segment can be set a bit more conservatively than described above, i.e., in such a way that they try to build up a bit more reserve buffer and interleave time instead of just trying to keep these values the same as for the first stream, and the consequent increase in combined streaming rate during the content segment transition will be minor.

A second example of a content segment transition is when a receiver has been watching a first content segment that is being sent by a first sender using the dynamic interleaving methods described above, but the first sender has not been sending for long enough that the full interleaving depth D and reserve buffer time R have been built up. Then, a smooth transition to a second content segment can be achieved as follows using the dynamic interleaving method, where in this case what the receiver does is set the parameters and request the second stream in such a way that the transition from the first stream to the second stream is as if though the two content segments were concatenated together and were being sent by one server. One skilled in the art can work out the details of how to achieve this type of transition using the dynamic interleaving methods.

Figure 13:
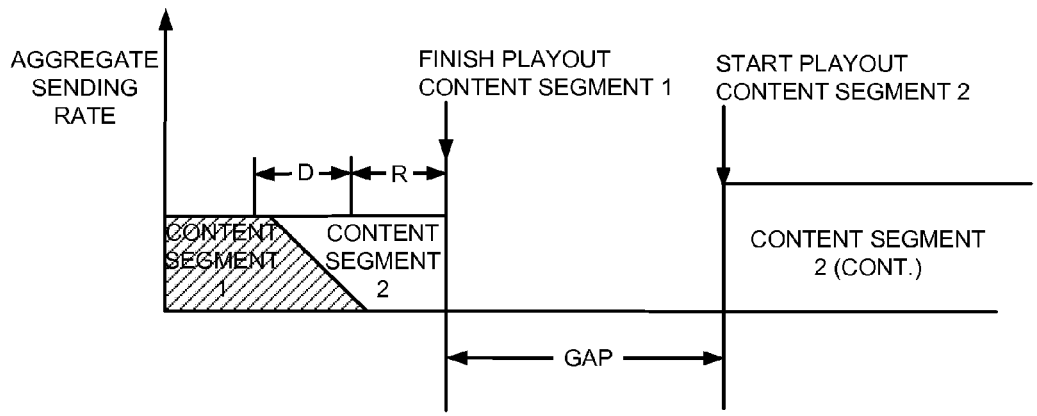
FIG. 13 is a drawing exemplifying a content transition between two non-consecutive content segments for a dynamic interleaving sender method.

A third example of a content segment transition is when a receiver has been watching a first content segment that is being sent by a first sender using the dynamic interleaving methods described above, and then there is a gap between the period of time between when the first content segment play-out ends at the receiver and a second content segment play-out is to begin. For example this might be the desired behavior when there is first segment of an episode of a show that ends play-out, followed by a non-streaming ad for example of duration 30 seconds, followed by the immediate play-out of a second content segment of the episode of a show. In this case, the dynamic interleaving methods can be used as follows, for simplicity assuming that the first content segment has been sent to the receiver for long enough that the full interleaving depth D and reserve buffer time R have been built up. In this case, as was the case for the first example above, the receiver sends a request for the second content segment D+R seconds before the end of the play-out of the first content segment, with parameters UI=0, LI=−D, UF=0, LF=−D, T=0. This causes the second server to start sending the second content segment at a rate that when combined with the rate of the first content segment being sent from the first server the overall rate is the rate of a single sending stream. Then, just at the time when the first content segment finishes playing out at the receiver, the receiver signals the second server to stop sending the stream for the second content segment and the sending rate to the receiver immediately drops to zero. Then, the gap occurs, say for 30 seconds. At the end of the gap, the receiver immediately starts playing out the second content segment and at the same time sends a start sending request to the second server for the second content with parameters UI=D+R, LI=R, UF=D+R, LF=R, T=0. This causes the second server to continue sending the second content from where it left off just before the gap. The overall effect is immediately playing out of the second content at the scheduled time, while at the same time the combined sending rate to the receiver at all points during the transition is the same as one encoded stream rate during the play-out of the two content segments, and the sending rate is zero when neither of the two content segments is being played out. FIG. 13 is an illustration of this.

There are many other uses and variations of the dynamic interleaving methods describe above, as one skilled in the art will recognize.

Sub-Stream Based Delivery Methods

Sub-stream based delivery are methods for taking an FEC encoded stream and partitioning it into sub-streams, such that for example an approximately equal amount of each encoded block is included in each sub-stream. For example, an encoded stream may be partitioned into 40 sub-streams, each sub-stream consisting of approximately 5% of each source block, and thus in this example the amount of repair data generated for each source block using FEC encoding is approximately equal to the size of the source block. More generally, when FEC encoding is applied to each source block and then sub-stream based-delivery is applied, then the total encoded data for each source block is partitioned into sub-streams such that an approximately equal amount of the encoding of each source block is included in each sub-stream, where the encoded data of each source block comprises the original data of each source block plus the generated repair data if the FEC coding is systematic and where the encoded data of each source block may comprise repair data if the FEC coding is not systematic.

Figure 14:
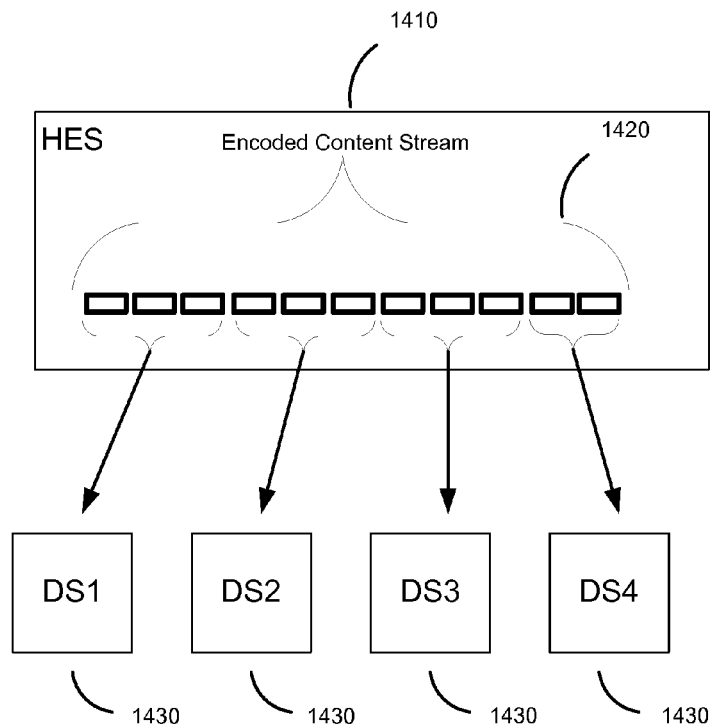
FIG. 14 is a drawing exemplifying an encoded content stream being distributed from a head-end server to various distributed servers to be used in a sub-stream based delivery method.

One of the main ideas of sub-stream based delivery is to send sub-streams for a stream along potentially different paths and through potentially different servers, in order to achieve a number of desirable goals. As an example, there may be a server, hereafter called a Head-End Server (HES) that ingests a content stream into a sub-stream based delivery system, where some of the processes that a HES performs is to create a source block structure for a content stream, FEC encode the stream, partition the encoded stream into sub-streams, and then to send the sub-streams to other servers, hereafter called Distributed Servers (DSs) that may be distributed within different data centers or within disparate network locations. An example of this can be seen in FIG. 14. In FIG. 14, each of the DSs 1430 receive a different segment of the encoded content stream 1420 from the HES 1410. Some of the processes that a DS performs include caching sub-streams of content streams as they pass through on their way to receivers, to accept request for sub-streams from particular content streams from receivers, and to send sub-streams to receivers, for example based on receiver requests for particular sub-streams or based on receiver subscriptions. A special case of sub-streaming comprises the original encoded stream that is not further partitioned.

Figure 15:
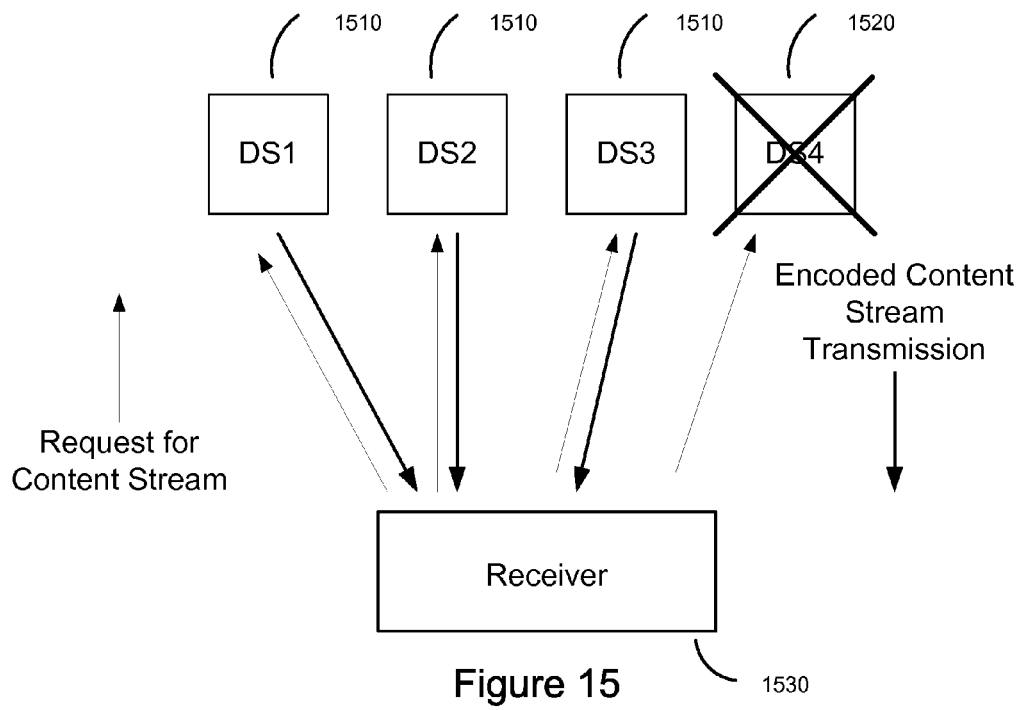
FIG. 15 is a drawing exemplifying a receiver requesting a content stream from various distributed servers and receiving encoded content streams from some of those servers in a sub-stream based delivery method.

Receivers in a sub-stream based delivery system may request and receive sub-streams for the same content segment starting at the same starting position, where the requests may be sent to different DSs for the different sub-streams, and in this case several different sub-streams for the same encoded stream with the same start position may be sent from different DSs to the same receiver. An example of this can be seen in FIG. 15. In FIG. 15, a receiver 1530 requests a content stream from various DSs 1510, 1520. In this instance, one of the DSs 1520 is not responsive to the request from the receiver while the other DSs 1510 do send sub-streams to the receiver. It may be possible for the receiver to completely recover the content stream using FEC encoding if the responsive DSs transmit enough data to the receiver to accomplish this.

As an example, an original 1 Mbps content stream may be ingested at the HES, the HES forms the source block structure as the content stream passes through and adds as much repair data as there is source data in the original stream (100% repair), partitions the encoded stream of 2 Mbps into sub-streams of 100 Kbps and send the resulting 20 sub-streams to 20 different DSs. A receiver that wants to play out the content stream starting from a particular position within the stream may send a request to 12 of the 20 DSs requesting the sub-stream that the DS has for the content starting at the specified starting position. In response, all 12 of the DSs concurrently send the sub-stream they have for the encoded stream to the receiver starting from the specified starting point, and thus each of the 12 DSs sends at a rate of 100 Kbps to the receiver, so that the total rate is 1.2 Mbps.

There are several advantages to a sub-stream based delivery system as just described, some or all of which might be found in embodiments of the present invention, including 1) natural load balancing of content, mixing popular with not as popular, with natural load balancing benefits for serving bandwidth capacity and storage capacity on servers, 2) path failure resilience, i.e., one path goes down and there is still enough data that the receiver is receiving from other paths so that the content stream can be still completely recovered using FEC decoding, 3) robustness against DS crashes, DS disk failures, etc., 4) the sending of the data from multiple DSs versus a single server provides a greater chance that the aggregate sending rate will be maintained to the receiver and there will be no buffer starvation at the receiver. This is especially the case if TCP or HTTP is used to send the sub-streams to the receiver from the DSs, but this is even true if UDP is used to send the sub-stream to the receiver from the DSs, and 5) single failure points in the overall system are at the ingress point at the HES and at the receiver and need not be elsewhere.

Combining Dynamic Interleaving Methods and Sub-Stream Based Delivery Methods

The dynamic interleaving methods and the sub-stream based delivery methods described herein can be combined to great advantage, i.e., all the advantages of both methods are found in a combined solution. For example, using the dynamic interleaving methods, the source block structure and FEC encoding for a content stream can be performed by a HES as the content stream is ingested into the system. The sub-stream methods can be used to generate the sub-streams of the FEC encoded stream at the HES and these sub-streams can then be sent to different DSs for storage. When a receiver wants to receive the content stream from a particular position within the stream, the receiver can send the appropriate dynamic interleaving parameters to all DSs sending a sub-stream to the receiver, and the DSs will send the sub-streams according to these parameters to the receiver. The receiver can put together the packets from the sub-streams for source blocks to recreate the original content stream for play-back. The dynamic interleaving methods allow the reserve buffer and the interleaving depth to grow during the streaming, providing superior protection to bursty packet loss and network jitter, while at the same time providing the receiver with quick channel zapping times. The DSs in this example solution do not need to perform FEC coding, and yet they can deliver the content stream to the receiver over distributed paths from different parts of the network, thus increasing the server diversity and path diversity of the delivery, thereby increasing reliability and robustness to server and network failures.

Furthermore, the protection amount for each source block might be substantially higher between the HES and the DSs in this example than between the DSs and the receiver. For example, 20 sub-streams might be generated and sent from the HES to 20 DSs, whereas only 10 sub-streams may be needed to recover the original content stream (a protection amount of 100%), whereas a receiver may only request for example 12 sub-streams from 12 of the 20 DSs, i.e., a 20% protection amount that allows the receiver to still be able to recover the original content stream even if one of the DSs fails and there is up to 10% packet loss in aggregate across all the paths from the remaining 11 DSs that the receiver will receive sub-streams from.

The example solution outlined above has the additional property that, with the proper logic incorporated into a receiver that has a list of more than 12 of the 20 DSs, when one of the 12 DSs that the receiver is receiving a sub-stream from fails the receiver can automatically detect this and request another sub-stream from one of the other DSs that the receiver is not currently receiving a sub-stream from, thereby increasing the reliability of the stream from receiving 11 sub-streams back up to receiving 12 sub-streams from 12 different DSs.

The changes in the methods needed to combine dynamic interleaving methods and sub-stream methods are relatively minor. For example, the methods for spreading out the data points within an encoded block for determining the sending time for the dynamic interleaving methods needs to be enhanced so that each DS can make decisions on how to spread out the data it has for each sub-stream within an encoded block uniformly over the encoded block area within the encoded stream tape (see FIG. 7). The decisions made by the DSs to uniformly spread out the data can be done in a way independently of the decisions made by other DSs so that the aggregate spreading of the data from all the sub-streams within an encoded block from all the DSs sending to a receiver is quite uniform over the encoded block area within the encoded stream tape (see FIG. 7).

As another example of changes in the methods needed to combine them, it is advantageous to augment the information sent with each packet so that when a receiver specifies a particular position within a stream to the DSs that will send it sub-streams, the DSs can all interpret the particular position for the sub-stream they will send to the receiver in a manner consistent with the interpretation of all other DSs sending a sub-stream for the same content to the receiver. As one skilled in the art will recognize, these and potentially a few other minor changes allow one to combine the interleaved streaming methods and the sub-stream based delivery methods to great advantage.

While the invention has been described with respect to exemplar embodiments, one skilled in the art will recognize that numerous modifications are possible and such recognition of one skilled in the art could come from a reading of this disclosure. For example, the processes described herein may be implemented using hardware components, software components, and/or any combination thereof. Thus, although the invention has been described with respect to exemplar embodiments, it will be appreciated that the invention is intended to cover all modifications and equivalents within the scope of the following claims.

What is claimed is:

1. In a communication system, a method of transmitting content streams comprising:
    forming a connection between a receiver and a first sender;
    forming a connection between the receiver and a second sender;
    receiving at the receiver a first content stream transmitted from the first sender, wherein the first content stream contains a first initial amount of interleaving;
    receiving at the receiver a second content stream transmitted from the second sender, wherein the second content stream contains a second initial amount of interleaving;
    adjusting the amount of interleaving contained in the first content stream during the transmission of the first content stream independently of the source block structure of the first content stream, increasing the amount of interleaving from the first initial amount of interleaving, based on a current transmit position within the first content stream; and
    adjusting the amount of interleaving contained in the second content stream during the transmission of the second content stream independently of the source block structure of the second content stream, increasing the amount of interleaving from the second initial amount of interleaving, based on a current transmit position within the second content stream,
    wherein the amount of interleaving contained in each of the first and second content streams is independent of the amount of interleaving contained in the other of the first and second content streams.

2. The method of claim 1 wherein the first initial amount of interleaving in the first content stream is configured so that there is no initial interleaving in the first content stream.

3. The method of claim 1 wherein the amount of interleaving in the first content stream is adjusted from the first initial amount to a steady state amount.

4. The method of claim 3 wherein the interleaving in the first content stream linearly transitions between the first initial amount and the steady state amount.

5. The method of claim 1 wherein the amount of interleaving contained in the first content stream is adjusted as a function of time.

6. The method of claim 1 wherein the amount of interleaving contained in the first content stream is adjusted as a function of the difference between the playback rate of the first content stream and the transmission rate of the first content stream.

7. The method of claim 1 wherein the amount of interleaving contained in the first content stream is adjusted as a function of the amount of data loss experienced at the receiver.

8. The method of claim 1 wherein the source block structure of the first content stream does not change during the transmission of the first content stream.

9. The method of claim 1 further comprising:
    building a reserve buffer of content from the first content stream.

10. The method of claim 9 wherein the reserve buffer is built concurrently with any adjustments made to the amount of interleaving in the first content stream.

11. The method of claim 1 further comprising
    transitioning between the first content stream and the second content stream in a manner that keeps the aggregate transmission rate of the first and second content streams approximately level.

12. The method of claim 11 wherein the transition between the first content stream and the second content stream is carried out over time as a function of the amount of interleaving contained in the first and second content streams.

13. In a receiver that receives data over a channel, a method of receiving content streams comprising:
    forming a connection between a receiver and a first sender;
    forming a connection between the receiver and a second sender;
    receiving a first content stream transmitted from the first sender, wherein the first content stream contains a first initial amount of interleaving that can be adjusted during the transmission of the first content stream independently of the source block structure of the first content stream, the amount of interleaving increasing from the first initial amount of interleaving, based on a current transmit position within the first content stream; and receiving a second content stream transmitted from the second sender, wherein the second content stream contains a second initial amount of interleaving that can be adjusted during the transmission of the second content stream independently of the source block structure of the second content stream, the amount of interleaving increasing from the second initial amount of interleaving, based on a current transmit position within the second content stream, wherein the amount of interleaving contained in each of the first and second content streams is independent of the amount of interleaving contained in the other of the first and second content streams.

14. In a communication system, a method of transmitting a content stream comprising:

forming a connection between a receiver and a plurality of senders;

receiving at the receiver a content stream transmitted from the plurality of senders, wherein each sender transmits a different content sub-stream of the content stream to the receiver and each content sub-stream contains an initial amount of interleaving; and adjusting the amount of interleaving contained in each content sub-stream during the transmission of the content sub-streams independently of the source block structure of the content sub-streams, increasing the amount of interleaving in each content sub-stream from the initial amount of interleaving, based on a current transmit position within each content sub-stream, wherein the amount of interleaving contained in each content sub-stream is independent of the amount of interleaving contained in the other content sub-streams.

15. The method of claim 14 wherein the source block structure of the content sub-streams does not change during the transmission of the content sub-streams.

16. An apparatus for receiving a content stream transmitted from a plurality of senders, the apparatus comprising:

a receive module configured to receive the content stream transmitted from the plurality of senders, wherein each sender transmits a different content sub-stream of the content stream to the receiver and each content sub-stream contains an initial amount of interleaving that can be adjusted during the transmission of the content sub-stream independently of the source block structure of the content sub-stream, the amount of interleaving of each content sub-stream increasing from the initial amount of interleaving, based on a current transmit position within the content sub-stream stream, wherein the amount of interleaving contained in each content sub-stream is independent of the amount of interleaving contained in the other content sub-streams.

17. A communication system for transmitting a content stream, the system comprising:

a plurality of senders, each sender configured to transmit a different content sub-stream of the content stream to a receiver, wherein each content sub-stream contains an initial amount of interleaving; and the receiver configured to receive the content stream transmitted from the plurality of senders, wherein the amount of interleaving contained in each content sub-stream is adjusted during the transmission of the content sub-streams independently of the source block structure of the content sub-streams, the amount of interleaving in each content sub-stream increasing from the initial amount of interleaving, based on a current transmit position within each content sub-stream, wherein the amount of interleaving contained in each content sub-stream is independent of the amount of interleaving contained in the other content sub-streams.

* * * * *